United States Patent
Adams et al.

(12)

(10) Patent No.: US 11,385,277 B2
(45) Date of Patent: Jul. 12, 2022

(54) MODULAR ELECTRONIC TESTING SYSTEM WITH FLEXIBLE TEST PCB FORMAT

(71) Applicant: Modus Test, LLC, Richardson, TX (US)

(72) Inventors: Lynwood Adams, Richardson, TX (US); Jack Lewis, Richardson, TX (US); Njteh Keleshian, Plano, TX (US)

(73) Assignee: MODUS TEST, LLC, Richardson, TX (US)

( * ) Notice: Subject to any disclaimer, the term of this patent is extended or adjusted under 35 U.S.C. 154(b) by 66 days.

(21) Appl. No.: 16/983,309

(22) Filed: Aug. 3, 2020

(65) Prior Publication Data
US 2021/0041494 A1    Feb. 11, 2021

Related U.S. Application Data

(60) Provisional application No. 62/882,891, filed on Aug. 5, 2019.

(51) Int. Cl.
| | |
|---|---|
| *G01R 31/00* | (2006.01) |
| *G01R 31/26* | (2020.01) |
| *G01R 31/28* | (2006.01) |
| *G01R 1/04* | (2006.01) |
| *G01R 1/067* | (2006.01) |
| *G01R 1/073* | (2006.01) |

(52) U.S. Cl.
CPC ............................... *G01R 31/2808* (2013.01)

(58) Field of Classification Search
CPC ........ G01R 31/00; G01R 31/02; G01R 31/26; G01R 31/28; G01R 31/2808; G01R 31/2889; G01R 1/02; G01R 1/04; G01R 1/067; G01R 1/073
See application file for complete search history.

(56) References Cited

U.S. PATENT DOCUMENTS

| | | |
|---|---|---|
| 2005/0026491 A1 | 2/2005 | Gattuso |
| 2005/0099763 A1 | 5/2005 | Rathburn |
| 2005/0218429 A1 | 10/2005 | Mazza |
| 2007/0229102 A1 | 10/2007 | Eldridge |
| 2008/0305670 A1 | 12/2008 | Gattuso |
| 2009/0102457 A1 | 4/2009 | Vayner |
| 2010/0134134 A1 | 6/2010 | Grover |
| 2012/0092034 A1 | 4/2012 | Erdman |

(Continued)

*Primary Examiner* — Neel D Shah
(74) *Attorney, Agent, or Firm* — Christopher A. Proskey; BrownWinick Law Firm

(57) ABSTRACT

A testing system for test sockets is presented having a removable device under test printed circuit board (DUT PCB) that electrically connects with the electrical testing components of the system. A top stiffener is attached to the lower surface of the DUT PCB and is locked in place by engagement members of a locking mechanism, that is operated by an actuating mechanism, that includes a rack and pinion arrangement that converts rotational movement of the pinions to lateral movement of the racks thereby locking the stiffener connected to the DUT PCB to the socket plate so as to facilitate testing. The upper surface of the DUT PCB has an infinite top plane that is uninterrupted and can be of any size and shape. The system is also modular and can be formed of any number of modules depending on the pin count density required.

36 Claims, 36 Drawing Sheets

(56) References Cited

U.S. PATENT DOCUMENTS

| | | |
|---|---|---|
| 2012/0199985 A1 | 8/2012 | Rathburn |
| 2013/0135002 A1 | 5/2013 | Grover |
| 2014/0103949 A1 | 4/2014 | Erdman |
| 2016/0209443 A1* | 7/2016 | Adams ............... G01R 31/2879 |

* cited by examiner

MODULAR ELECTRONIC TESTING SYSTEM WITH FLEXIBLE TEST PCB FORMAT

CROSS REFERENCE TO RELATED APPLICATIONS

This application claims priority to U.S. Provisional Patent Application No. 62/882,891 filed Aug. 5, 2019, which is hereby fully incorporated by reference herein in its entirety.

FIELD OF THE DISCLOSURE

This disclosure relates to a testing system. More specifically and without limitation, this disclosure relates to a testing system for testing electrical interconnects, also known as test sockets, as well as testing boards, and related methods of use.

BACKGROUND OF THE DISCLOSURE

Semiconductor chips have been developed for a wide variety of purposes. Along with the development of these semiconductor chips, a need developed to test these semiconductor chips to ensure that they are manufactured within specified tolerances and function properly. Many manufacturers of semiconductor chips such as Intel®, AMD®, Xilinx®, Texas Instruments®, NVIDIA®, Qualcomm®, among countless others, manufacture semiconductor chips which are then tested by a chip testing system having a device under test printed circuit board (DUT PCB) with an electrical interconnect, also known as a test socket, that is attached thereto. The DUT PCB and electrical interconnects are generally custom made to fit each specific semiconductor chip, making them quite expensive.

Manufacturers tend to simultaneously manufacture a variety of semiconductor chips within their facilities to maximize their overhead and equipment utilization rates. Due to these multiple product lines, manufacturers have a need to test a variety of semiconductor chips at the same time, each type of chip requiring a special electrical interconnect and DUT PCB. Since cleanroom space is extremely limited it is undesirable to have a dedicated testing machine for each type of electrical interconnects and DUT PCB. Conventional testing systems are not capable of testing a plurality of electrical interconnects, nor are conventional testing systems easily converted between configurations for testing different electrical interconnects.

Therefore, manufacturers of semiconductor chips have a need for a system for testing electrical interconnects, and DUT PCBs, that is capable of testing a variety of electrical interconnects and DUT PCBs. Manufacturers of semiconductor chips also have a need for a system for testing electrical interconnects, and DUT PCBs, that quickly and easily converts between testing various electrical interconnects, which are problems not solved by the prior art. Manufacturers of semiconductor chips further have a need for this testing system to be as small as possible to maximize valuable cleanroom space.

Thus, it is a primary object of the disclosure to provide an electronic testing system and method of use that improves upon the state of the art.

Another object of the disclosure is to provide an electronic testing system and method of use that quickly converts between configurations for testing different electrical interconnects.

Yet another object of the disclosure is to provide an electronic testing system and method of use that easily converts between configurations for testing different electrical interconnects.

Another object of the disclosure is to provide an electronic testing system and method of use that is easy to use.

Yet another object of the disclosure is to provide an electronic testing system and method of use that provides accurate testing for electrical interconnects.

Another object of the disclosure is to provide an electronic testing system and method of use that can be used with a wide variety of electrical interconnects.

Yet another object of the disclosure is to provide an electronic testing system and method of use that is relatively inexpensive.

Another object of the disclosure is to provide an electronic testing system and method of use that has a long useful life.

Yet another object of the disclosure is to provide an electronic testing system and method of use that has a small footprint.

Another object of the disclosure is to provide an electronic testing system and method of use that minimizes the amount of space required to test a variety of electrical interconnects.

Yet another object of the disclosure is to provide an electronic testing system and method of use that minimizes the capital cost for testing equipment for testing a variety of electrical interconnects.

Another object of the disclosure is to provide an electronic testing system and method of use that provides for quick removal of and replacement of DUT PCBs having electrical interconnects thereon.

Yet another object of the disclosure is to provide an electronic testing system and method of use that is high quality.

Another object of the disclosure is to provide an electronic testing system and method of use that is durable.

Yet another object of the disclosure is to provide an electronic testing system and method of use that can be used with a wide variety of other testing equipment.

Another object of the disclosure is to provide an electronic testing system and method of use that is modular in nature.

Yet another object of the disclosure is to provide an electronic testing system and method of use that can be used with any size of DUT PCB.

Another object of the disclosure is to provide an electronic testing system and method of use that can be used with any test socket.

Yet another object of the disclosure is to provide an electronic testing system and method of use that provides a high density of pins.

Another object of the disclosure is to provide an electronic testing system and method of use that can be formed out of a plurality of testing modules.

Yet another object of the disclosure is to provide an electronic testing system and method of use that has a flat upper surface so as to not interfere with other equipment.

These and other objects, features, or advantages of the present disclosure will become apparent from the specification and claims.

SUMMARY OF THE DISCLOSURE

A testing system for test sockets is presented having a removable device under test printed circuit board (DUT PCB) that electrically connects with the electrical testing components of the system. A top stiffener is attached to the lower surface of the DUT PCB and is locked in place by engagement members of a locking mechanism that are operated by an actuating mechanism that includes a rack and pinion arrangement that converts rotational movement of the pinions to lateral movement of the racks thereby locking the stiffener connected to the DUT PCB to the socket plate so as to facilitate testing. The upper surface of the DUT PCB has an infinite top plane that is uninterrupted and can be of any size and shape. The system is also modular and can be formed of any number of modules depending on the pin count density required.

DETAILED DESCRIPTION OF THE DISCLOSURE

Figure 1:
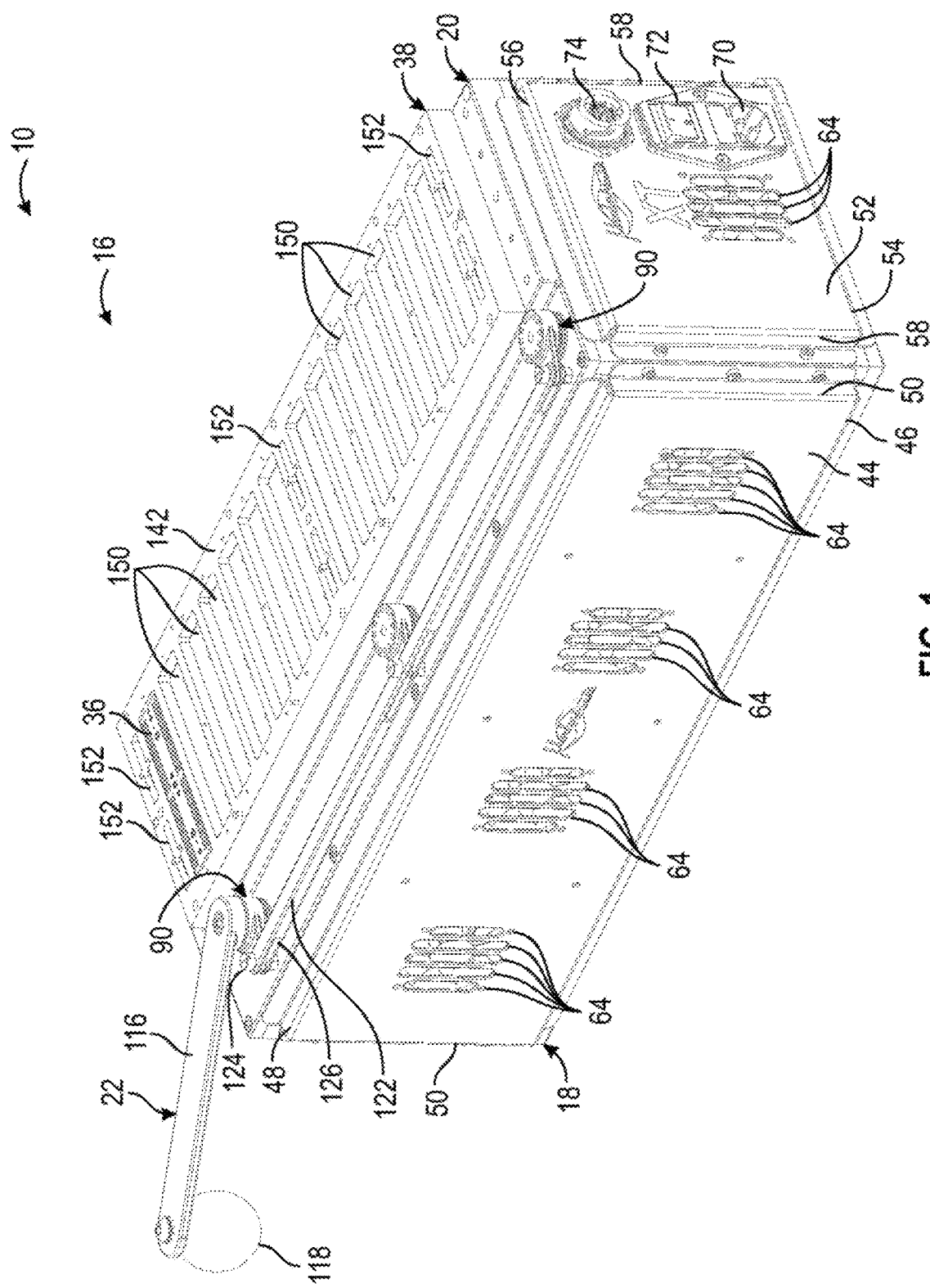
FIG. 1 is a perspective view of a module of a Modular Electronic Testing System with Flexible Test PCB Format, the view showing the module consisting of a housing, with a socket plate, actuating mechanism, locking mechanism, top stiffener, and a single capsule assembled onto the housing.
Figure 2:
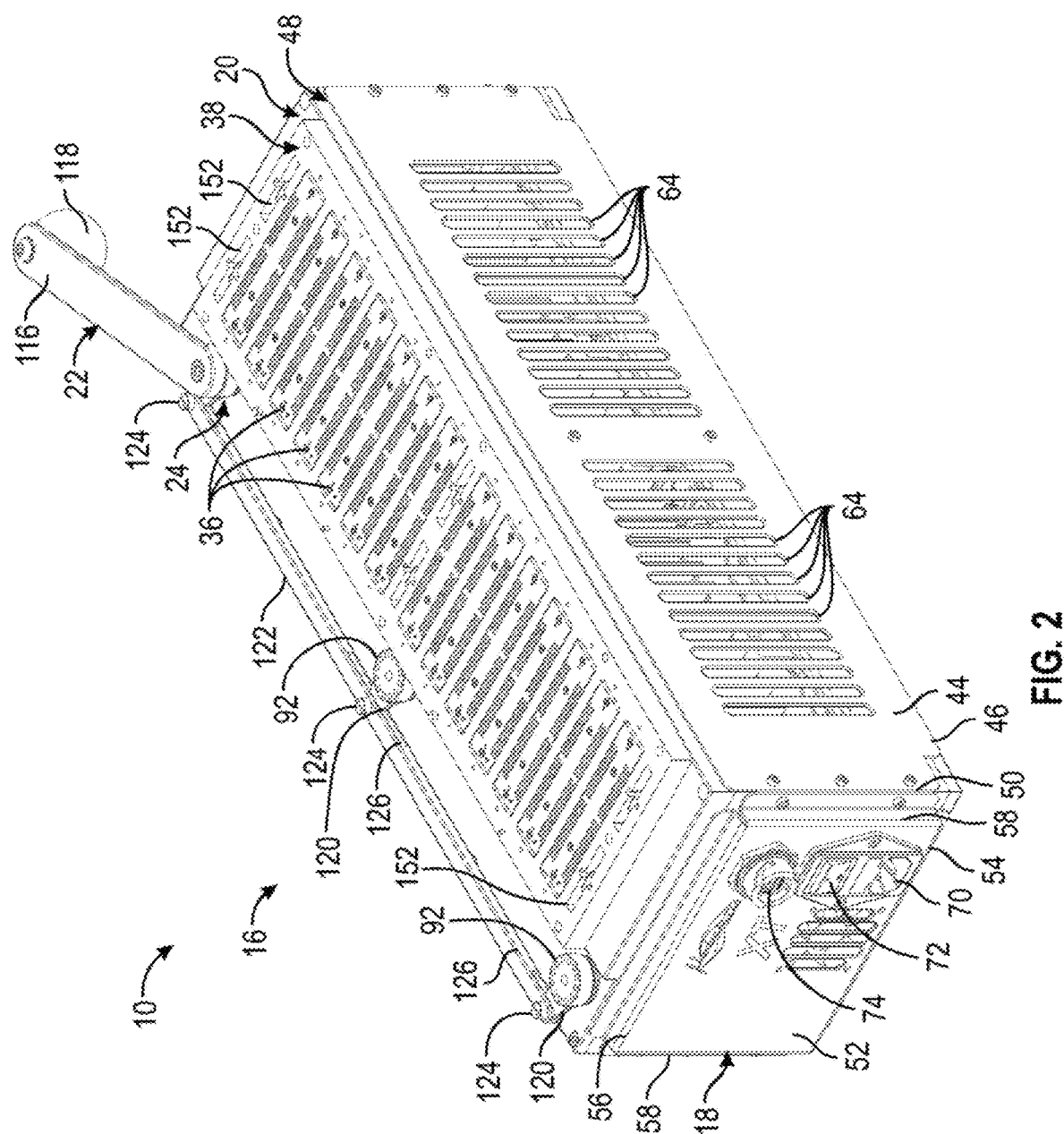
FIG. 2 is another perspective view of a module of the testing system, the view showing the module consisting of a housing, with a socket plate, actuating mechanism, locking mechanism, top stiffener, and a multitude of capsules assembled onto the housing.
Figure 3:
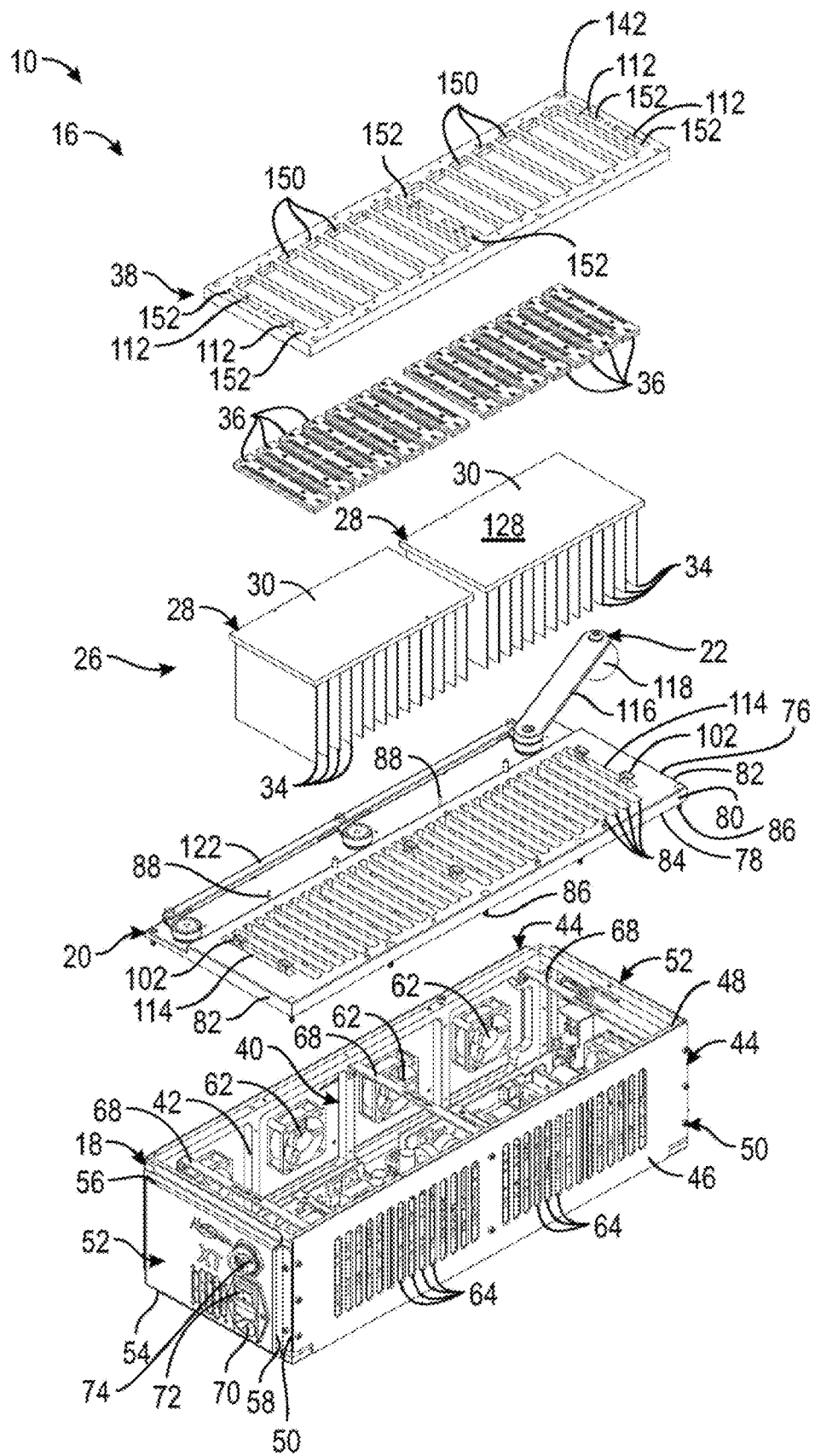
FIG. 3 is an exploded perspective view of a module of the testing system, the view showing the housing, the socket place with the locking mechanism and actuating mechanism assembled to the socket plate, the electrical testing components consisting of a motherboard and card assemblies operatively connected to the motherboard, the capsules, and the top stiffener all separated from one another.
Figure 4:
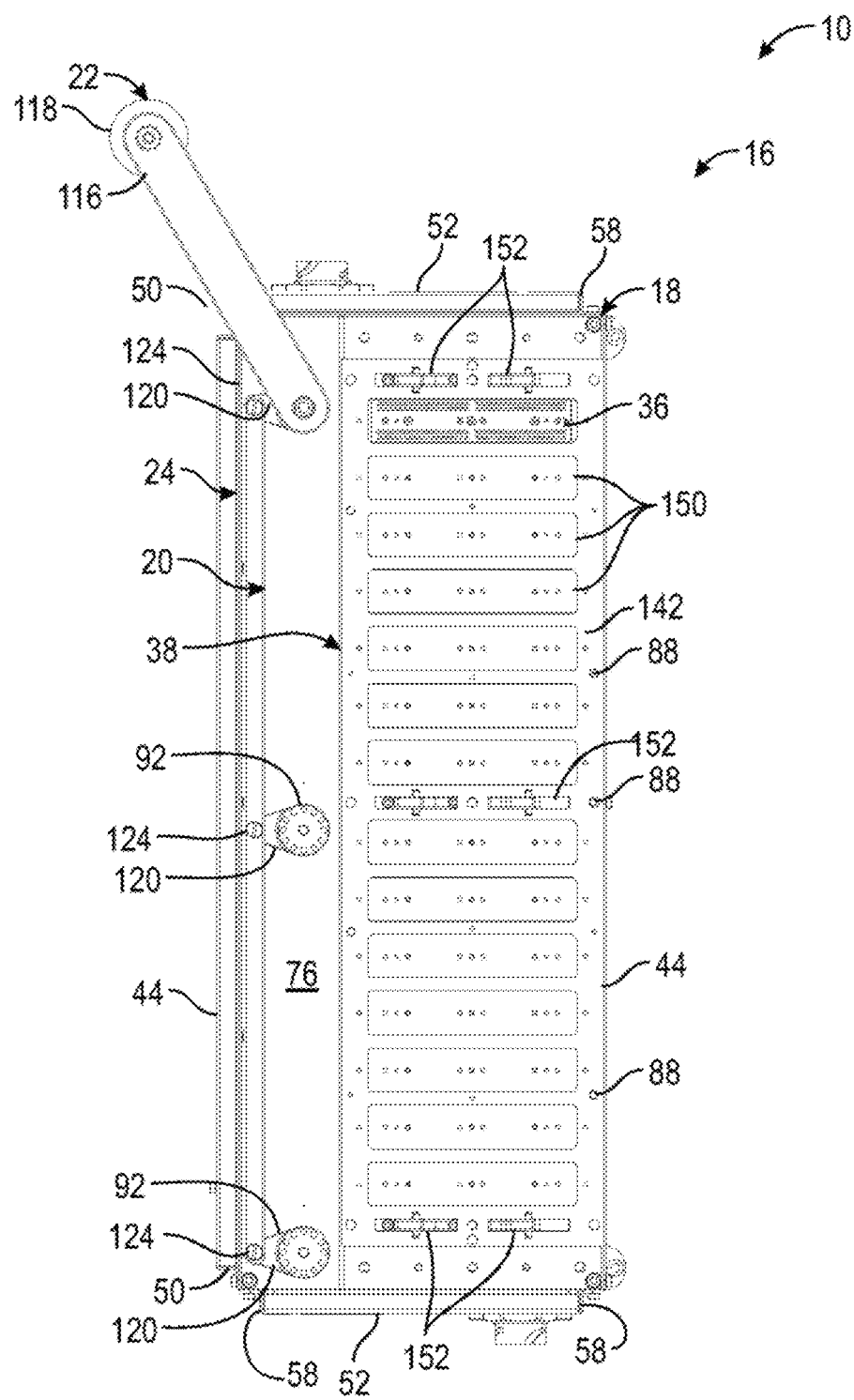
FIG. 4 is a top elevation view of the module described in FIG. 1.
Figure 5:
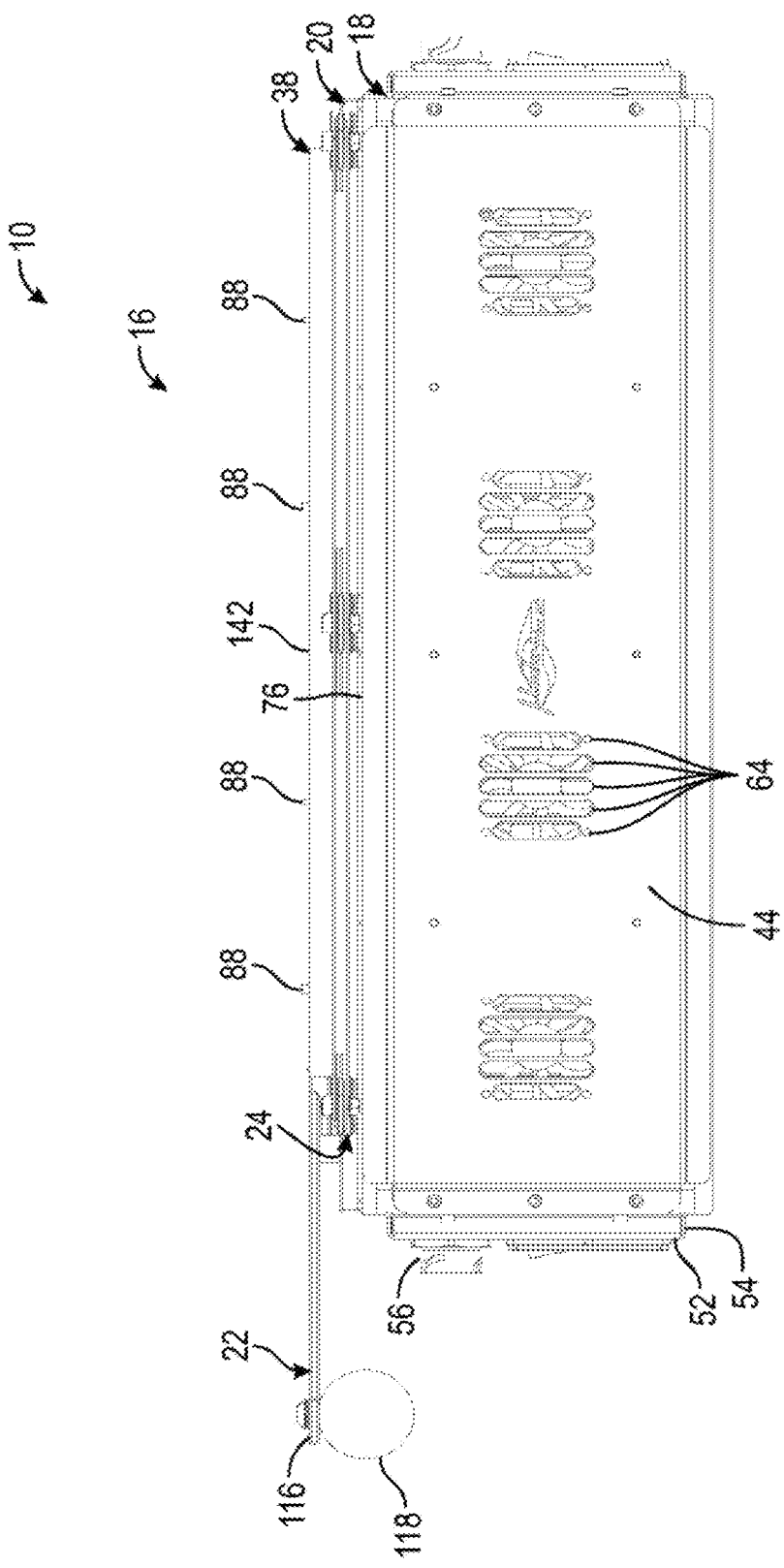
FIG. 5 is a side elevation view of the module described in FIG. 1.
Figure 6:
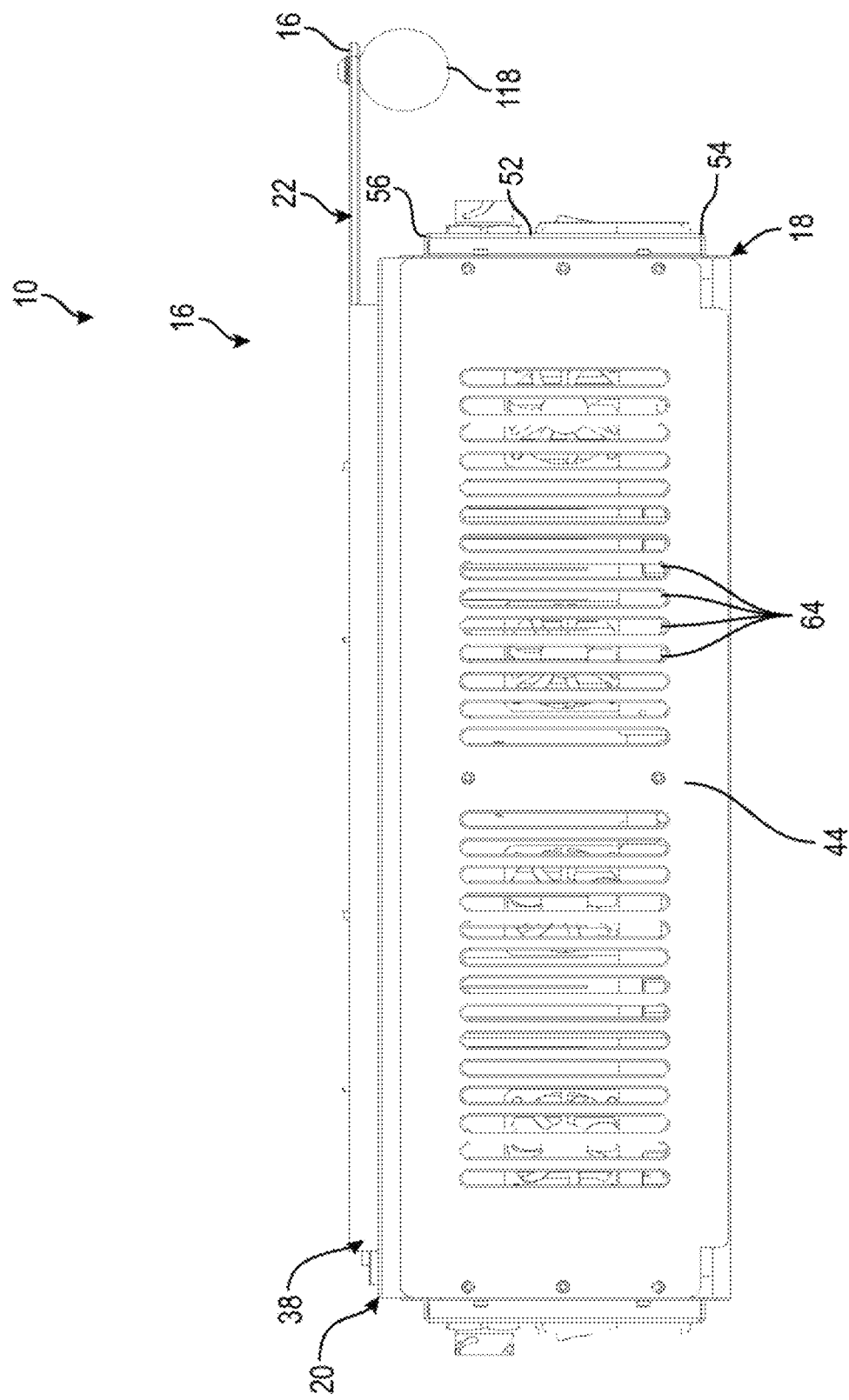
FIG. 6 is another side elevation view of the module described in FIG. 1.
Figure 7:
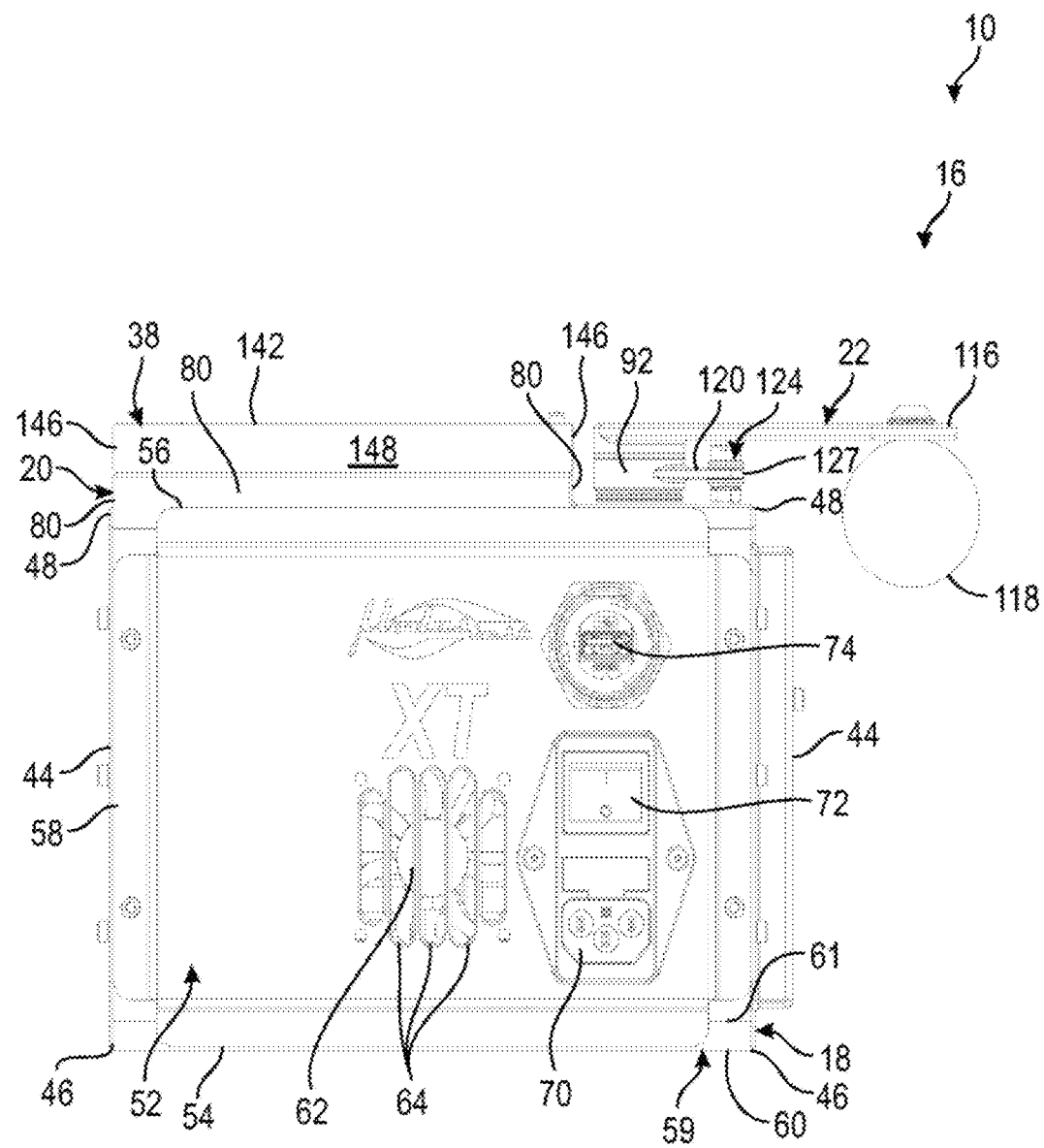
FIG. 7 is an end elevation view of the module described in FIG. 1.
Figure 8:
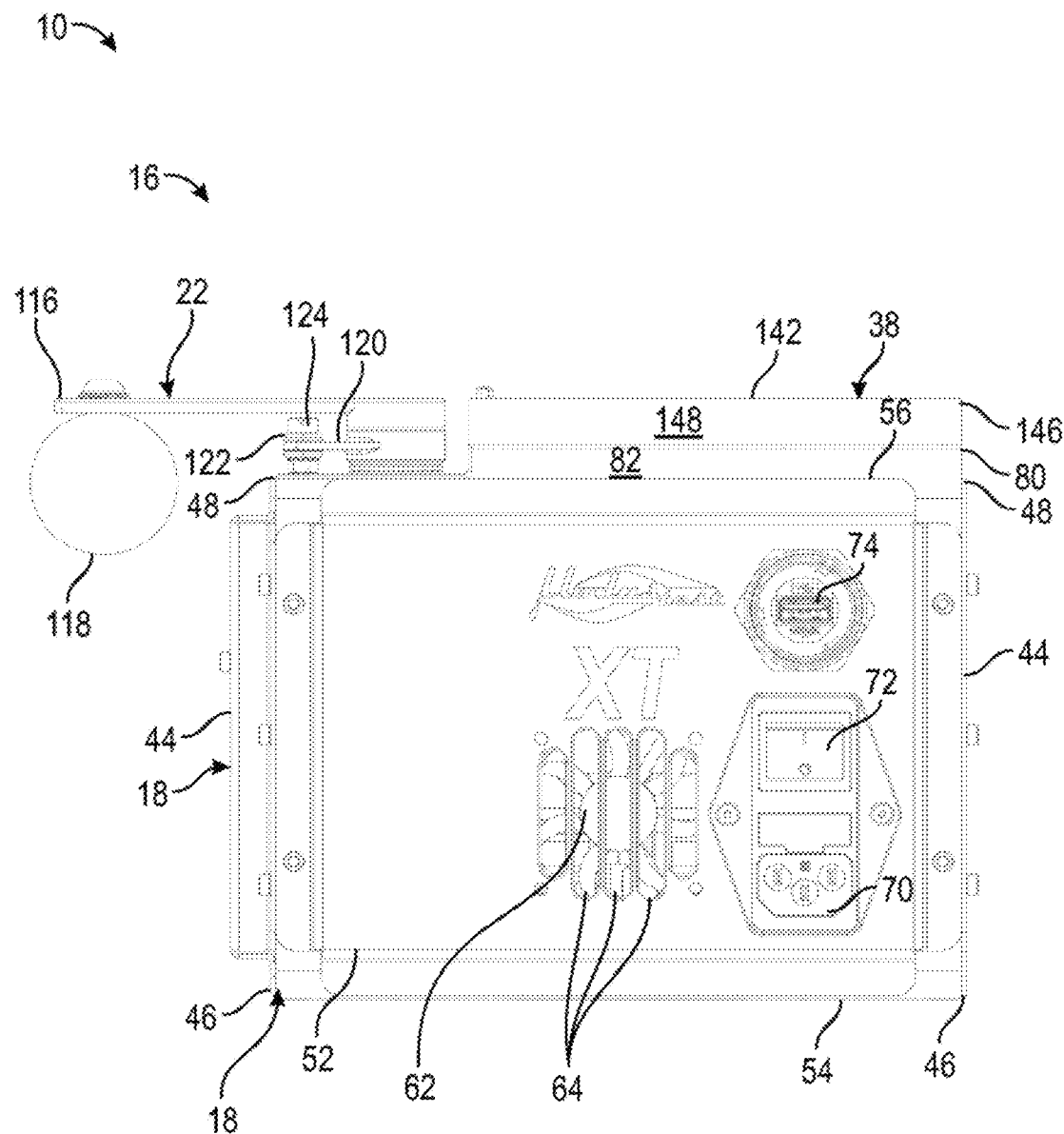
FIG. 8 is another end elevation view of the module described in FIG. 1.
Figure 9:
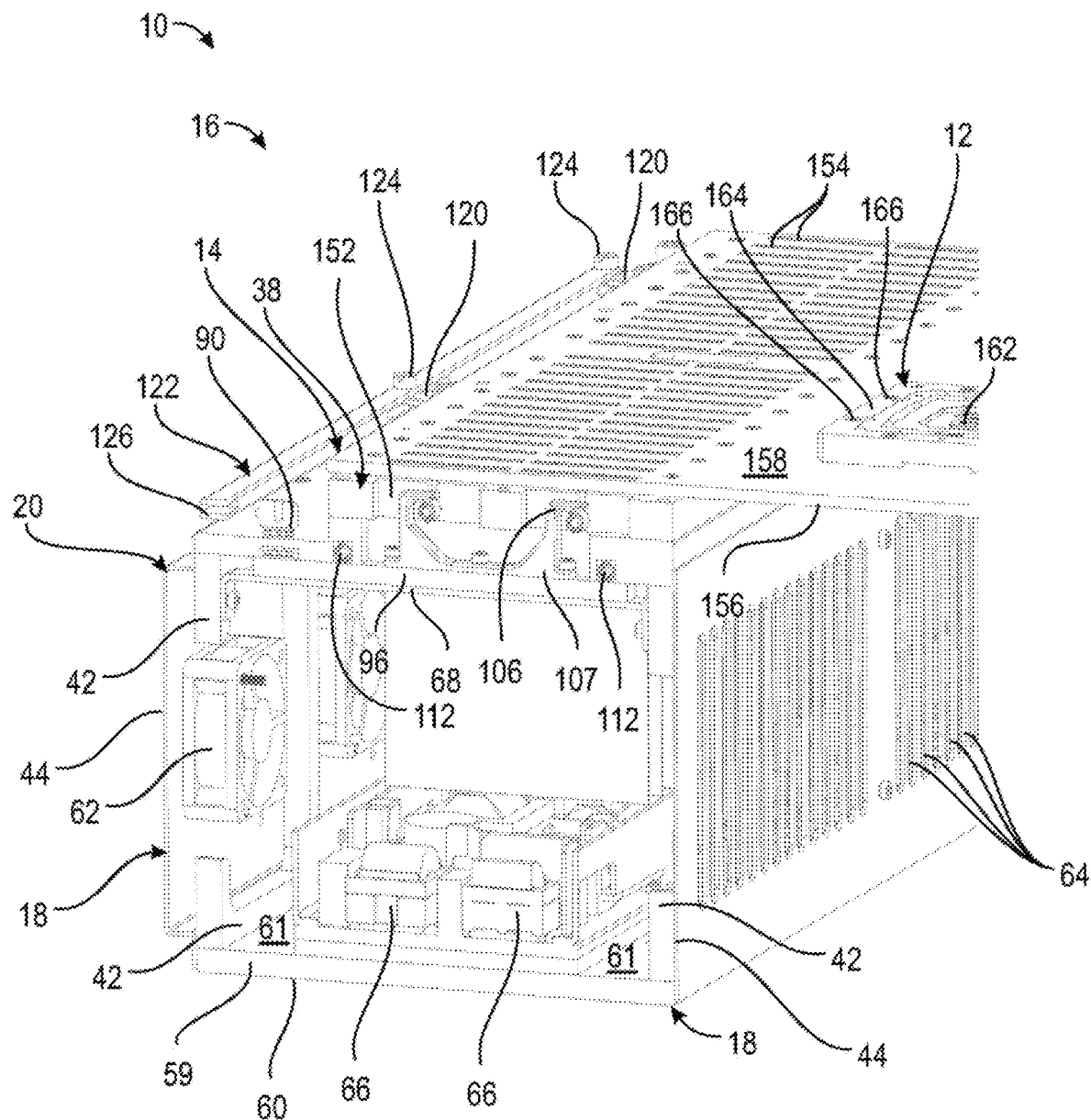
FIG. 9 is a cut-away perspective view through an end of the testing system, with a module as well as a device under test printed circuit board (DUT PCB) with a test socket and device under test (DUT) connected to the DUT PCB, the view cut through the axis of rotation of a post of the locking mechanism, the view showing the DUT PCB operatively connected to the top stiffener and arms of the locking mechanism engaging bearings within slots of the top stiffener in order to bring DUT PCB into electrical connection with the electrical testing components of the testing system, the view also showing an electrical testing board which is one of many that are electrically connected to the DUT PCB in order to test the DUT connected to the test socket, the view showing fans and vents which are configured to cool the electrical testing components of the testing system, the view also showing power supplies of the module.
Figure 10:
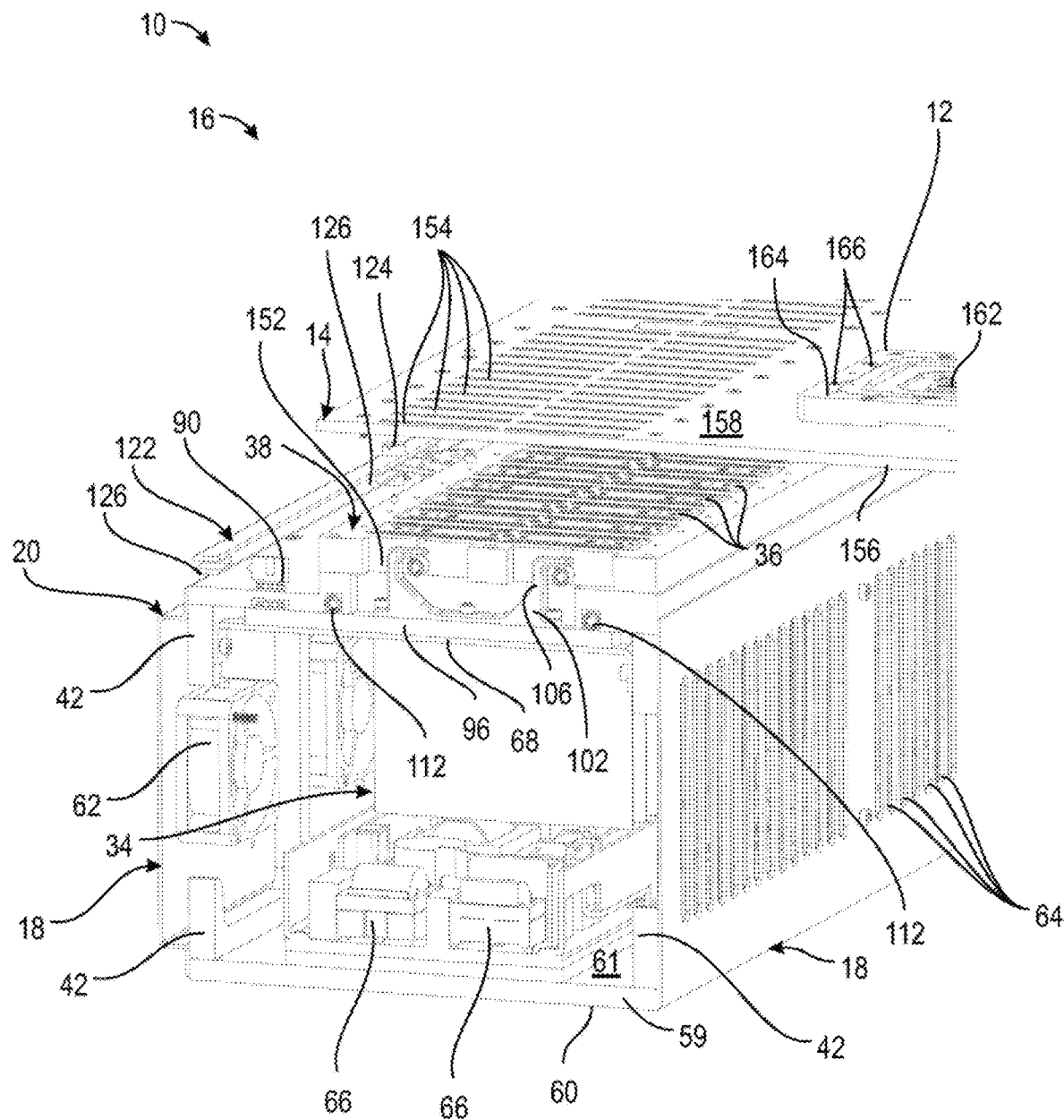
FIG. 10 is a perspective view of the cut-away view of FIG. 9, the view showing the DUT PCB disconnected and exploded away from the top stiffener, the view also showing capsules within sockets of the top stiffener which facilitate connection of DUT PCB to the electrical testing components of the system through compressible electrical contacts.
Figure 11:
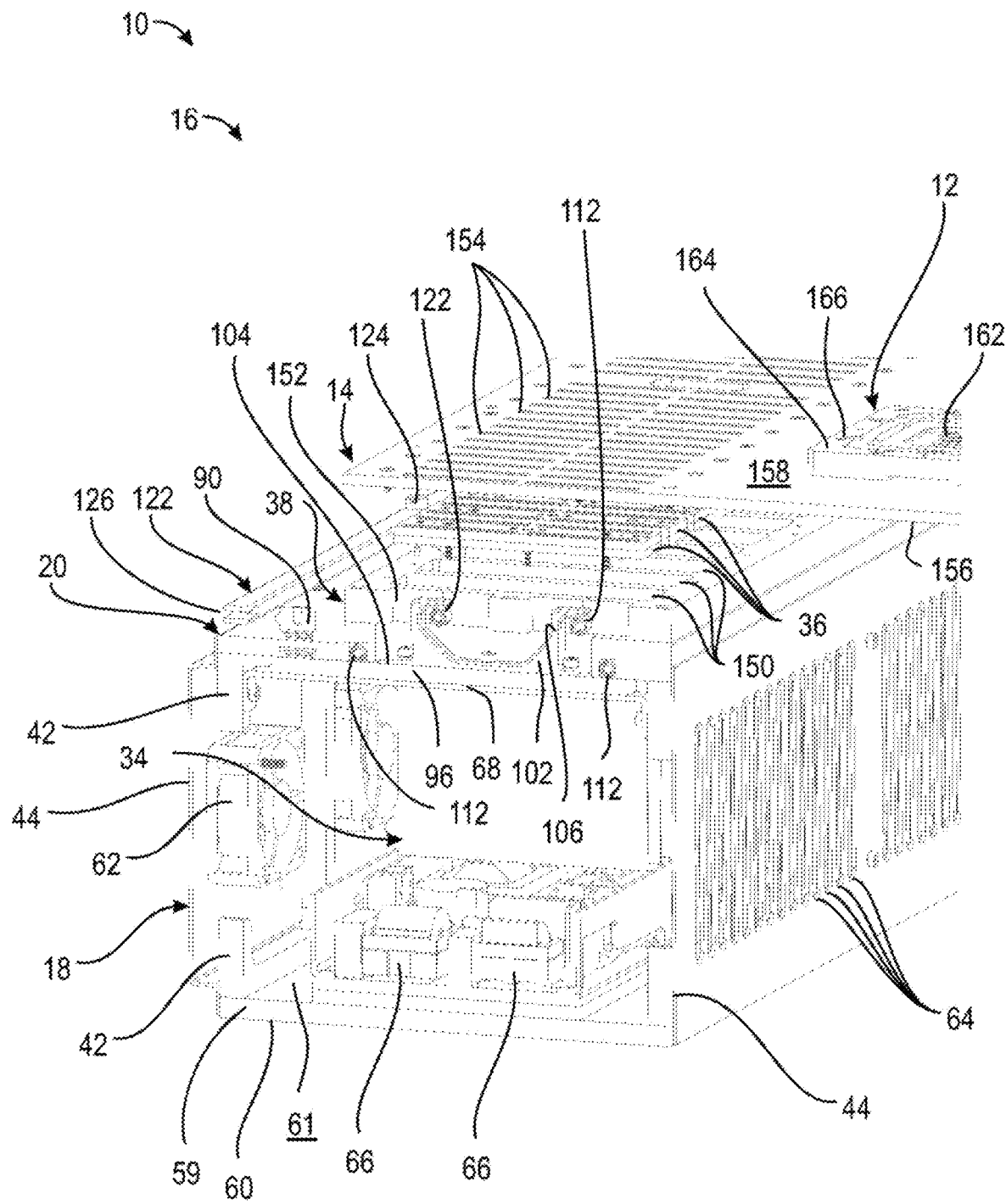
FIG. 11 is a perspective view of the cut-away view of FIG. 10, the view showing the capsules removed from the sockets and exploded away from the top stiffener.
Figure 12:
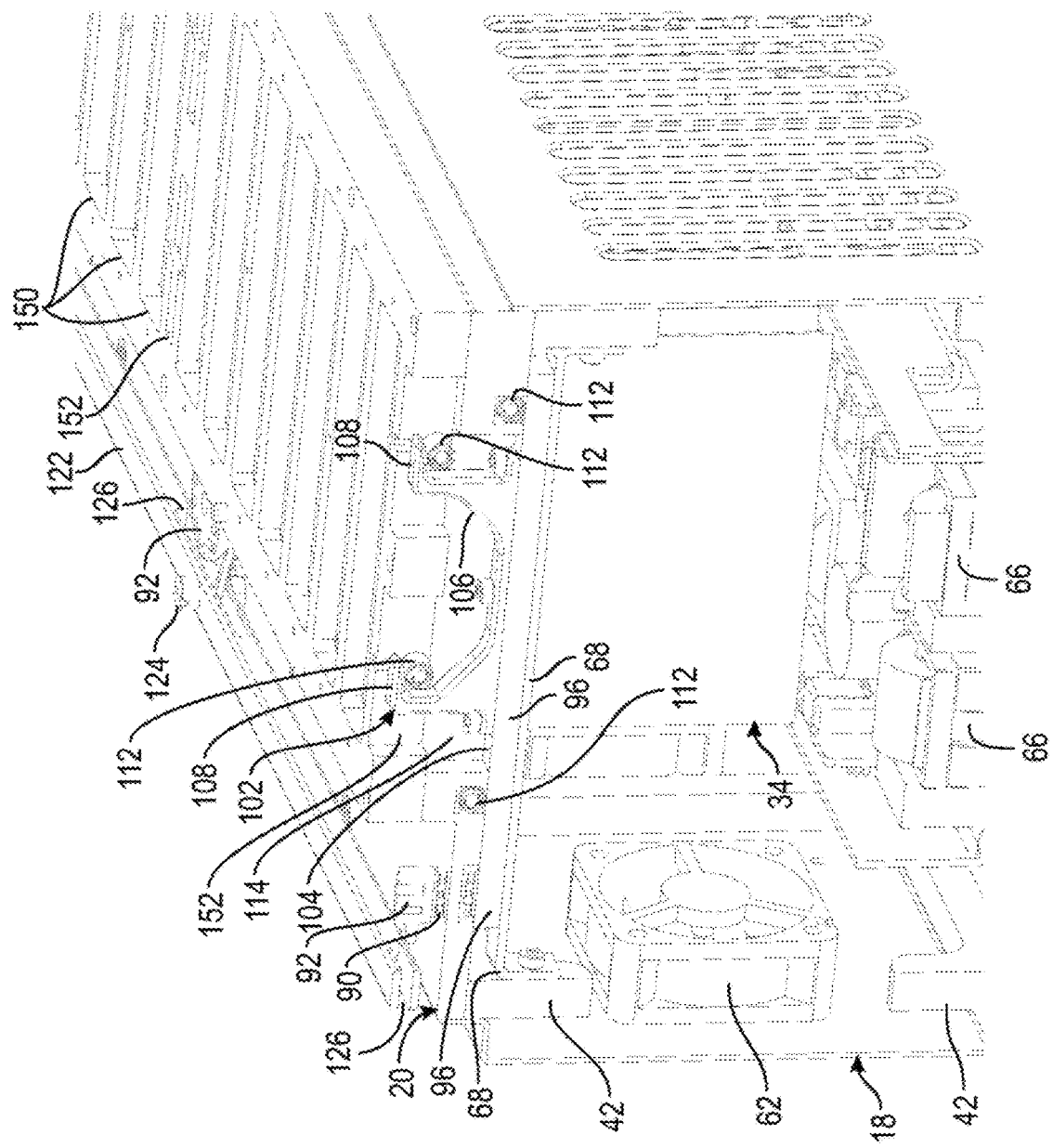
FIG. 12 is a cut-away perspective view of the module described in FIG. 1, the view cut through the axis of rotation of a post of the locking mechanism, the view showing the arms of an engagement member of the locking mechanism engaging bearings within slots of the top stiffener in order to bring the top stiffener into close contact with the socket plate, the view also showing electrical testing boards, the view showing fans and vents which are configured to cool the electrical testing components of the testing system, the view also showing power supplies of the module.
Figure 13:
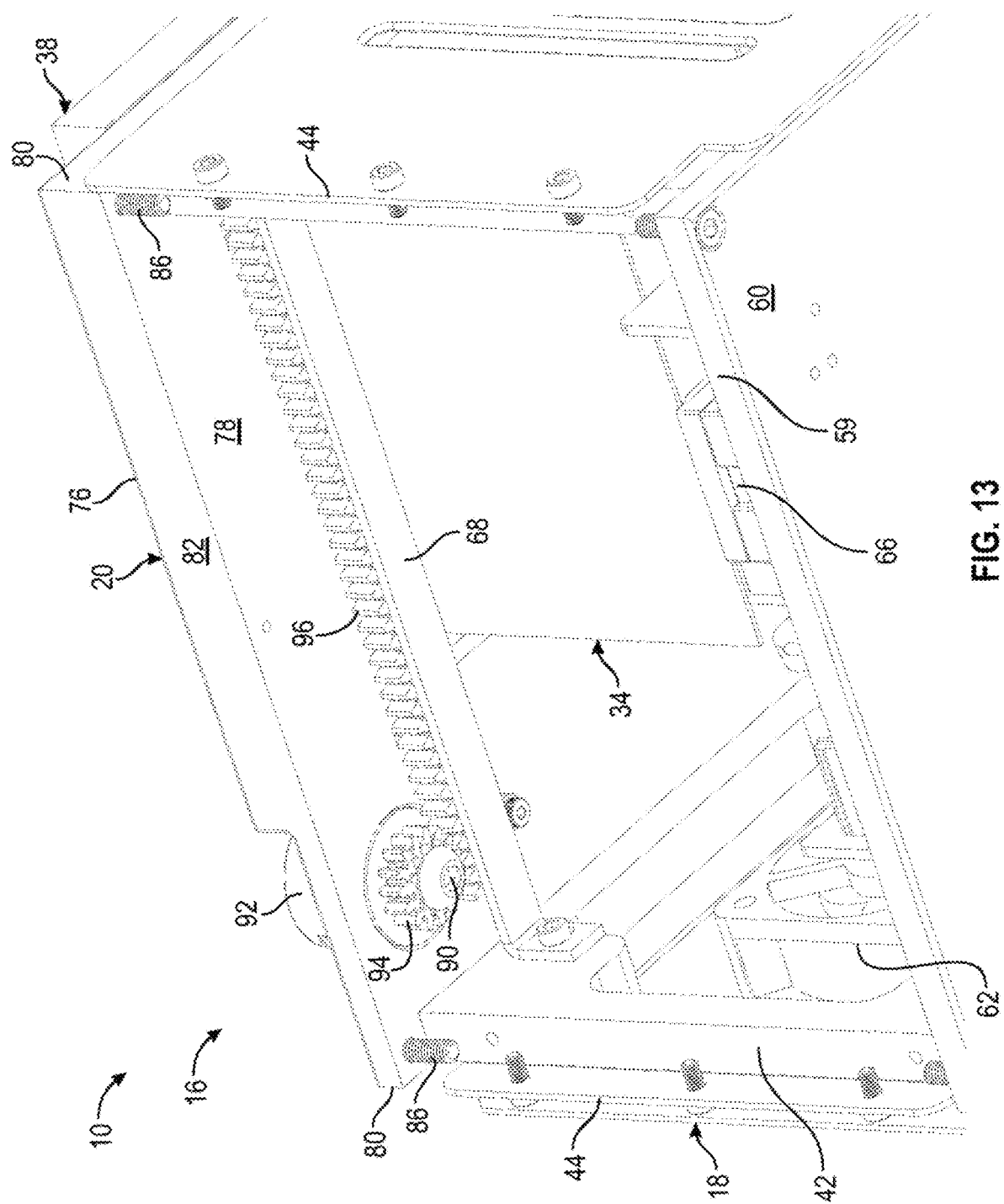
FIG. 13 is a cut-away perspective view of the module described in FIG. 1, the view cut through an end of the housing of the testing system, the view showing the rack and pinion of the locking mechanism as well as a head of the locking mechanism, the view also showing the hollow interior of the housing, the view also showing an electrical testing board.
Figure 14:
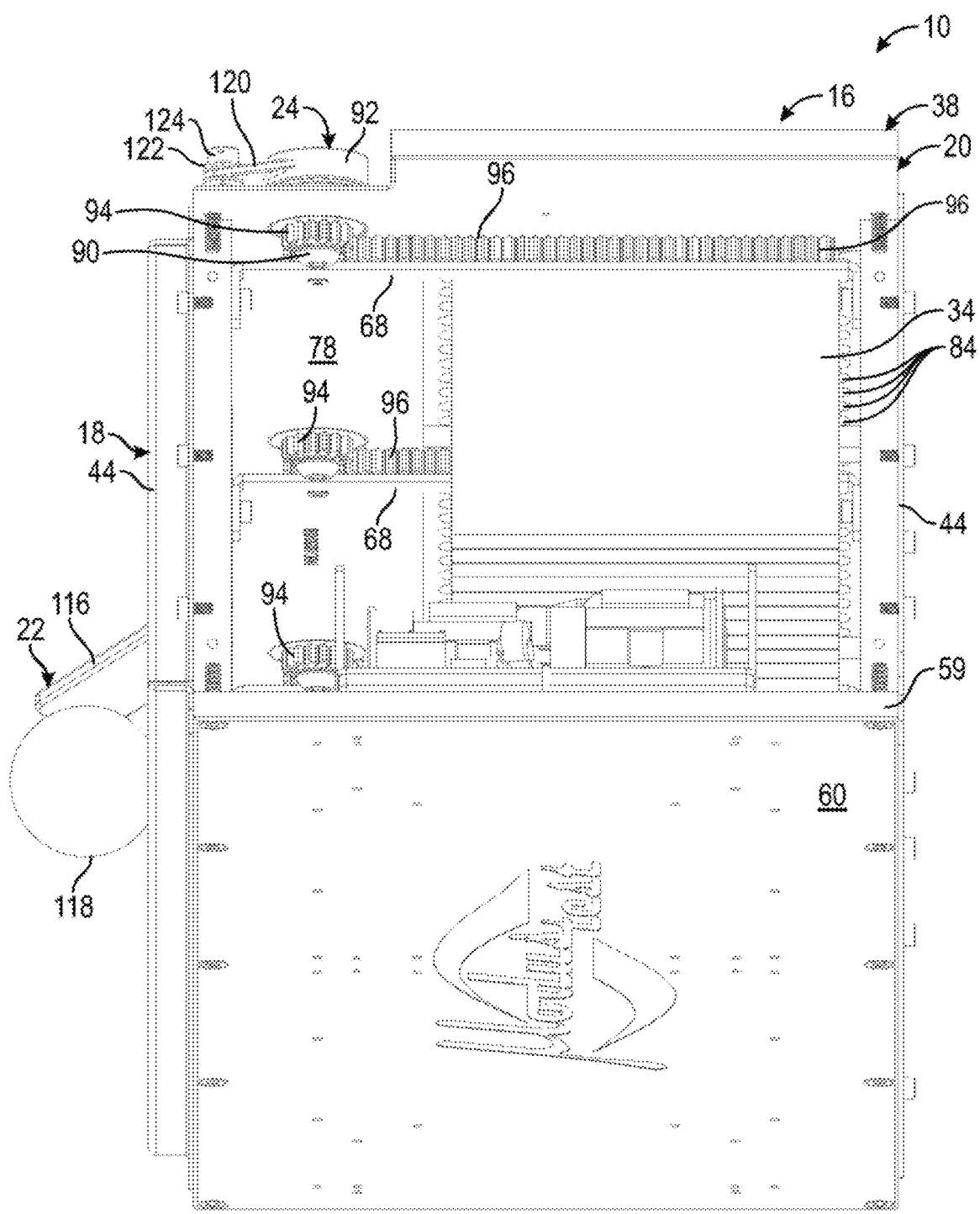
FIG. 14 is a perspective view of the cut-away view of FIG. 13, the view showing the lower surface of the bottom plate of the housing, the view showing racks and pinions of locking mechanism, the view also showing electrical testing boards.
Figure 15:
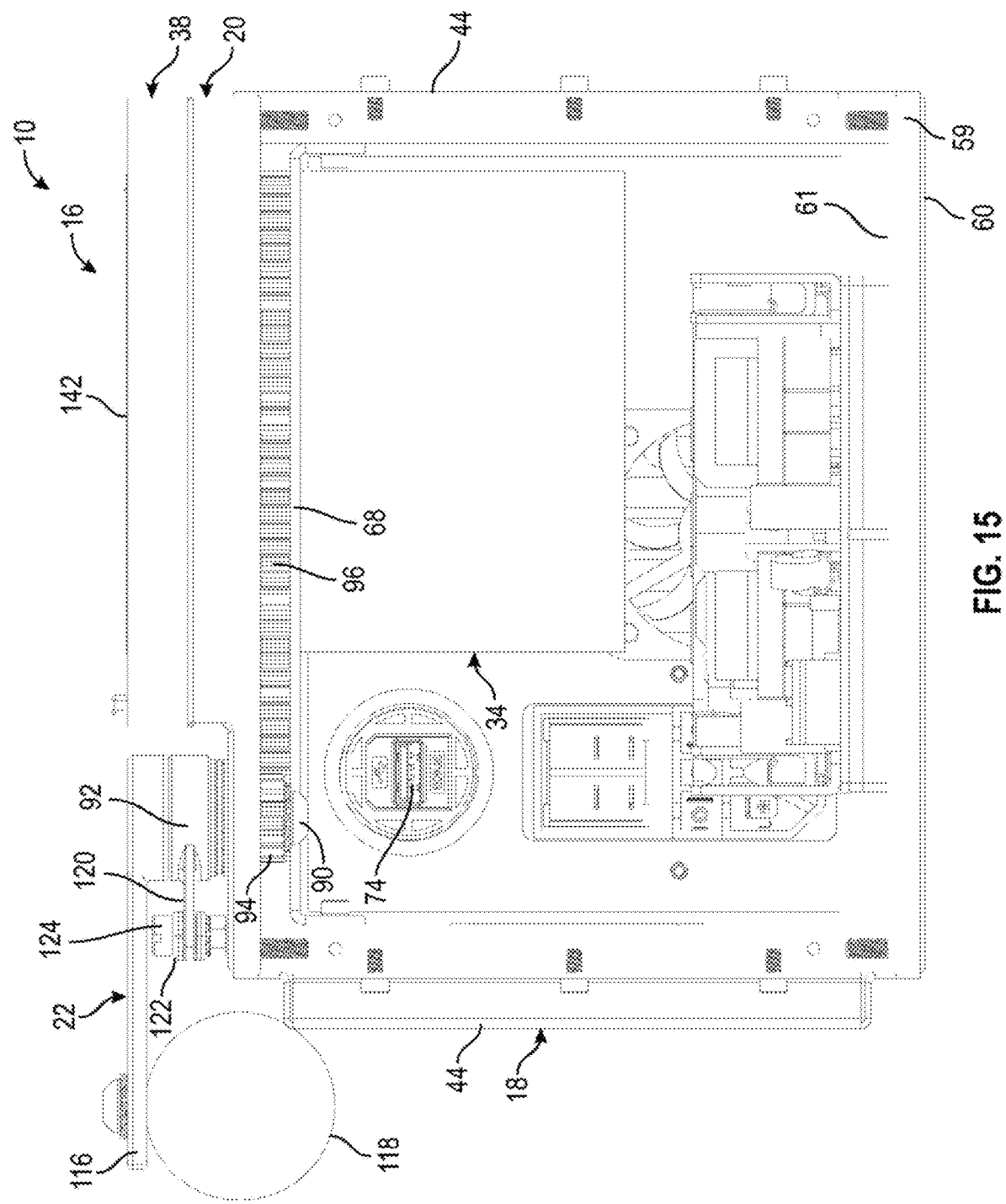
FIG. 15 is a cut-away elevation view through an end of the testing system of FIG. 1, the view showing the hollow interior of the housing, the view also showing a plug, switch, and data port located on the end of the housing, the view also showing an electrical testing board, the view also showing power supplies of the module.
Figure 16:
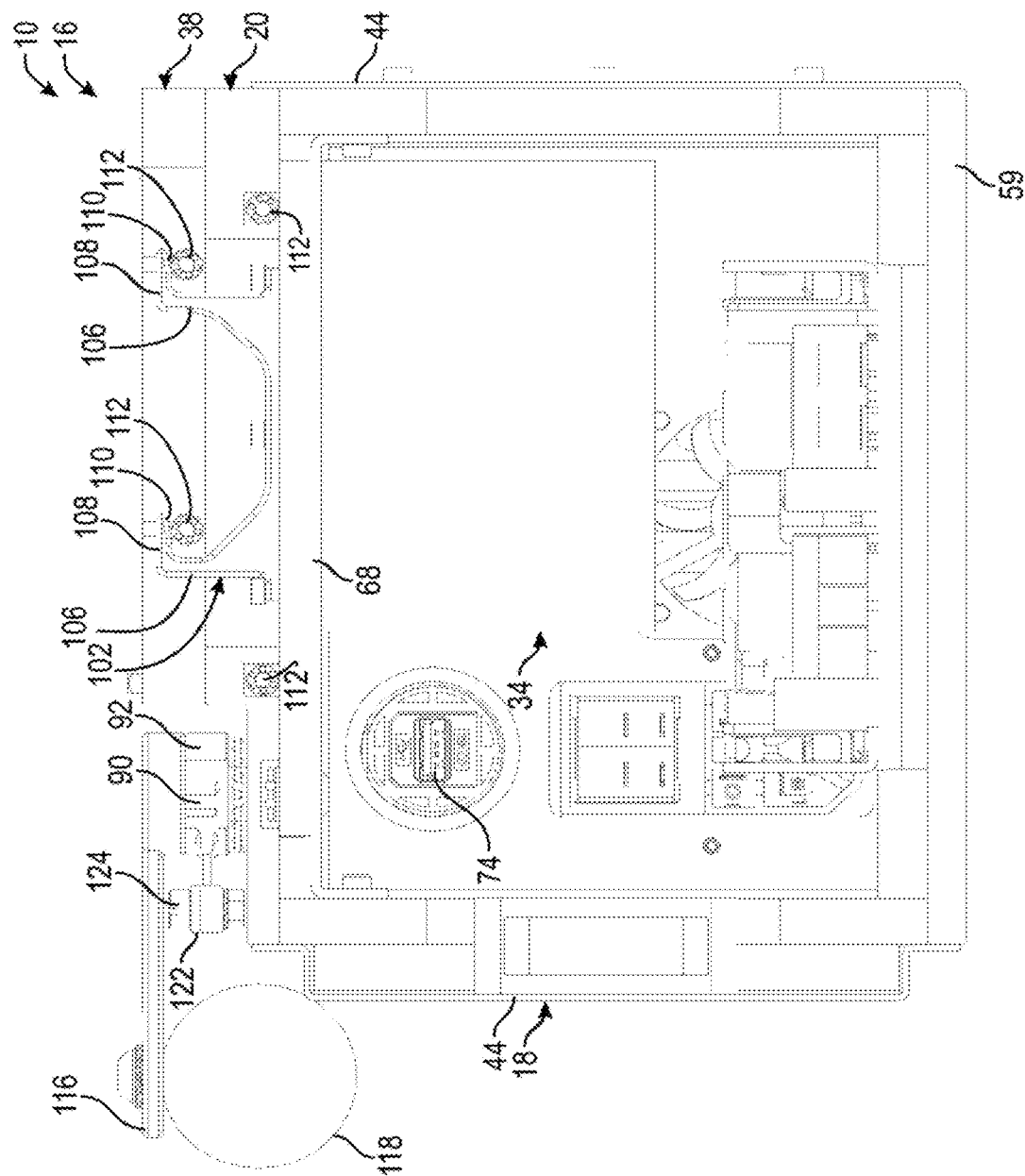
FIG. 16 is an elevation view from an end of the cut-away view of FIG. 15, the view also showing arms of an engagement member of the locking mechanism engaging bearings within slots of the top stiffener in order to bring the top stiffener into close contact with the socket plate.
Figure 17:
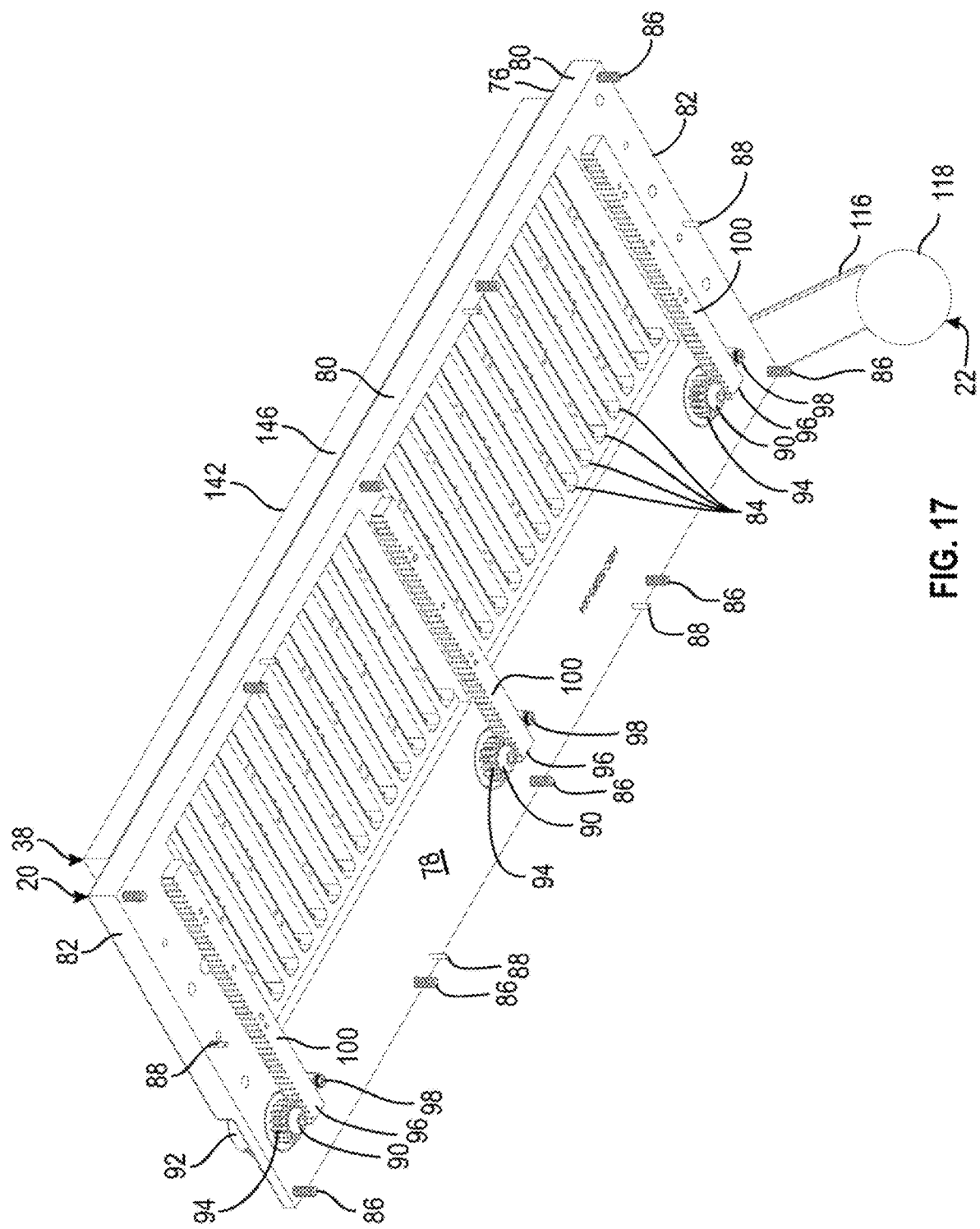
FIG. 17 is a perspective view of the socket plate of a module of the testing system, the view showing the actuating mechanism, the view also showing racks and pinions of the locking mechanism, the view also showing sockets in the socket plate, the view also showing alignment pins.
Figure 18:
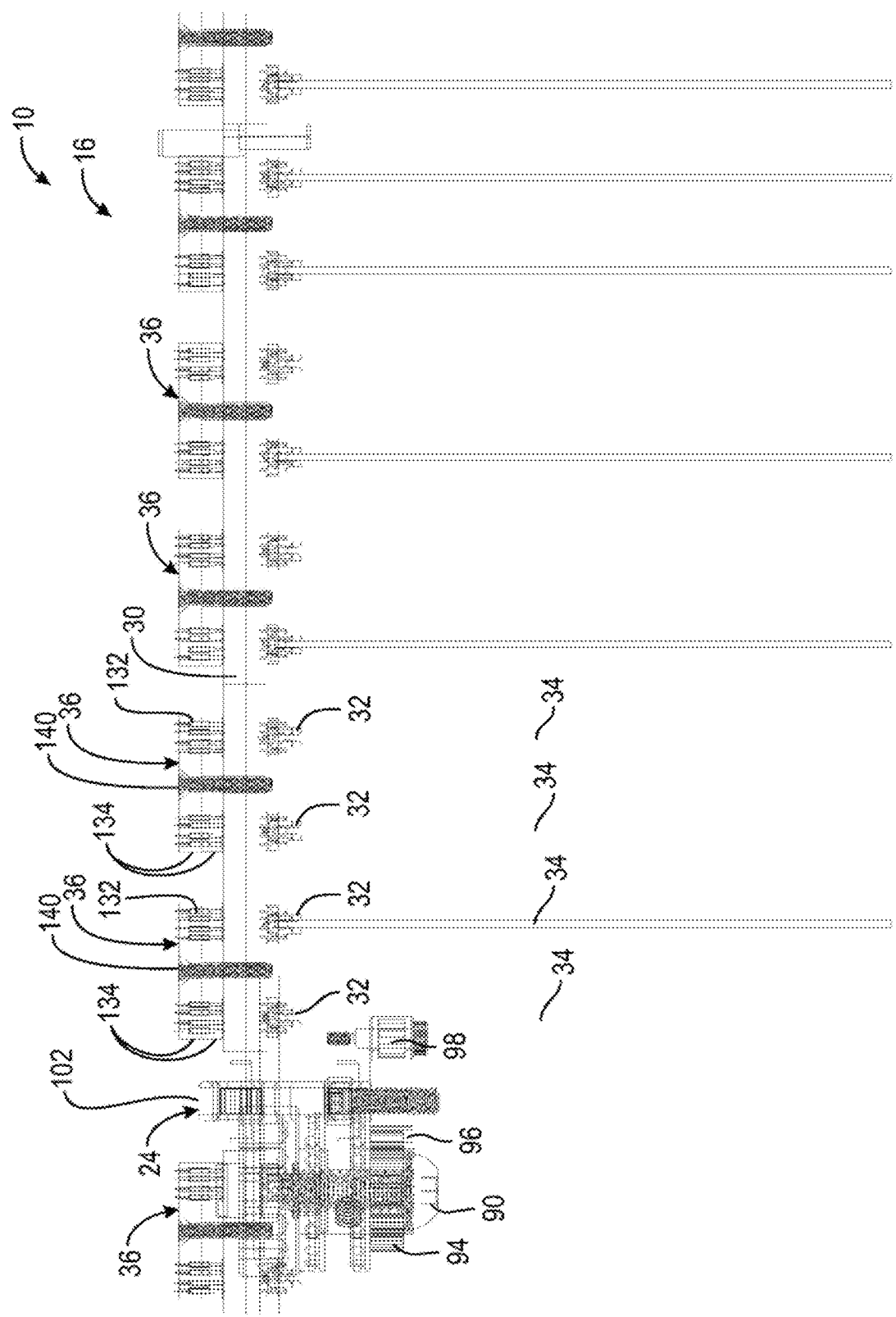
FIG. 18 is a close-up elevation cut-away view of multiple capsules connected to a motherboard, the view cut through the axis of rotation of a fastener used to connect the capsules to the motherboard, the view showing the capsules connected to the motherboard by the fastener, the view also showing compressible electrical contacts of the capsule, the view also showing electrical testing boards connected to sockets which connect to the motherboard, the view also showing a post, rack and pinion, and stop of the locking mechanism.
Figure 19:
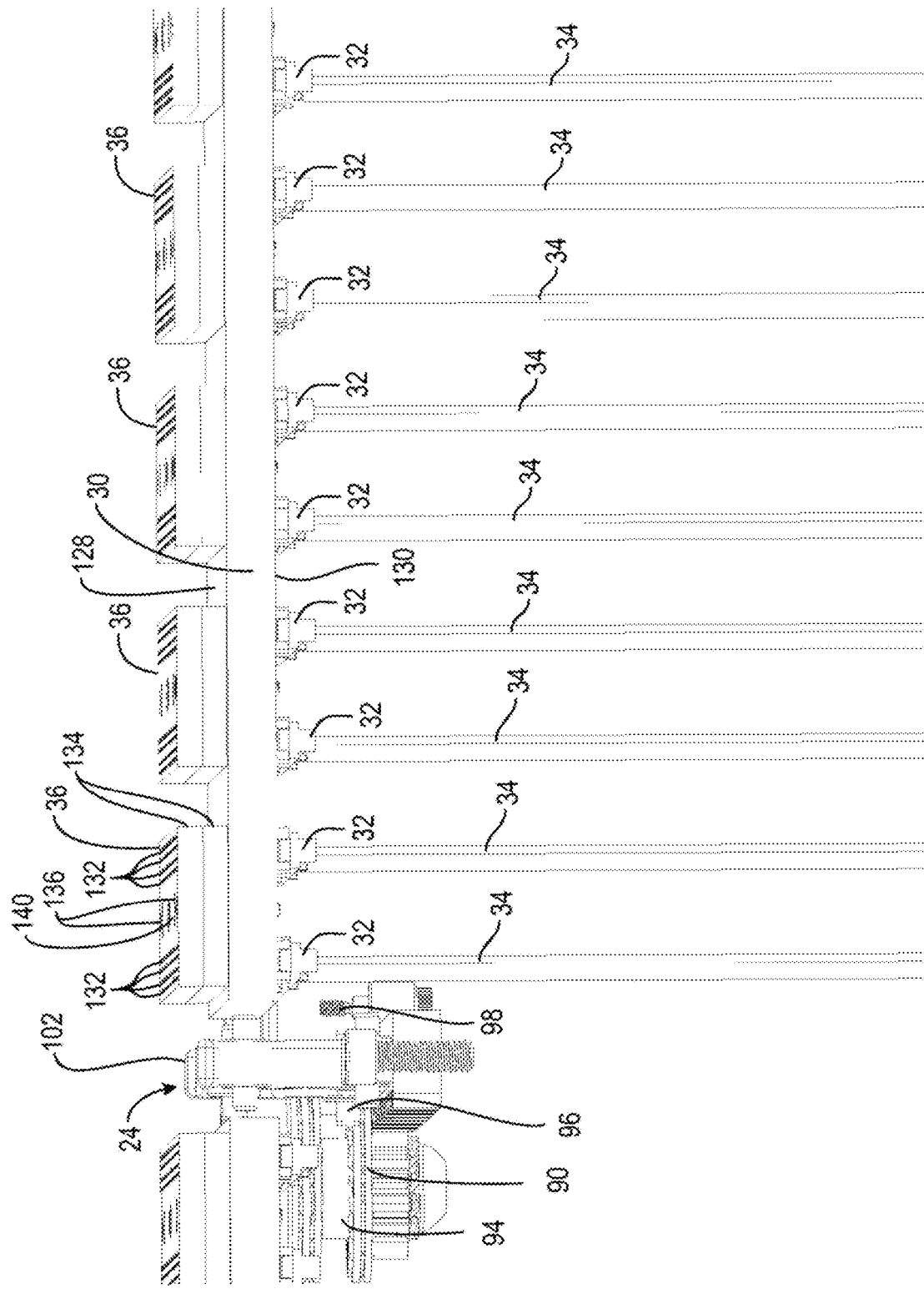
FIG. 19 is a close-up elevation cut-away view of multiple capsules connected to a motherboard, the view cut through the approximate end-to-end middle of a capsule, the view showing capsules connected to the mother board, the view also showing electrical testing boards connected to sockets which connect to the motherboard, the view also showing a post, rack and pinion, and stop of the locking mechanism.
Figure 20:
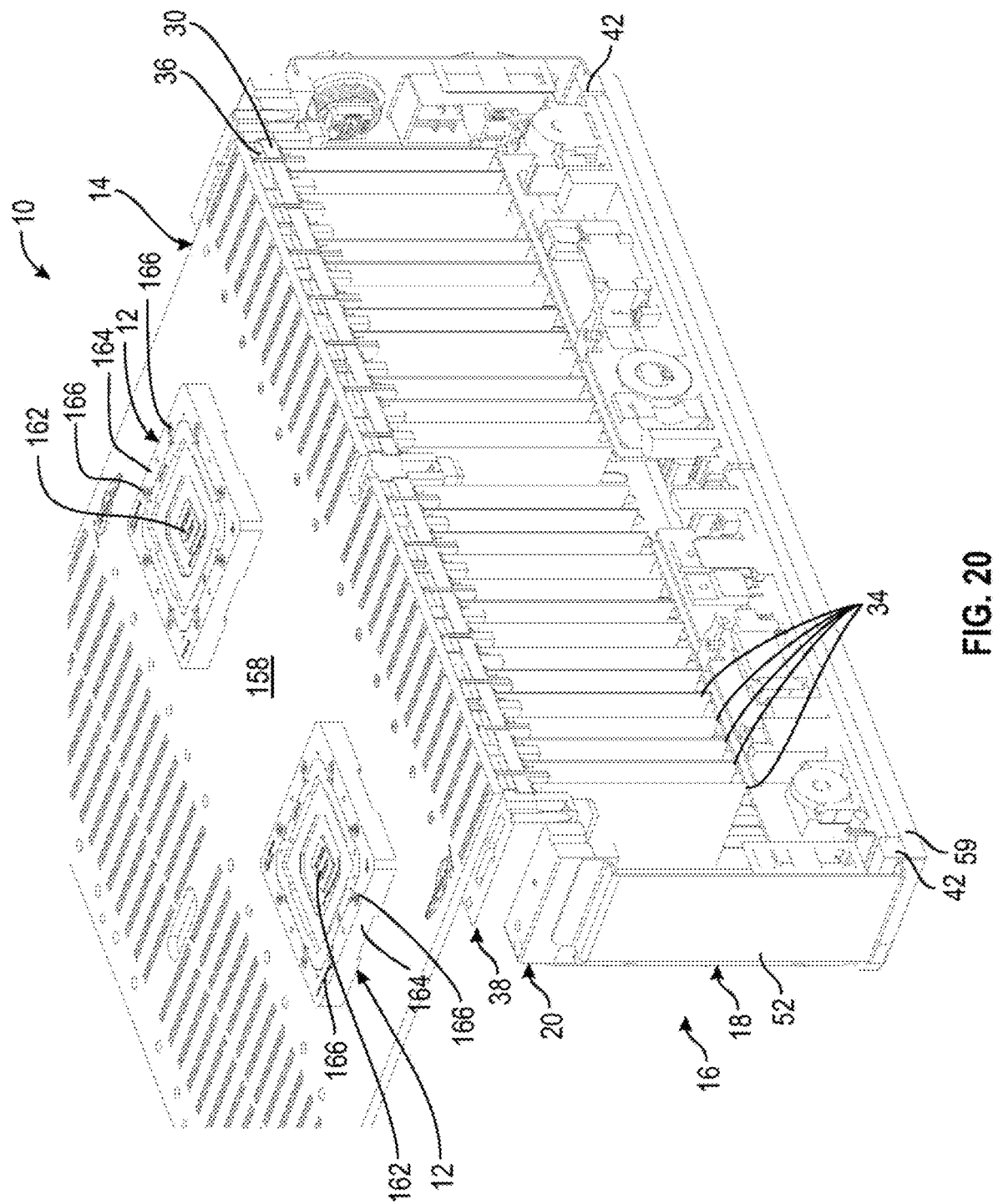
FIG. 20 is a cut-away elevation view of the testing system, the view cut through the approximate end-to-end middle of a capsule, the view showing a DUT PCB connected to the top stiffener, the view showing two test sockets connected to the DUT PCB and a DUT connected to each test socket, the view showing electrical testing boards connected to sockets connected to the motherboard, which is electrically connected to the DUT PCB through the capsules.

In the following detailed description of the embodiments, reference is made to the accompanying drawings, which form a part hereof, and in which is shown by way of illustration specific embodiments in which the disclosure may be practiced. The embodiments of the present disclosure described below are not intended to be exhaustive or to limit the disclosure to the precise forms in the following detailed description. Rather, the embodiments are chosen and described so that others skilled in the art may appreciate and understand the principles and practices of the present disclosure. It will be understood by those skilled in the art that various changes in form and details may be made without departing from the principles and scope of the invention. It is intended to cover various modifications and similar arrangements and procedures, and the scope of the appended claims therefore should be accorded the broadest interpretation so as to encompass all such modifications and similar arrangements and procedures. For instance, although aspects and features may be illustrated in or described with reference to certain figures or embodiments, it will be appreciated that features from one figure or embodiment may be combined with features of another figure or embodiment even though the combination is not explicitly shown or explicitly described as a combination. In the depicted embodiments, like reference numbers refer to like elements throughout the various drawings.

It should be understood that any advantages and/or improvements discussed herein may not be provided by various disclosed embodiments, or implementations thereof. The contemplated embodiments are not so limited and should not be interpreted as being restricted to embodiments, which provide such advantages or improvements. Similarly, it should be understood that various embodiments may not address all or any objects of the disclosure or objects of the invention that may be described herein. The contemplated embodiments are not so limited and should not be interpreted as being restricted to embodiments which address such objects of the disclosure or invention. Furthermore, although some disclosed embodiments may be described relative to specific materials, embodiments are not limited to the specific materials or apparatuses but only to their specific characteristics and capabilities and other materials and apparatuses can be substituted as is well understood by those skilled in the art in view of the present disclosure.

It is to be understood that the terms such as "left, right, top, bottom, front, back, side, height, length, width, upper, lower, interior, exterior, inner, outer, and the like as may be used herein, merely describe points of reference and do not limit the present invention to any particular orientation or configuration.

As used herein, the term "or" includes one or more of the associated listed items, such that "A or B" means "either A or B". As used herein, the term "and" includes all combinations of one or more of the associated listed items, such that "A and B" means "A as well as B." The use of "and/or" includes all combinations of one or more of the associated listed items, such that "A and/or B" includes "A but not B," "B but not A," and "A as well as B," unless it is clearly indicated that only a single item, subgroup of items, or all items are present. The use of "etc." is defined as "et cetera" and indicates the inclusion of all other elements belonging to the same group of the preceding items, in any "and/or" combination(s).

As used herein, the singular forms "a," "an," and "the" are intended to include both the singular and plural forms, unless the language explicitly indicates otherwise. Indefinite articles like "a" and "an" introduce or refer to any modified term, both previously-introduced and not, while definite articles like "the" refer to a same previously-introduced term; as such, it is understood that "a" or "an" modify items that are permitted to be previously-introduced or new, while definite articles modify an item that is the same as immediately previously presented. It will be further understood that the terms "comprises," "comprising," "includes," and/or "including," when used herein, specify the presence of stated features, characteristics, steps, operations, elements, and/or components, but do not themselves preclude the presence or addition of one or more other features, characteristics, steps, operations, elements, components, and/or groups thereof.

It will be understood that when an element is referred to as being "connected," "coupled," "mated," "attached," "fixed," etc. to another element, it can be directly connected to the other element, and/or intervening elements may be present. In contrast, when an element is referred to as being "directly connected," "directly coupled," "directly engaged" etc. to another element, there are no intervening elements present. Other words used to describe the relationship between elements should be interpreted in a like fashion (e.g., "between" versus "directly between," "adjacent" versus "directly adjacent," "engaged" versus "directly engaged," etc.). Similarly, a term such as "operatively", such as when used as "operatively connected" or "operatively engaged" is to be interpreted as connected or engaged, respectively, in any manner that facilitates operation, which may include being directly connected, indirectly connected, electronically connected, wirelessly connected or connected by any other manner, method or means that facilitates desired operation. Similarly, a term such as "communicatively connected" includes all variations of information exchange and routing between two electronic devices, including intermediary devices, networks, etc., connected wirelessly or not. Similarly, "connected" or other similar language particularly for electronic components is intended to mean connected by any means, either directly or indirectly, wired and/or wirelessly, such that electricity and/or information may be transmitted between the components.

It will be understood that, although the ordinal terms "first," "second," etc. may be used herein to describe various elements, these elements should not be limited to any order by these terms unless specifically stated as such. These terms are used only to distinguish one element from another; where there are "second" or higher ordinals, there merely must be a number of elements, without necessarily any difference or other relationship. For example, a first element could be termed a second element, and, similarly, a second element could be termed a first element, without departing from the scope of example embodiments or methods.

Similarly, the structures and operations discussed herein may occur out of the order described and/or noted in the figures. For example, two operations and/or figures shown in succession may in fact be executed concurrently or may sometimes be executed in the reverse order, depending upon the functionality/acts involved. Similarly, individual operations within example methods described below may be executed repetitively, individually or sequentially, to provide looping or other series of operations aside from single operations described below. It should be presumed that any embodiment or method having features and functionality described below, in any workable combination, falls within the scope of example embodiments.

System:

With reference to the figures, a testing system 10 (or simply system 10) is presented. Testing system 10 is formed of any suitable size, shape and design and is configured to facilitate testing of test sockets 12 and/or DUT PCBs 14. In the arrangement shown, as one example, testing system 10 may be formed of one or more modules 16. In the arrangement shown, as one example, module 16 of testing system 10 includes a housing 18, a socket plate 20 an actuating mechanism 22 and a locking mechanism 24, electrical testing components 26 including card assemblies 28 having a mother board 30 having a plurality of electrical sockets 32 that connect to electrical testing boards 34, a plurality of capsules 36, a top stiffener 38, a device under test printed circuit board (or DUT PCB) 14 and at least one electrical interconnect also known as test socket 12, among other components as is further described herein.

Housing:

In the arrangement shown, as one example, modules 16 of testing system 10 include a housing 18. Housing 18 is formed of any suitable size, shape and design and is configured to house and hold and shelter and secure and support various components of the system, as is further described herein. In the arrangement shown, as one example, housing 18 is generally square or rectangular in shape and forms a generally hollow interior 40 which houses other components of the system 10, as is further described herein.

Frame Assembly: In the arrangement shown, as one example, housing 18 includes a frame assembly 42. Frame assembly 42 is formed of any suitable size, shape and design and is configured to provide structural support and integrity to module 16. In the arrangement shown, frame assembly 42 is a generally square or rectangular shaped member that forms hollow interior 40.

Sidewalls: In the arrangement shown, as one example, housing 18 includes pair of opposing sidewalls 44 that connect to frame assembly 42 and extend in a generally planar manner from a lower end 46 to an upper end 48 in approximate parallel planar spaced relation to one another; opposing sidewalls 44 also extend in a generally planar manner between opposing outward ends 50 in approximate parallel planar spaced relation to one another. Sidewalls 44 connect at their outward ends 50 at or near or to end walls 52.

End Walls: In the arrangement shown, as one example, housing 18 includes a pair of opposing end walls 52 that connect to frame assembly 42. Like sidewalls 44, end walls 52 extend in a generally planar manner from a lower end 54 to an upper end 56 in approximate parallel planar spaced relation to one another; opposing end walls 52 also extend in a generally planar manner between opposing outward ends 58 in approximate parallel planar spaced relation to one another. End walls 52 connect at their outward ends 58 at or near or to the outward ends 50 of sidewalls 44.

Bottom Plate: In the arrangement shown, as one example, housing 18 includes a bottom plate 59. Bottom plate 59 is formed of any suitable size, shape and design and is configured to enclose the lower end of module 16 and/or for placement on a table, desk or other surface, or alternatively for connecting system 10 to another machine, such as a semiconductor testing system, automated testing system, a pick and place machine or any other machine or device. In the arrangement shown, as one example, bottom plate 59 is a generally planar square or rectangular shaped member that connects to the lower end of frame assembly 42.

In the arrangement shown, as one example, sidewalls 44 connect at their lower end 46 at or near or to bottom plate 59, and end walls 52 connect at their lower end 54 at or near or to bottom plate 59. Bottom plate 59 is generally planar in shape and defines a generally planar upper surface 61 and a generally planar lower surface 60.

In the arrangement shown, as one example, sidewalls 44 connect at their outward ends 50 at or near or to the outward ends 58 of end walls 52 and sidewalls 44 and end walls 52 are arranged in approximate perpendicular alignment to one another. In the arrangement shown, as one example, the plane of bottom plate 59 extends in approximate perpendicular planar alignment to the plane of sidewalls 44. In the arrangement shown, as one example, the plane of bottom plate 59 extends in approximate perpendicular planar alignment to the plane of end walls 52. In this way, the arrangement of sidewalls 44 to end walls 52 to bottom plate 59 form a generally square or rectangular box or frame that forms housing 18 that houses many of the components shown and described herein, including most if not all of the electrical testing components 26. However, any other size or shape of frame housing 18 is hereby contemplated for use.

Fans & Vents: In the arrangement shown, as one example, housing 18 includes a plurality of fans 62 that connect to vents 64. Fans 62 are formed of any suitable size, shape and design and are configured to facilitate air movement within the hollow interior 40 of housing 18 so as to keep the electrical testing components 26 and other heat-generating electrical components housed within housing 18 cool. Due to the high density of electrical components positioned within the hollow interior 40 of housing 18, module 16 generates a large amount of heat. As such, fans 62 are configured to facilitate air flow that keeps these electrical components cool and prevents overheating. In the arrangement shown, as one example, fans 62 are electrical fans that are connected to the interior surface of sidewalls 44 and/or end walls 52.

In the arrangement shown, as one example, a plurality of fans 62 are spaced across the interior surface of one of the sidewalls 44 whereas the opposite sidewall 44 has no fans 62 but includes vents 64 that extend across a large portion of the sidewall 44. In this arrangement, air is pushed or pulled across the hollow interior 40 of housing 18 by fans 62 through vents 64. This high density of fans 62 facilitates high levels of air movement.

In the arrangement shown, as one example, a fan 62 is also connected to the interior surface of both end walls 52. Like the fans 62 in sidewalls 44, the fans 62 in end walls 52 move air through vents 64 in end walls 52.

Any number of fans 62 is hereby contemplated for use in housing 18 as is any placement of fans 62. Similarly, any number or configuration of vents 64 is hereby contemplated for use in housing 18 as is any placement of vents 64. In addition, any other manner, method or means of cooling the electrical components of module 16 is hereby contemplated for use such as the use of refrigerant, or the like.

Power Supplies & Other Electrical Components: In the arrangement shown, as one example, the hollow interior 40 of housing 18 also houses and holds a plurality of power supplies 66 and other electrical components that facilitate operation of the module 16 and system 10. In the arrangement shown, as one example, these power supplies 66 and other electrical components are connected to the upper surface 61 of bottom plate 59, however any other placement and arrangement is hereby contemplated for use.

Cross Supports: In the arrangement shown, as one example, housing 18 includes a plurality of cross supports 68. Cross supports 68 are formed of any suitable size, shape and design and are configured to connect opposing sidewalls 44 adjacent the open upper end of housing 18. In the arrangement shown, three cross supports 68 are shown in use that extend the distance between opposing sidewalls 44 just below the open upper end of housing 18. In the arrangement shown, as one example, one cross support 68 is generally positioned at the approximate center of housing 18 and the other cross supports 68 are positioned a distance just inward of end walls 52.

In one arrangement, as is shown, the upper surface of cross supports 68 is positioned just below movable portions of locking mechanism 24. In one arrangement, the upper surface of cross supports 68 engages and/or provides support for movable portions of locking mechanism 24.

Plug, Switch, Data Port: In the arrangement shown, as one example, modules 16 include a plug 70, a switch 72 and a data port 74, among other components. In the arrangement shown, as one example, plug 70, switch 72 and data port 74 are shown in one of the end walls 52, however any other placement and configuration is hereby contemplated for use.

Plug 70 is formed of any suitable size, shape and design and is configured to facilitate electrical connection to the electrical components of the module 16. In the arrangement shown, as one example, plug 70 is a conventional 120-volt AC plug, however any other form of a plug or any number of plugs is hereby contemplated for use as is a direct wired connection.

Switch 72 is formed of any suitable size, shape and design and is configured to control the powering of the module 16. In the arrangement shown, as one example, switch 72 is a conventional on/off switch, however any other form of a switching mechanism is hereby contemplated for use.

Data port 74 is formed of any suitable size, shape and design and is configured to facilitate electrical connection to the electrical components of the module 16 so as to facilitate the transfer of information and/or data to and/or from the electrical components of module 16. In the arrangement shown, as one example, data port 74 is a conventional USB port, however any other form of a data port 74 is hereby contemplated for use as well as the use of any number of data ports 74.

Socket Plate:

In the arrangement shown, as one example, modules 16 of testing system 10 include a socket plate 20. Socket plate 20 is formed of any suitable size, shape and design and is configured to connect to and enclose the upper end of the hollow interior 40 of housing 18 as well as provide support for electrical testing components 26, among other features and functionalities.

In the arrangement shown, as one example, socket plate 20 is a generally planar member having a generally flat upper surface 76 and a generally flat lower surface 78 that extend in approximate parallel planar spaced relation to one another. In the arrangement shown, as one example, socket plate 20 extends a width between opposing sides 80 that extend in approximate parallel spaced relation to one another. In the arrangement shown, as one example, socket plate 20 extends a length between opposing ends 82 that extend in approximate parallel spaced relation to one another. In the arrangement shown, as one example, sides 80 and ends 82 extend in approximate perpendicular alignment to one another thereby forming a generally square or rectangular member when viewed from above or below. In the arrangement shown, as one example, upper surface 76 and opposing lower surface 78 and sides 80 extend in approximate perpendicular alignment to one another thereby forming a generally square or rectangular member when viewed from a side 80. In the arrangement shown, as one example, upper surface 76 and opposing lower surface 78 and ends 82 extend in approximate perpendicular alignment to one another thereby forming a generally square or rectangular member when viewed from an end 82.

Sockets: In the arrangement shown, as one example, socket plate 20 includes a plurality of sockets 84. Sockets 84 are formed of any suitable size, shape and design and are configured to allow electrical components of the module 16 to extend through the socket plate 20 and into the hollow interior 40 of housing 18 while the upper surface 76 provides support for the electrical testing components 26. In the arrangement shown, as one example, when viewed from above or below, sockets 84 are generally elongated square or rectangular openings that extend through socket plate 20 from upper surface 76 to lower surface 78. A plurality of sockets 84 extend in generally parallel spaced relation to one another along the end 82 to end 82 length of socket plate 20 with the length of each socket 84 extending across the side 80 to side 80 width of socket plate 20.

These sockets 84 are sized and shaped to receive and/or hold and/or allow a portion of the electrical testing components 26 to extend through the socket plate 20. In the arrangement shown, as one example, electrical testing components 26 are installed on module by inserting the lower end of the electrical testing boards 34 through the sockets 84 and lowering the electrical testing components 26 until the lower surface of motherboard 30 rests upon the upper surface 76 of socket plate 20. In this fully assembled arrangement, an electrical socket 32 and a portion of upper end of an electrical testing board 34 resides within each socket 84 of socket plate 20 with the remaining portion of electrical testing board 34 extending below the lower surface 78 of socket plate 20.

Fasteners: In the arrangement shown, as one example, socket plate 20 is connected to the upper end of housing 18. Socket plate 20 may be connected to housing 18 by any manner, method or means. In the arrangement shown, as one example, socket plate 20 is connected to the upper end housing by a plurality of fasteners 86. In the arrangement shown, as one example, a plurality of fasteners 86 extend through socket plate 20 around its outer peripheral upper edge and into housing 18. In the arrangement shown, as one example, these fasteners 86 extend through socket plate 20 and into the upper end of frame assembly 42. In the arrangement shown, as one example, fasteners 86 are screws or bolts, however any other form of a fastener is hereby contemplated for use.

Attaching socket plate 20 to housing 18 using a plurality of fasteners 86 in this manner provides a strong, durable, robust and secure manner of attachment. However, attaching socket plate 20 to housing 18 using a plurality of fasteners 86 in this manner makes it very difficult, complex and time consuming to remove the socket plate 20 from the housing 18. In addition, removing socket plate 20 from housing 18 when it is attached using a plurality of fasteners 86 in this manner requires a certain level of skill as well as the use of various tools.

Alignment Pins: In the arrangement shown, as one example, socket plate 20 includes a plurality of alignment pins 88. Alignment pins 88 are formed of any suitable size, shape and design and are configured to facilitate the alignment of other components of the system 10 during installation so as to facilitate quick, easy and precise alignment of these other components (such as electrical testing components 26, top stiffener 38 and DUT PCB 14 among other components). In the arrangement shown, as one example, alignment pins 88 are generally cylindrical members that extend upward out of the upper surface 76 of socket plate 20. These alignment pins 88 are placed in precise locations that are matched in size, shape and position with corresponding openings or holes or edges or other alignment features in the components that are installed onto the socket plate 20.

The use of alignment pins 88 along with corresponding openings or holes or edges or other alignment features in the components that are installed onto the socket plate 20 facilitates quick, easy, precise and error-free installation of the other components of the system 10. That is, in one arrangement, alignment pins 88 along with corresponding openings or holes or edges or other alignment features in the components that are installed onto the socket plate 20 are aligned in a manner that prevents the other components from being installed in an incorrect manner. This is often known as "poka-yoke," or designing components in a manner that does not allow them to be assembled in an incorrect manner. The use of alignment pins 88 in this manner in socket plate 20 also facilitates the installation of the other components of the system 10 without any tools, which speeds assembly and disassembly and reduces assembly errors. To facilitate this, the alignment pins 88 may be formed of varying height and varying diameter as well.

In one arrangement, alignment pins 88 may also extend outward from the lower surface 78 of socket plate 20 so as to facilitate alignment of socket plate 20 to housing 18 during installation of the socket plate 20 onto the housing 18.

In the arrangement shown, as one example, socket plate 20 includes a locking mechanism 24. In the arrangement shown, as one example, an actuating mechanism 22 is connected to and operates locking mechanism 24.

Locking Mechanism:

In the arrangement shown, as one example, socket plate 20 includes a locking mechanism 24. Locking mechanism 24 is formed of any suitable size, shape and design and is configured to facilitate locking or securing of other components to the system 10, once installed, to ensure that they are securely held in place as well as to ensure that a good electrical connection is formed between the electrical components of the system.

Post: In the arrangement shown, as one example, locking mechanism 24 includes at least one post 90. Post 90 is formed of any suitable size, shape and design and is configured to transfer rotational movement. In the arrangement shown, as one example, post 90 is generally cylindrical in shape and extends above the upper surface 76 of socket plate 20 a distance, through socket plate 20, and below the lower surface 78 of socket plate 20 a distance. The generally cylindrical shape of post 90 facilitates rotational movement of post 90 as post extends through socket plate 20. The extension of post 90 through socket plate 20 coupled with the rotation of post 90 facilitates the transfer of rotational movement that occurs above the upper surface 76 of socket plate 20 or outside of the hollow interior 40 of housing 18, into rotational movement below the lower surface 78 of socket plate 20 and into the hollow interior 40 of housing 18. In the arrangement shown, as one example, the axis of rotation of post 90 extends through socket plate 20 in a generally perpendicular alignment to the plane formed by the upper surface 76 or lower surface 78 of socket plate 20.

Head & Pinion: In the arrangement shown, as one example, the upper end of post 90 includes an enlarged head 92 positioned above the upper surface 76 of socket plate 20. In the arrangement shown, as one example, the lower end of post 90 includes a pinion 94 having a plurality of gear teeth therein positioned below the lower surface 78 of socket plate 20.

Rack: In the arrangement shown, as one example, a rack 96 is positioned adjacent pinion 94 positioned at the lower end of the post 90. Rack 96 is formed of any suitable size, shape and design and is configured to facilitate lateral movement when post 90 rotates. In the arrangement shown, as one example, rack 96 is an elongated member having a plurality of gear teeth positioned on a side adjacent pinion 94. The gear teeth of rack 96 are similarly sized and shaped to the gear teeth in pinion 94 and in this way the gear teeth of rack 96 mesh with the gear teeth of pinion 94. In the arrangement shown, as one example, rack 96 extends across the lower surface 78 of socket plate 20 across the side 80 to side 80 width of socket plate 20.

Stop: In the arrangement shown, as one example, a stop 98 is positioned adjacent rack 96 on a side opposite pinion 94. Stop 98 is formed of any suitable size, shape and design and is configured to hold rack 96 in place as pinion 94 rotates while facilitating lateral movement of rack 96. In this way, rack 96 is sandwiched between pinion 94 and stop 98. The presence of stop 98, opposite pinion 94, prevents pinion 94 from pushing rack 96 away as pinion 94 rotates. In one arrangement, as is shown, stop 98 includes a rotating bearing that reduces friction by facilitating rotation as rack 96 moves laterally. As pinion 94 rotates, the gear teeth of pinion 94 mesh with the gear teeth of rack 96 and cause lateral movement of rack 96 while the stop 98 positioned opposite pinion 94 prevents rack 96 from pushing away from pinion 94. In this way lateral movement of rack 96 is facilitated within the hollow interior 40 of housing 18 through rotational movement of pinion 94 outside of the hollow interior 40 of housing 18.

In the arrangement shown, as one example, the lower surface 100 of rack 96 is positioned just above the upper surface of cross supports 68. In one arrangement, cross supports 68 provide support to rack 96 and in this arrangement, rack 96 slides over the upper surface of cross supports 68 as rack 96 laterally moves within hollow interior 40 of housing 18.

Engagement Member: In the arrangement shown, as one example, an engagement member 102 is connected to the upper surface 104 of rack 96. Engagement member 102 is formed of any suitable size, shape and design and is configured engage other components of the system 10 and pull them into secure and locked engagement as the engagement member 102 is laterally moved. In the arrangement shown, as one example, engagement member 102 includes a pair of arms 106 that extend upward from rack 96. Arms 106 terminate at their upper end at flanges 108 that extend in approximate perpendicular alignment to the vertical extension of arms 106 and in approximate parallel spaced alignment to the length of rack 96 and the direction of lateral movement of rack 96. An angled surface 110 or cam surface is positioned at the outward end of flanges 108. Angled surface 110 angles from the tip of flange 108 downward, and towards rack 96, as it extends towards arms 106.

In the arrangement shown, engagement member 102 includes a pair of arms 106, each having a flange 108 and an angled surface 110. However, any number of arms 106 are hereby contemplated for use for each engagement member 102.

In the arrangement shown, as one example, as rack 96 moves from a disengaged position to an engaged position, when top stiffener 38 is in place on top of socket plate 20, the angled surface 110 of flanges 108 of arms 106 of engagement members 102 engage bearings 112 connected to top stiffener 38. As engagement members 102 move laterally from a disengaged position to an engaged position, the angled surface 110 of engagement member 102 slides over the bearing 112 of top stiffener 38 thereby causing top stiffener 38 to be pulled toward socket plate 20 thereby creating a secure connection as well as a secure electrical connection. As engagement member 102 moves laterally from a disengaged position to an engaged position, and the engagement member 102 engages top stiffener 38, the top stiffener 38 is prevented from laterally moving by contact and/or connection with alignment pins 88. As such, when engagement member 102 engages top stiffener 38 and moves from a disengaged position to an engaged position, top stiffener 38 is limited to moving in a vertical manner toward socket plate 20.

In the arrangement shown, a flat section or slightly recessed section is positioned just behind the angled surface 110 of flanges 108. This flat or slightly recessed section is configured to hold bearings 112 therein in a static manner when engagement member 102 is in a fully engaged position. That is, when engagement member 102 moves to a fully engaged position, bearings 112 are held in the flat or slightly recessed section rearward of the angled surface 110 which allows the top stiffener 38 to be held therein indefinitely as the forces are neutral and there is no motivation for the engagement member 102 to move in a disengagement direction due to the forces between bearings 112 and engagement member 102.

Also, in the arrangement shown, as one example, another set of bearings 112 are positioned in the lower surface 78 of socket plate 20 that engage the upper surface 104 of rack 96 so as to facilitate smooth and easy and consistent lateral sliding of rack 96 between an engagement position and a disengagement position. In the arrangement shown, as one example, two bearings 112 are used, on positioned on each outward end of slot 114 in socket plate 20.

In the arrangement shown, as one example, engagement members 102 extend though slots 114 in socket plate 20. In this arrangement the upper ends of arms 106 of engagement members 102 extend above the upper surface 76 of socket plate 20 a distance so as to facilitate engagement with top stiffener 38.

In the arrangement shown, as one example, three sets of posts 90, heads 92, pinions 94, racks 96, stops 98, and engagement members 102 are shown in use in socket plate 20. In the arrangement shown, as one example, one set of post 90, head 92, pinion 94, rack 96, stop 98, and engagement member 102 is generally centrally positioned on socket plate 20, with a motherboard 30 having a plurality of sockets 32 and electrical testing boards 34 attached to the motherboard 30 positioned on each side of this centrally positioned set of post 90, head 92, pinion 94, rack 96, stop 98, and engagement member 102. Also, in the arrangement shown, as one example, one set of posts 90, heads 92, pinions 94, racks 96, stops 98, and engagement members 102 are positioned adjacent each outward end 82 of socket plate 20 with a motherboard 30 having a plurality of sockets 32 and electrical testing boards 34 attached to the motherboard 30 positioned on the inward facing side of the outward-positioned sets of post 90, head 92, pinion 94, rack 96, stop 98, and engagement member 102. However any other number of sets of posts 90, heads 92, pinions 94, racks 96, stops 98, and engagement members 102 are hereby contemplated for use, such as one, two, three, four, five, six, seven, eight, nine, ten or more, as is any placement of these sets of components within socket plate 20.

In the arrangement shown, as one example, locking mechanism 24 is controlled by operation of actuating mechanism 22.

Actuating Mechanism:

In the arrangement shown, as one example, socket plate 20 includes an actuating mechanism 22. Actuating mechanism 22 is formed of any suitable size, shape and design and is configured to facilitate movement of locking mechanism 24 between a disengaged position and an engaged position. In the arrangement shown, as one example, a manual or hand-operated actuating mechanism 22 is presented. However, it is hereby contemplated to use a powered or electrically powered or motorized actuating mechanism 22 in place of the manual actuating mechanism 22 presented in the figures.

In the arrangement shown, as one example, actuating mechanism 22 includes an arm 116 having a handle 118. Arm 116 is formed of any suitable size, shape and design and is configured to connect to locking mechanism 24 and provide leverage to a user so as to facilitate manual operation of the locking mechanism 24. In the arrangement shown, as one example, arm 116 extends a length between opposing ends. In the arrangement shown, as one example, a handle 118 is connected to an end of the arm 116. Handle 118 is formed of any suitable size, shape and design and is configured to provide a convenient and comfortable and functional grip for a user to grasp while operating the actuating mechanism 22. In the arrangement shown, as one example, the end of arm 116 opposite handle 118 is connected to locking mechanism 24.

In the arrangement shown, as one example, an end of arm 116 connects to one of the posts 90 of locking mechanism 24. In the arrangement shown, as one example, the end of arm 116 connects by a fastener to the upper surface of the head 92 of one of the outward-positioned posts 90 of locking mechanism 24, however any other arrangement or configuration is hereby contemplated for use.

In this way, the outward end, or end having handle 118 attached thereto, of arm 116 serves as a lever and provides leverage over locking mechanism 24 that facilitates the easy and comfortable operation of locking mechanism 24. The outward end of arm 116 rotates around the axis of rotation established by the post 90 that the inward end of arm 116 is connected to. As such, as the outward end of arm 116 is rotated, this rotation causes post 90 at the inward end of arm 116 to similarly rotate.

In the arrangement shown, as one example, the upper end of post 90 includes a tab 120 that connects to linkage 122 by fastener 124. Tab 120 is formed of any suitable size, shape and design and is configured to connect post 90 with linkage 122 so as to facilitate the transfer of movement and/or rotation from one post 90 of the locking mechanism 24 to the other posts 90 of the locking mechanism 24. In the arrangement shown, as one example, tab 120 is a member that extends outward from the exterior surface of head 92 of post 90 in an approximate perpendicular alignment to the axis of rotation of post 90. In the arrangement shown, as one example, the outward end of tab 120 includes an opening that receives fastener 124 that extends through and connects tab 120 and post 90 to linkage 122.

Linkage 122 is formed of any suitable size, shape and design and is configured to extend between and connect the plurality of posts 90 of locking mechanism 24 so as to facilitate the simultaneous and precise transfer of movement and/or rotation from one post 90 of the locking mechanism 24 to the other posts 90 of the locking mechanism 24. In the arrangement shown, as one example, linkage 122 is formed of an elongated bar that extends across and connects to the tabs 120 of all posts 90. In the arrangement shown, as one example, linkage 122 includes slots 126 therein that receive the outward ends of tabs 120 therein. In the arrangement shown, as one example, linkage 122 includes an opening that receives fastener 124 that extends through and connects tab 120 and post 90 to linkage 122.

In the arrangement shown, as one example, locking mechanism 24 includes three sets of posts 90, heads 92, pinions 94, racks 96, stops 98, and engagement members 102, one set positioned at the approximate middle of socket plate 20 and one set positioned at each outward end 85 of socket plate 20. In the arrangement shown, as one example, arm 116 of actuating mechanism 22 connects to an outward-positioned post 90. In the arrangement shown, as one example, linkage 122 connects at its outward ends to the outward positioned posts 90, and at its approximate middle to the middle-positioned post 90.

In this arrangement, as the handle 118 or outward end of arm 116 is rotated from a disengaged position to an engaged position, the inward end of arm 116, which is connected to a post 90, rotates around the axis of rotation of the post 90 which simultaneously causes rotation of the post 90. As the post 90 that is connected to arm 116 rotates, this rotation causes tab 120 to simultaneously rotate. As tab 120 rotates, this causes linkage 122 to simultaneously move through the connection of tab 120 to linkage 122 by fastener 124. As linkage 122 moves, linkage 122 causes the other posts 90 connected to linkage 122 to simultaneously move in a similar manner. In this way, the connection of linkage 122 to all posts 90 causes all posts 90 to simultaneously move. As all posts 90 simultaneously rotate, this causes the pinions 94 which are connected to posts 90 to simultaneously rotate. As the pinions 94 simultaneously rotate, this causes the racks 96 to simultaneously move laterally. As racks 96 simultaneously move laterally, this causes engagement members 102 to simultaneously move laterally within slots 114 in socket plate 20. As engagement members 102 simultaneously move laterally within slots 114 in socket plate 20, the angled surfaces 110 of flanges 108 of arms 106 simultaneously engage bearings 112 of top stiffener 38 thereby sliding over bearings 112 while pulling top stiffener 38 toward socket plate 20. This movement continues until the angled surfaces 110 of flanges 108 of arms 106 pass the bearings 112 of top stiffener 38 and the bearings 112 of top stiffener 38 are received in the flat or slightly recessed or detent area rearward of the angled surfaces 110 of flanges 108 of arms 106 at which point the locking mechanism 24 is in a fully engaged position and the top stiffener 38 is fully pulled toward socket plate 20.

In the arrangement shown, as one example, when top stiffener 38 is in a fully engaged position, the electrical testing components 26 are locked in place and an electrical connection is formed between DUT PCB 14 and electrical testing components 26.

Electrical Testing Components:

In the arrangement shown, as one example, system 10 includes electrical testing components 26. Electrical testing components 26 are formed of any suitable size, shape and design and are configured to facilitate testing of test socket 12 and/or DUT PCB 14. In the arrangement shown, as one example, electrical testing components 26 include card assemblies 28 having motherboards 30, sockets 32 and electrical testing boards 34, among other components and features.

Card Assemblies: In the arrangement shown, as one example, electrical testing components 26 are separated into a plurality of card assemblies 28. Card assemblies 28 are formed of any suitable size, shape and design and are configured to be formed of a portion of the electrical testing components 26 that are connected and packaged in a high density and efficient manner that is easily assembled and installed and that facilitates the functionality of the module 16.

In the arrangement shown, as one example, two card assemblies 28 are shown in use with each socket plate 20 and module 16. However, any number of card assemblies 28 are hereby contemplated for use with each socket plate 20 and module 16 such as one, two, three, four, five, six, seven, eight, nine, ten or more. In the arrangement shown, as one example, each card assembly 28 includes a motherboard 30, a plurality of sockets 32, a plurality of electrical testing boards 34 and a plurality of capsules 36, among other components and features.

Motherboards: In the arrangement shown, as one example, card assemblies 28 include a motherboard 30. Motherboard 30 is formed of any suitable size, shape and design and is configured to electrically connect and hold together a subset of the sockets 32, electrical testing boards 34 and capsules 36 that form the electrical testing components 26.

In the arrangement shown, as one example, motherboard 30 is a generally flat and planar member that is generally square or rectangular in shape when viewed from above or below, however any other shape is hereby contemplated for use. In the arrangement shown, as one example, motherboard 30 is what is known as a printed circuit board. In the arrangement shown, as one example, motherboard 30 has electrical contacts in its upper surface 128 as well as electrical contacts in its lower surface 130. These electrical contacts in the upper surface 128 extend through the layers of material that form motherboard 30 and electrically connect to the electrical contacts in the lower surface 130. These electrical contacts are configured to facilitate electrical connection of electrical components to the upper surface 128 of motherboard 30 as well as to facilitate electrical connection of electrical components to the lower surface 130 of motherboard 30. Said another way, motherboard 30 facilitates the electrical connection of electrical components connected to the upper surface 128 and lower surface 130 of motherboard 30. In the arrangement shown, capsules 36 are connected to the upper surface 128 of motherboard 30 and sockets 32 are connected to the lower surface 130 of motherboard 30.

Sockets: In the arrangement shown, as one example, card assemblies 28 include a plurality of sockets 32. Sockets 32 are formed of any suitable size, shape and design and are configured to mechanically and electrically connect to the lower surface 130 of motherboard 30 as well as mechanically and electrically connect and hold electrical testing boards 34 therein.

In the arrangement shown, as one example, a plurality of sockets 32 are connected to the lower surface 130 of motherboard 30 in approximate parallel spaced alignment to one another. Sockets 32 are configured to mechanically connect to the lower surface 130 of motherboard 30 as well as electrically connect to the electrical contacts in the lower surface 130 of motherboard 30. In the arrangement shown, as one example, sockets 32 are configured to receive the upper end of electrical testing boards 34. Sockets 32 form a mechanical connection as well as an electrical connection to electrical testing boards 34. In this way, when the upper end of electrical testing boards 34 are received within sockets 32, sockets 32 serve to electrically connect electrical testing boards 34 to motherboard 30.

In the arrangement shown, as one example, capsules 36 are connected to the upper surface 128 of motherboard 30.

Capsule:

In the arrangement shown, as one example, electrical testing components 26 include a plurality of capsules 36. Capsules 36 are formed of any suitable size, shape and design and are configured to facilitate the electrical connection between motherboard 30 and DUT PCB 14 while facilitating the easy installation and removal of DUT PCB 14 onto module 16.

In the arrangement shown, as one example, capsules 36 include a plurality of compressible electrical contacts 132 in its upward facing surface that extend upward therefrom and/or in its downward facing surface that extend downward therefrom. Alternatively, the downward facing surface of capsules 36 include contact fields or sockets that are used to make electrical connections (instead of spring loaded or compressible electrical contacts 132). These compressible electrical contacts 132 are electrically connected to an electrical testing board 34 at their lower end, and are electrically connected to the DUT PCB 14 at their upper end, as is further described herein. In this way capsules 36 serve as an electrical interconnect between motherboard 30 and DUT PCB 14.

In the arrangement shown, as one example, capsules 36 are generally rectangular in shape when viewed from above, below, the side or an end, and have generally planar upper surface and lower surfaces which oppose one another in approximate parallel spaced relation. In the arrangement shown, as one example, capsules 36 are formed of a pair of opposing halves 134 that connect together in generally flush engagement with one another along a centrally extending seam line between the two halves 134 when they are assembled. In the arrangement shown, as one example, halves 134 are held together by a plurality of fasteners 136, however any other manner of connection is hereby contemplated for use.

In the arrangement shown, as one example, compressible electrical contacts 132 are known in the industry as pogo pins. A Pogo pin is a device used in electronics to establish a (usually temporary) connection between two printed circuit boards. Named by analogy with the pogo stick toy, the pogo pin usually takes the form of a slender cylinder containing two sharp, spring-loaded pins. Pressed between two electronic circuits, the sharp points at each end of the pogo pin make secure contacts with the two circuits and thereby connect them together. In the arrangement shown, as one example, compressible electrical contacts 132 extend out of both the upper surface as well as the lower surface of capsule 36. In this way, the upper end of compressible electrical contacts 132 of capsules 36 are configured to electrically connect to the electrical contacts in the lower surface of DUT PCB 14, and the lower end of compressible electrical contacts 132 of capsules 36 are configured to electrically connect to the electrical contacts in the upper surface 128 of motherboard 30 while the compressible and forgiving nature of compressible electrical contacts 132 accommodates any variation between components.

In the arrangement shown, as one example, one or more alignment pins 138 are positioned between opposing halves 134 and is configured to facilitate precise alignment of opposing halves 134 during installation. Once capsules 36 are assembled, capsules 36 are installed onto the upper surface 128 of motherboard 30 using fasteners 140.

Assembly & Installation: In the arrangement shown, as one example, once card assemblies 28 are assembled, with each card assembly 28 having a single motherboard 30 having a plurality of sockets 32 connected to its lower surface 130 with an electrical testing board 34 positioned within each socket 32, the card assemblies 28 are installed onto housing 18 and socket plate 20. In doing so, the lower end of each electrical testing board 34 is aligned with a corresponding socket 84 in socket plate 20. Once the lower ends of electrical testing boards 34 are properly aligned in this manner, the card assembly 28 is lowered onto housing 18 and socket plate 20 until the lower surface 130 of motherboard 30 engages the upper surface of socket plate 20. In doing so, care is taken to align motherboard 30 appropriately with alignment pins 88 so as to ensure proper and precise alignment.

Capsules 36 are installed onto the upper surface 128 of motherboard 30 using fasteners 140 that extend through capsules 36 as well as through motherboard 30. The lower end of fasteners 140 thread into socket plate 20 and in doing so, as fasteners 140 are tightened, fasteners 140 pull capsules 36 into tight engagement with motherboard 30 and fasteners pull motherboard 30 into tight engagement with socket plate 20.

Capsules 36 are installed across the upper surface 128 of motherboard 30 in approximate parallel spaced relation with each capsule 36 positioned above a pair of sockets 32 and corresponding electrical testing boards 34. Once capsules 36 are installed onto the upper surface 128 of motherboard 30, top stiffener 38 is installed over card assemblies 28 and capsules 36.

Top Stiffener:

In the arrangement shown, as one example, modules 16 of testing system 10 include a top stiffener 38. Top stiffener 38 is formed of any suitable size, shape and design and is configured to connect to the lower surface of DUT PCB 14 and provide strength and rigidity to DUT PCB as well as facilitate the connection of DUT PCB 14 to socket plate 20.

In the arrangement shown, as one example, top stiffener 38 is a generally planar member having a generally flat upper surface 142 and a generally flat lower surface 144 that extend in approximate parallel planar spaced relation to one another. In the arrangement shown, as one example, top stiffener 38 extends a width between opposing sides 146 that extend in approximate parallel spaced relation to one another. In the arrangement shown, as one example, top stiffener 38 extends a length between opposing ends 148 that extend in approximate parallel spaced relation to one another. In the arrangement shown, as one example, sides 146 and ends 148 extend in approximate perpendicular alignment to one another thereby forming a generally square or rectangular member when viewed from above or below. In the arrangement shown, as one example, upper surface 142 and opposing lower surface 144 and sides 146 extend in approximate perpendicular alignment to one another thereby forming a generally square or rectangular member when viewed from a side 146. In the arrangement shown, as one example, upper surface 142 and opposing lower surface 144 and ends 148 extend in approximate perpendicular alignment to one another thereby forming a generally square or rectangular member when viewed from an end 148.

Sockets: In the arrangement shown, as one example, top stiffener 38 includes a plurality of sockets 150. Sockets 150 are formed of any suitable size, shape and design and are configured to receive capsules 36 connected to the upper surface 128 of motherboard 30 therein. This arrangement of sockets 150 and capsules 36 allows top stiffener 38 to be placed on top of the upper surface of socket plate 20 having card assemblies 28 installed thereon with capsules 36 installed on the upper surface of motherboards 30. Sockets 150 also serve to allow the upper surface of capsules 36 to engage the lower surface of DUT PCB 14 so as to facilitate electrical connection between capsules 36 and DUT PCB 14.

In the arrangement shown, as one example, when viewed from above or below, sockets 150 are generally elongated square or rectangular openings that extend through top stiffener 38 from upper surface 142 to lower surface 144. A plurality of sockets 150 extend in generally parallel spaced relation to one another along the end 148 to end 148 length of top stiffener 38 with the length of each socket 150 extending across the side 146 to side 146 width of top stiffener 38. These sockets 150 are sized and shaped to receive capsules 36 therein while allowing capsules 36 to electrically connect to motherboard 30 on their lower side as well as electrically connect to DUT PCB 14 at their upper side.

Slots: In the arrangement shown, as one example, top stiffener 38 also includes a plurality of slots 152. Slots 152 are formed of any suitable size, shape and design and are configured to receive the upper end of arms 106 of engagement members 102 of rack 96 of locking mechanism 24 so as to facilitate locking of top stiffener 38 and its attached DUT PCT 14 to socket plate 20.

In the arrangement shown, as one example, when viewed from above or below, slots 152 are generally elongated square or rectangular openings that extend through top stiffener 38 from upper surface 142 to lower surface 144 and are positioned in alignment with the upper ends of arms 106 of engagement members 102 of rack 96 of locking mechanism 24 such that when top stiffener 38 is placed on top of socket plate 20, the upper end of arms 106 of engagement members 102 are received within slots 152.

In the arrangement shown, as one example, a bearing 112 extends laterally across slots 152. Bearings 112 are formed of any suitable size, shape and design and are configured to be engaged by the upper ends of arms 106 of engagement member 102 so as to facilitate locking of top stiffener 38 to socket plate 20. In the arrangement shown, as one example, bearing 112 is a rotatable bearing that rotates around a shaft or axle that extends across the slot 152 and in this configuration bearing 112 extending across slot 152 has been tested with success and provides smooth and consistent operation when engagement member 102 moves between a disengaged position to an engaged position, as well as when engagement member 102 moves between an engaged position to a disengaged position. The upper surface 142 of top stiffener 38 is connected to the lower surface of DUT PCB 14 by a plurality of fasteners that extend through DUT PCB 14 and into the material of top stiffener 38 thereby securing the DUT PCB 14 to top stiffener 38.

In one arrangement, when installing DUT PCB 14 upon top stiffener 38, care is taken to align the alignment holes or alignment features in DUT PCB 14 with the alignment pins 88 that extend upward from the upper surface 76 of socket plate 20 and/or with alignment pins 88 that extend upward from the upper surface 42 of top stiffener 38. Alignment of DUT PCB 14 with alignment pins 88 provides quick, easy and precise alignment of DUT PCB 14, top stiffener 38 and/or socket plate 20.

DUT PCB:

In the arrangement shown, as one example, testing system 10 includes DUT PCB 14. DUT PCB 14 is formed of any suitable size, shape and design and is configured to connect at its lower surface 156 to the upper surface 142 of top stiffener 38 and is configured to receive one or more test sockets 12 in its upper surface. DUT PCB 14 is also configured to facilitate electrical connection between test socket(s) 12 and the electrical testing components 26 of module 16.

In the arrangement shown, as one example, DUT PCB 14 is a generally flat and planar member that is generally square or rectangular in shape when viewed from above or below, however any other shape is hereby contemplated for use. In the arrangement shown, as one example, DUT PCB 14 is what is known as a printed circuit board. In the arrangement shown, as one example, DUT PCB 14 has electrical contacts 154 in its lower surface 156 that are configured to be engaged by and electrically connected to compressible electrical contacts 132 of capsules 36 when DUT PCB 14 and top stiffener 38 are placed on top of socket plate 20. As such, in the arrangement shown, electrical contacts 154 in lower surface 156 of DUT PCB 14 are arranged in contact fields that match the size, shape and placement of the compressible electrical contacts 132 of capsules 36.

These electrical contacts 154 in the lower surface 156 of DUT PCB 14 extend through the layers of material that form DUT PCB 14 and electrically connect to the electrical contacts in the upper surface 158 of DUT PCB 14 that electrically connect to compressible electrical contacts 160 of test socket 12. These electrical contacts are configured to facilitate electrical connection of electrical components to the upper surface 158 of DUT PCB 14 as well as to facilitate electrical connection of electrical components to the lower surface 156 of DUT PCB 14. Said another way, DUT PCB 14 facilitates the electrical connection of electrical components connected to the upper surface 158 and lower surface 156 of DUT PCB 14. In the arrangement shown, capsules 36 are electrically connected to the lower surface 156 of DUT PCB 14 and test socket(s) 12 are electrically connected to the upper surface 158 of DUT PCB 14.

Test Socket Electrical Interconnect:

In the arrangement shown, as one example, testing system 10 includes at least one test socket 12, which may also be referred to as an electrical interconnect herein. Test socket 12 is formed of any suitable size, shape and design and is configured to connect at its lower surface to the upper surface of DUT PCB 14 and is configured to receive a device under test 162 (DUT 162), such as a semiconductor chip, a reference chip, a shorting device, a reference standard or the like or any other form of a device simulator.

However, the disclosure herein is not limited to testing test sockets 12 only. Instead, the disclosure is applicable to testing any device or system that forms an electrical connection or an electrical interconnect.

Generally, test socket 12 will be specifically sized and shaped to receive a particular matched DUT 162 within close and tight tolerances and in mating engagement such that when DUT 162 is placed within test socket 12 a strong and secure mechanical connection as well as electrical connection between DUT 162 and test socket 12 is created. In the arrangement shown, as one example, test socket 12 is specifically sized and shaped to receive a particular matched DUT 162 within close and tight tolerances and in mating engagement such that when the particular DUT 162 is placed within test socket 12, DUT 162 is precisely held in place while facilitating a strong and secure mechanical connection as well as electrical connection between DUT 162 and test socket 12.

In the arrangement shown, as one example, test socket 12 includes a raised peripheral edge 164 which surrounds and provides a border to a field of compressible electrical contacts 160 positioned within the border formed by raised peripheral edge 164 approximately at the center of the test socket 12. However, any other size, shape and arrangement is hereby contemplated for use as test socket 12.

In the arrangement shown, as one example, test socket 12 is affixed to the upper surface 158 of DUT PCB 14 using a plurality of fasteners 166 that extend through raised peripheral edge 164 and into DUT PCB 14. In the arrangement shown, as one example, test socket 12 is attached to DUT PCB 14 at the approximate middle of DUT PCB 14 between opposing sets of electrical contacts 154 that extend along the sides of DUT PCB 14.

Test socket 12 includes a plurality compressible electrical contacts 160 positioned at its approximate center within the border formed by raised peripheral edge 164. These compressible electrical contacts 160 may be similar if not identical to compressible electrical contacts 132 used in capsules 36, as is described herein, and as such reference is made to that portion of this disclosure which is applied to test socket 12. That is, in one arrangement compressible electrical contacts 160 are known in the industry as pogo pins. In the arrangement shown, as one example, compressible electrical contacts 160 extend out of both the upper surface as well as the lower surface of test socket 12. In this way, the upper end of compressible electrical contacts 160 of test socket 12 are configured to electrically connect to electrical contacts in the lower surface of DUT 162, and the lower end of compressible electrical contacts 160 of test socket 12 are configured to electrically connect to the electrical contacts in the upper surface of DUT PCB 14 while the compressible and forgiving nature of compressible electrical contacts 160 accommodates any variation between components and thereby provides a strong and secure electrical connection.

When test socket 12 is secured to DUT PCB 14 the compressible electrical contacts 160 of test socket 12 electrically connect to the electrical contacts points on the upper surface 158 of DUT PCB 14 which electrically connect to electrical traces or leads that extend through DUT PCB 14 and electrically connect to the electrical contacts 154 positioned in the lower surface 156 of DUT PCB 14 at the outward sides of DUT PCB 14 which connect to the compressible electrical contacts 132 of capsules 36 which connect to sockets 32 which connect to electrical testing boards 34. In this way, DUT PCB 14 serves to electrically connect test socket 12, and any DUT 162 positioned within test socket 12, to the electrical testing components 26 (capsules 36, sockets 32, electrical testing boards 34, motherboards 30) positioned below the DUT PCB 14. As such, when DUT PCB 14 is placed on top of testing system 10, the compressible electrical contacts 160 of test socket 12 electrically connect through DUT PCB 14 to the electrical testing components 26.

In a manufacturing environment, DUT 162 is often a sophisticated semiconductor chip that provides sophisticated functionality and capabilities in a tremendously compact size. However, in a testing environment, wherein test socket 12 is being tested, DUT 162 is often a shorting device or a reference standard that is configured to provide a known result, such as a known resistance. Often, when DUT 162 is a shorting device it is a solid metallic or plated metallic device that has a generally well-known resistance which is suitable for testing purposes. Often, DUT 162 is a reference standard that mimics a certain condition or provides an anticipated result that is useful for testing purposes.

DUT 162 often has a very high density of electrical contacts in its lower surface (often referred to as a ball grid array or the like) that electrically connect the DUT 162 to the device DUT 162 is installed onto (such as a computer's motherboard, or the like). Accordingly, to test all of the electrical contacts DUT 162 has in its lower surface, test socket 12 has a corresponding number of compressible electrical contacts 160 that protrude upward from its upper surface.

Testing system 10 is configured to perform complex and sophisticated testing procedures on DUT 162 which require sophisticated and complex electrical testing components 26 (as are described herein) that preform complex tasks (such as contact resistance, leakage, performance testing, etc.). DUT PCB 14 serves to connect the dense electrical contacts in the lower surface of DUT 162 to the electrical testing components 26 of the system 10 through a network of electrical traces embedded within the DUT PCB 14. As such, through its network of internal electrical leads (or traces) DUT PCB 14 expands the dense concentration of electrical connection points in the lower surface of DUT 162 outward and to the sides of DUT PCB 14 so as to provide room for the electrical testing components 26 needed to perform the electrical tests to ensure DUT 162 and/or test socket 12 is a conforming device and within spec. As such, through its network or electrical traces that expand outward from test socket 12, DUT PCB 14 serves to provide additional room for the needed electrical testing components 26 of system 10. While system 10 houses the electrical testing components 26 in a very dense arrangement, the surface area required for the electrical testing components 26 is substantially greater than the surface area of the electrical contacts in the DUT 162 and test socket 12.

Assembly:

To assemble the testing system 10, a DUT PCB 14 is selected for the particular test socket 12 that is being used and/or for the particular DUT 162 that is being manufactured and therefore needs to be tested.

The DUT PCB 14 will be different or custom for each different DUT 162 and/or test socket 12. This is because each DUT 162 has a unique array of electrical contacts in its lower surface which require a specific test socket 12 with compressible electrical contacts 160 corresponding to the unique array of electrical contacts for the particular DUT 162. Therefore, a specific DUT PCB 14 is also required to facilitate electrical connection with compressible electrical contacts 160 of test socket 12 for each DUT 162 and/or test socket 12.

While the electrical contacts in the upper surface 158 of the DUT PCB 14 are unique for each DUT 162 and/or test socket 12, the electrical contacts 154 in the lower surface 156 of DUT PCB 14 remain consistent. As such, countless DUTs 162 and/or test sockets 12 may be tested using the same test system 10 by simply removing and replacing the DUT PCB 14. This allows for removal and replacement of the DUT PCB 14 to be done with ease, which is an objective the system 10 accomplishes.

Once selected, the DUT PCB 14 is placed on top of the testing system 10. More specifically, the DUT PCB 14 is aligned with the alignment pins 88 that extend upward from the upper surface 76 of socket plate 20. Once properly aligned with alignment pins 88, the lower surface 156 of DUT PCB 14 is lowered toward the upper surface 76 of socket plate 20 until the electrical contacts 154 in the lower surface 156 of DUT PCB 14 are in electrical contact with the compressible electrical contacts 132 that protrude upward from the upper surface of capsules 36. In this position, the electrical contacts 154 in the lower surface 156 of DUT PCB 14 physically engage the compressible electrical contacts 132 of the capsules 36 which are held within the sockets 150 of top stiffener 38. In this way, the DUT PCB 14 is electrically connected to the electrical testing boards 34 of electrical testing components 26.

As the DUT PCB 14 is lowered onto and over socket plate 20 with the card assemblies 28 installed onto the socket plate 20, the capsules 36 are received within the sockets 150 in top stiffener 38. Simultaneously, as the DUT PCB 14 is lowered onto and over socket plate 20 with the card assemblies 28 installed onto the socket plate 20, the upper ends of arms 106 of engagement member 102 of rack 96 of locking mechanism 24 are received within the slots 152 of top stiffener 38. Once the DUT PCB 14 is lowered onto and over socket plate 20, and the upper ends of arms 106 of engagement member 102 of rack 96 of locking mechanism 24 are received within the slots 152 of top stiffener 38, the flanges 108 and angled surfaces 110 of engagement member 102 point toward (but are disengaged from) bearings 112 that extends across slots 152 of top stiffener 38.

Once in this position, with the flanges 108 and angled surfaces 110 of engagement member 102 pointing toward (but disengaged from) bearings 112 that extends across slots 152 of top stiffener 38, the top stiffener 38 is ready to be locked into place using locking mechanism 24. To lock top stiffener 38 in place over socket plate 20 and card assemblies 28, the actuating mechanism 22 is actuated.

In the arrangement shown, as one example, when actuating mechanism 22 is a manual lever having an arm 116 and handle 118, a user grasps the handle 118 and rotates it in a closing direction or an engagement direction. This rotation of the outward end of arm 116 causes the post 90 connected to the inward end of arm 116 to rotate in an engagement direction. As the post 90 connected to the inward end of arm 116 rotates, this causes the tab 120 that extends outward from head 92 to similarly rotate. As tab 120 rotates, this rotation is translated to linkage 122 through the connection of the outward end of tab 120 to linkage 122 by way of fastener 124. As such, as post 90 rotates and tab 120 moves, this causes linkage 122 to move laterally. As linkage 122 moves laterally, linkage 122 causes the other posts 90 that are connected to linkage 122 to simultaneously rotate. As such, as one post 90 rotates, all posts 90 rotate.

As the upper end of posts 90 rotate, so rotates the lower end of posts 90 which are positioned below the lower surface 78 of socket plate 20. As the lower end of posts 90 rotate, so rotates the pinion 94 connected to the lower end of posts 90. As pinions 94 rotate, the gear teeth of pinions 94 mesh with the gear teeth of racks 96 and as such, the rotational movement of pinions 94 cause lateral movement of racks 96. As racks 96 move laterally, this simultaneously cause engagement members 102 connected to the upper surface 104 of racks 96 to move laterally within slots 114 in socket plate 20 as well as within slots 152 of top stiffener 38.

As engagement members 102 move in a closing direction or an engagement direction, the upper end of arms 106 move toward bearings 112 that extend across slots 152 of top stiffener 38. As the upper end of arms 106 move toward bearings 112 the angled surface 110 of the lower side of flanges 108 at the upper end of arms 106 of engagement members 102 engage bearings 112 that extend across slots 152 of top stiffener 38. As the angled surface 110 of the lower side of flanges 108 at the upper end of arms 106 of engagement members 102 increasingly engage bearings 112 the angle of these angled surfaces 110 cause top stiffener 38 to be increasingly pulled downward toward socket plate 20. Notably, due to the engagement between top stiffener 38 and alignment pins 88 of socket plate 20, as engagement members 102 engage bearings 112 of top stiffener 38 the top stiffener 38 is prevented from laterally moving. However, due to the engagement between top stiffener 38 and alignment pins 88 of socket plate, as engagement members 102 engage bearings 112 of top stiffener 38 the top stiffener 38 is free to move vertically toward (and away) from socket plate 20.

As the angled surface 110 of the lower side of flanges 108 at the upper end of arms 106 of engagement members 102 engage bearings 112 these angled surfaces 110 slide or roll over bearings 112 extending across slots 152 in top stiffener 38. This lateral movement of engagement members 102 continue until the angled surface 110 of the lower side of flanges 108 at the upper end of arms 106 of engagement members 102 pass the bearings 112 at which point, top stiffener 38 is fully pulled down and toward socket plate 20. In this position, the bearings 112 that extend across slots 152 of top stiffener 38 are received by the flat or slightly recessed or detent surface in the lower surface of flanges 108 just rearward of the angled surface 110. At this point, the engagement members 102 are in a fully engaged position.

The opposite process is performed to move from the engaged position to the disengaged position.

A similar process is performed when a motorized actuating mechanism 22 is used, such as a motor, solenoid, hydraulic or pneumatic cylinder or other mechanism, that replaces arm 116 and handle 118 and facilitates rotation of posts 90.

When engagement members 102 are in a fully closed or fully engaged position, top stiffener 38 is fully pulled down and toward socket plate 20. This causes capsules 36 connected to the upper surface 128 of motherboard 30 to be received within sockets 150 of top stiffener 38 and causes the compressible electrical contacts 132 in the upper surface of capsules 36 to engage the electrical contacts 154 in the lower surface 156 of DUT PCB 14 thereby forming an electrical connection between electrical testing components 26 and DUT PCB 14.

Test socket 12 is installed onto DUT PCB 14 by precisely aligning the test socket 12 with the electrical contacts in the upper surface 158 of DUT PCB 14 such that the compressible electrical contacts 160 that extend outward from the lower surface of test socket 12 engage the electrical contacts in the upper surface 158 of DUT PCB 14. Once properly aligned, test socket 12 is affixed to DUT PCB 14 using fasteners 166. As test socket 12 is tightened against DUT PCB 14, the compressible electrical contacts 160 that extend outward from the lower surface of test socket 12 engage the electrical contacts in the upper surface 158 of DUT PCB 14, and slightly compress, and form a strong and durable electrical connection with DUT PCB 14. DUT PCB 14 facilitates the electrical connection between test socket 12 on its upper surface 158, with capsules 36 and electrical testing components 26 on its lower surface 156.

Once test socket 12 is installed onto DUT PCB 14, DUT 162 is installed into test socket 12. DUT 162 is installed into test socket 12 by precisely aligning DUT 162 with the test socket 12 and lowering the DUT 162 into the test socket 12 until the electrical contacts in the lower surface of the DUT 162 engage the compressible electrical contacts 160 of test socket 12. In one arrangement, DUT 162 may be pressed down into test socket 12 using a stepper 168 or other component to ensure a strong and durable electrical connection between DUT 162 and test socket 12.

Once the system 10 is fully assembled, and DUT 162 is in place within test socket 12, DUT 162 and/or test socket 12 may be tested by system 10 by transmitting electrical signals from the electrical testing components 26 through DUT PCB 14, through test socket 12 and through DUT 162.

More specifically, the electrical testing boards 34 send and receive electrical signals through the edge connectors of sockets 32. These signals then transmit through motherboard 30 and into the capsules 36. More specifically, the electrical signals pass through the compressible electrical contacts 132 of capsules 36 and into the contact fields of DUT PCB 14. These electrical signals travel through the DUT PCB 14 through a series of electrical traces within the layers of the DUT PCB 14 and into the test socket 12. These electrical signals then pass through the test socket 12 and into the DUT 162. These electrical signals travel through the DUT 162 and back to the electrical testing boards 34 through the same or a similar but reverse path; and the process repeats. The electric testing components 26 measure these signals and how the test socket 12 and/or DUT 162 act/react and thereby determine the operational characteristics of socket 12 and/or DUT 162 and determine whether socket 12 and/or DUT 162 is conforming or non-conforming.

Once the test is complete, socket 12 and/or DUT 162 is removed and another socket 12 and/or DUT 162 is installed and the process is repeated. Alternatively, the DUT PCB 14 is removed and replaced with a different DUT PCB 14 so as to facilitate testing another but different socket 12 and/or DUT 162.

In this way, various sockets 12 and/or DUTs 162 may be tested using system 10 by simply removing and replacing DUT PCB 14 which can quickly and easily be done.

Infinite Top Plane:

One of the substantial benefits of the system 10 is that the upper surface 158 of DUT PCB 14 is uninterrupted. Or, said another way, other than the test socket(s) 12 being installed onto the upper surface 158 of DUT PCB 14 the upper surface 158 of DUT PCB 14 is a completely flat plane that is unencumbered and has no upwardly protruding elements thereon. In addition, no additional elements are installed onto the upper surface 158 of DUT PCB 14 to lock the DUT PCB 14 onto socket plate 20. This infinite top plane or uninterrupted top plane of the upper surface 158 of DUT PCB 14 means that there is no interference and as such the system 10 can be used with practically any other equipment or machinery, such as pick and place machines, robots, handlers, environmental chambers, gantries, or the like or any other device, equipment or system. In the arrangement shown, as one example, only test socket 12 is attached to the upper surface 158 of DUT PCB 14.

Placement of Test Socket and/or DUT:

Another substantial benefit of an uninterrupted upper surface 158 of DUT PCB 14 is that one or more test sockets 12 and/or DUTs 162 may be placed at any location on upper surface 158 of DUT PCB 14. In other words, because upper surface 158 of DUT PCB 14 is a flat plane that is unencumbered, test socket 12s and/or DUTs 162 may be located at the center of upper surface 158 of DUT PCB 14, they may be located adjacent either side of DUT PCB 14, they may be located adjacent either end of DUT PCB 14, or any other location on upper surface 158 of DUT PCB 14. This allows for greater flexibility of the system 10 and more opportunities to efficiently use other equipment or machinery, such as pick and place machines, robots, handlers, environmental chambers, gantries, or any other device, equipment, or system, that may have limited maneuverability. Or, said another way, the infinite top plane of DUT PCB 14 allows system 10 to be used with practically any other equipment or machinery, such as pick and place machines, robots, handlers, environmental chambers, gantries, or any other device, equipment, or system.

Placement of Stiffener:

Another substantial benefit of the system 10 is that top stiffener 38 can connect to the lower surface of DUT PCB 14 at any location on the lower surface of DUT PCB 14. In other words, top stiffener 38 may connect to the lower surface of DUT PCT 14 at the center of the lower surface of DUT PCT 14, it may connect adjacent either side of DUT PCB 14, it may connect adjacent either end of DUT PCT 14, or any other position on the lower surface of DUT PCB 14 in order to provide strength and rigidity to DUT PCB 14 and facilitate connection of DUT PCB 14 to socket plate 20. This allows for greater flexibility in the size and shape of both DUT PCB 14 and top stiffener 38. Additionally, multiple top stiffeners 38 can connect to the lower surface of DUT PCB 14 at once because top stiffener 38 can connect to the lower surface of DUT PCB 14 at any location. This allows for multiple modules 16 to be connected to DUT PCB 14 at one time, which increases the benefit of the system 10 as described herein.

No Border:

One of the substantial benefits of the system 10 is that the upper surface 158 of DUT PCB 14 is practically not limited in size or shape. That is, because top stiffener 38 is attached to the lower surface 156 of DUT PCB 14 and then the combined DUT PCB 14 and top stiffener 38 is placed on top of socket plate 20, there is no border limiting the size or shape of DUT PCB 14. As such, users can develop DUT PCBs 14 that are of practically any size and shape. This is important because many different machines used in association with system 10 have varying requirements and limitations. Due to the flexible nature of the system 10, DUT PCBs 14 can be developed to suit whatever the user's needs are based on existing equipment and manufacturing requirements.

Modularity:

One of the substantial benefits of the system 10 is that the system is modular in nature. That is, coupled with or in association with the benefits mentioned above, the infinite top plane of DUT PCB 14 and the borderless top plane of DUT PCB 14, a testing system 10 can be formed out of any number of modules 16 which may be placed in any alignment and arrangement. That is, a testing system 10 may be formed of one, two, three, four, five, six, seven, eight, nine, ten or more modules 16 all of which may be electrically connected to the same DUT PCB 14 or to different DUT PCBs 14 or to multiple DUT PCBs 14. The number of modules 16 needed is dependent on the pin density of the test socket 12. In one arrangement, a single module 16 has the capability of testing up to 8,064 pins, which is substantially higher than any other similar testing solution presently available on the market. As such, by combining two modules 16 up to 2×8,064=16,128 pins can be tested; by combining three modules 16 up to 3×8,064=24,192 pins can be tested; by combining four modules 16 up to 4×8,064=32,256 pins can be tested; and so on. This provides never before met testing capability and higher pin density. The configuration of the modules 16 may be chosen based upon space requirements, board design, mechanical requirements of other machines, etc.

Figure 21:
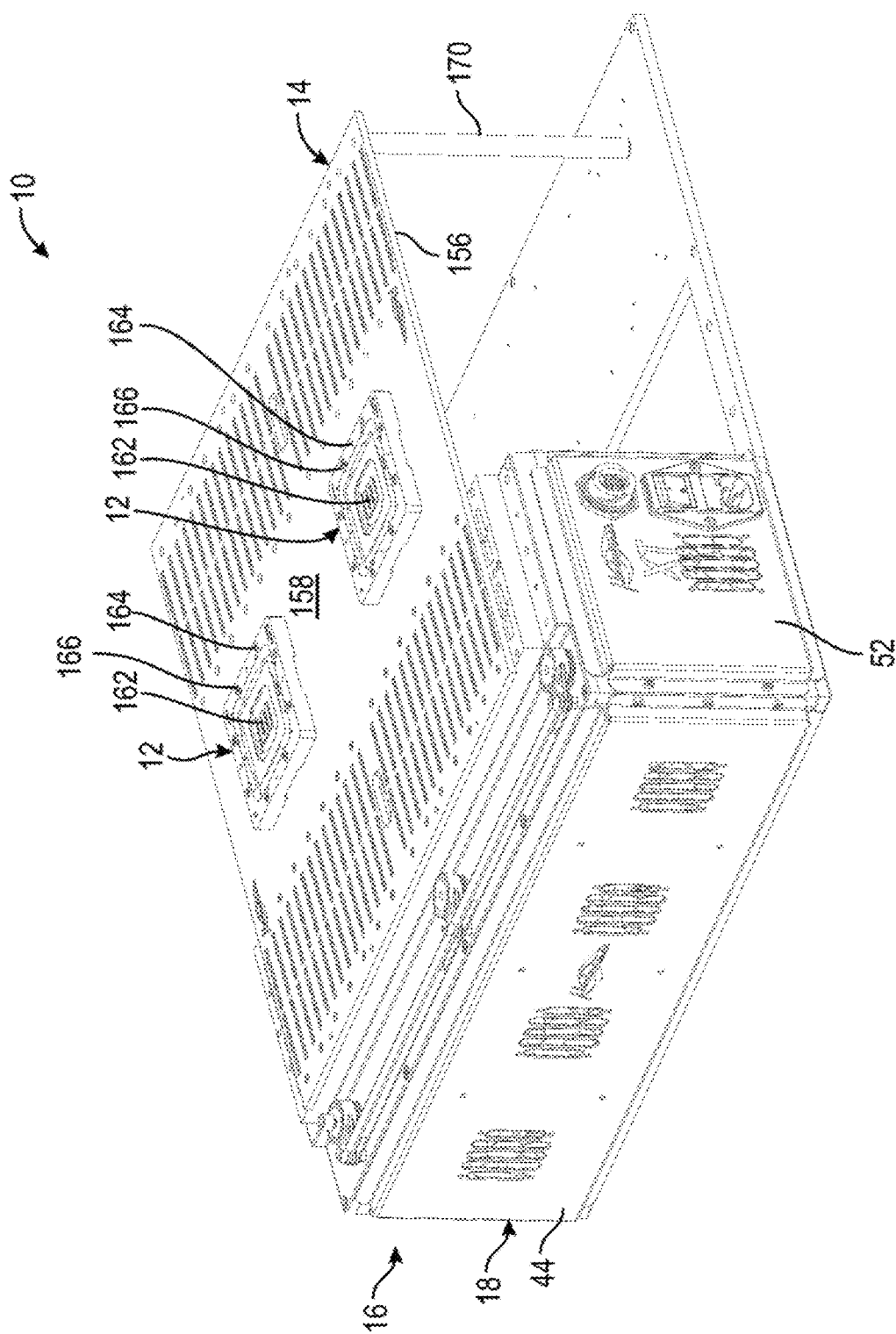
FIG. 21 is a perspective view of a test system, the view showing a module connected to a DUT PCB with two test sockets connected to the DUT PCB and a DUT connected to each test socket, the view showing a pedestal supporting one side of the DUT PCB.
Figure 22:
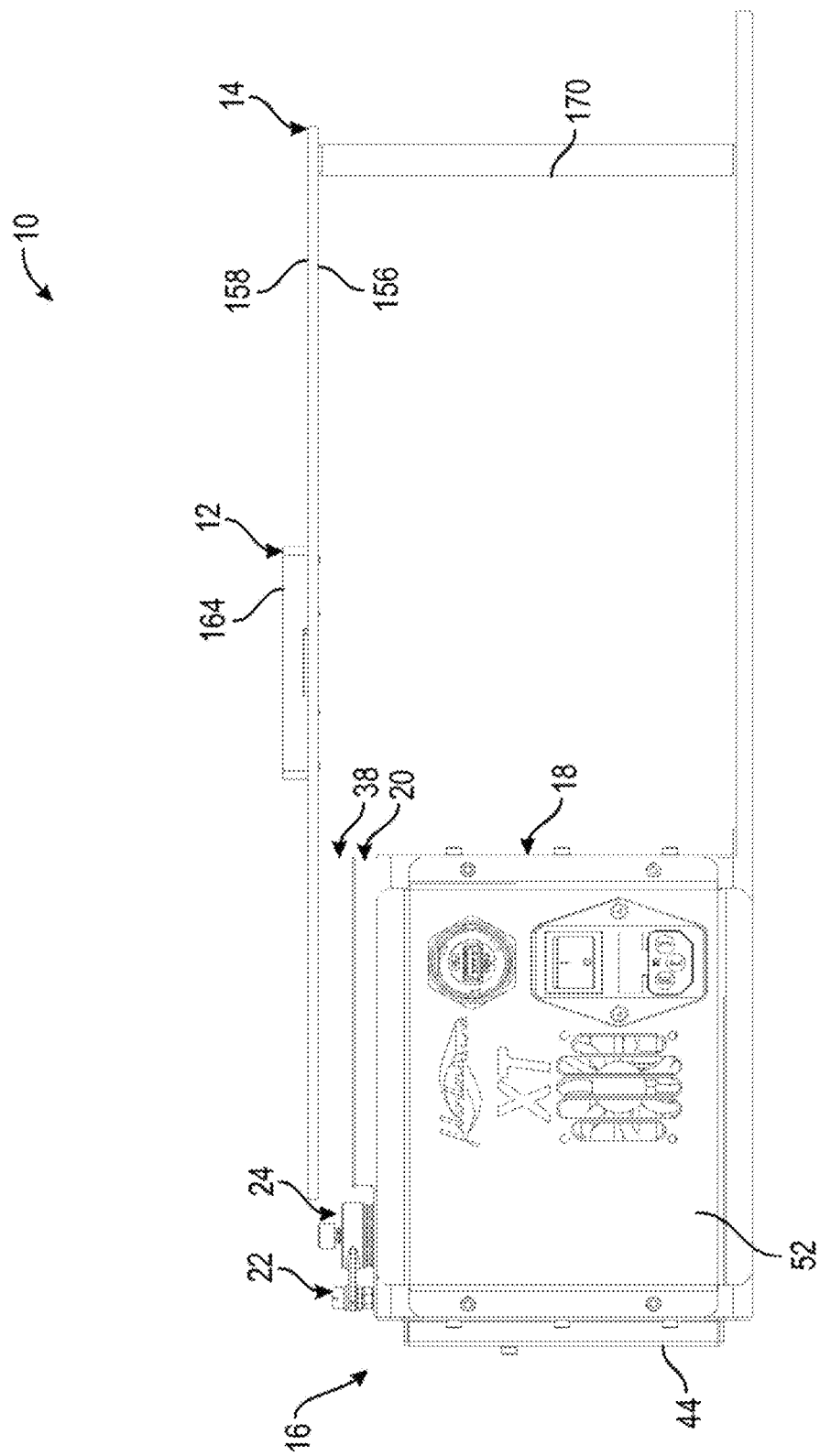
FIG. 22 is an end elevation view of the test system of FIG. 21.

As one example of this modularity, with reference to FIGS. 21 and 22, a testing system 10 is presented that is formed of a single module 16 having a single DUT PCB 14 attached thereto with two test sockets 12 attached to the DUT PCB 14. In this arrangement, the module 16 is connected to one side of DUT PCB 14 with the opposite side of DUT PCB 14 supported by a pedestal 170.

As another example, with reference to FIGS. 23, 24, 25, 26, 27 and 28, a testing system 10 is presented that is formed of a pair of modules 16 having a single DUT PCB 14 attached thereto with a single test sockets 12 attached to the DUT PCB 14. In this arrangement, the modules 16 are connected to opposing sides of DUT PCB 14 with a pedestal 170 placed between the modules 16 and under the DUT PCB 14.

System 10 can essentially take on any form with any number of modules 16. Examples include:

One module 16 positioned on one side of DUT PCB 14.
Two modules 16, one positioned on opposing sides of the DUT PCB 14.
Two modules 16, both positioned on one side of the DUT PCB 14 in a lengthwise arrangement.
Two modules 16, both positioned on one side of the DUT PCB 14 in a side-by-side parallel arrangement.
Two modules 16, one positioned on one side and the other positioned on an adjacent side of the DUT PCB 14, such as an L-shape.
Three modules 16, all positioned on one side of the DUT PCB 14 in a lengthwise arrangement.
Three modules 16, all positioned on one side of the DUT PCB 14 in a side-by-side parallel arrangement.
Three modules 16, positioned in a C-shape around the DUT PCB 14.
Four modules 16, all positioned on one side of the DUT PCB 14 in a lengthwise arrangement.
Four modules 16, all positioned on one side of the DUT PCB 14 in a side-by-side parallel arrangement.
Four modules 16, positioned in a square-shape around the DUT PCB 14. Any other shape or configuration of modules 16 is hereby contemplated for use.

Self-Contained Socket Plate:

One of the substantial benefits of the system 10 is that the socket plate 20 is self-contained meaning that the actuating mechanism 22 and locking mechanism 24 is fully attached to and contained in the socket plate 20. As such, the height and dimensions of housing 18 can change without affecting the manner in which the DUT PCB 14 attaches to the system 10.

Figure 26:
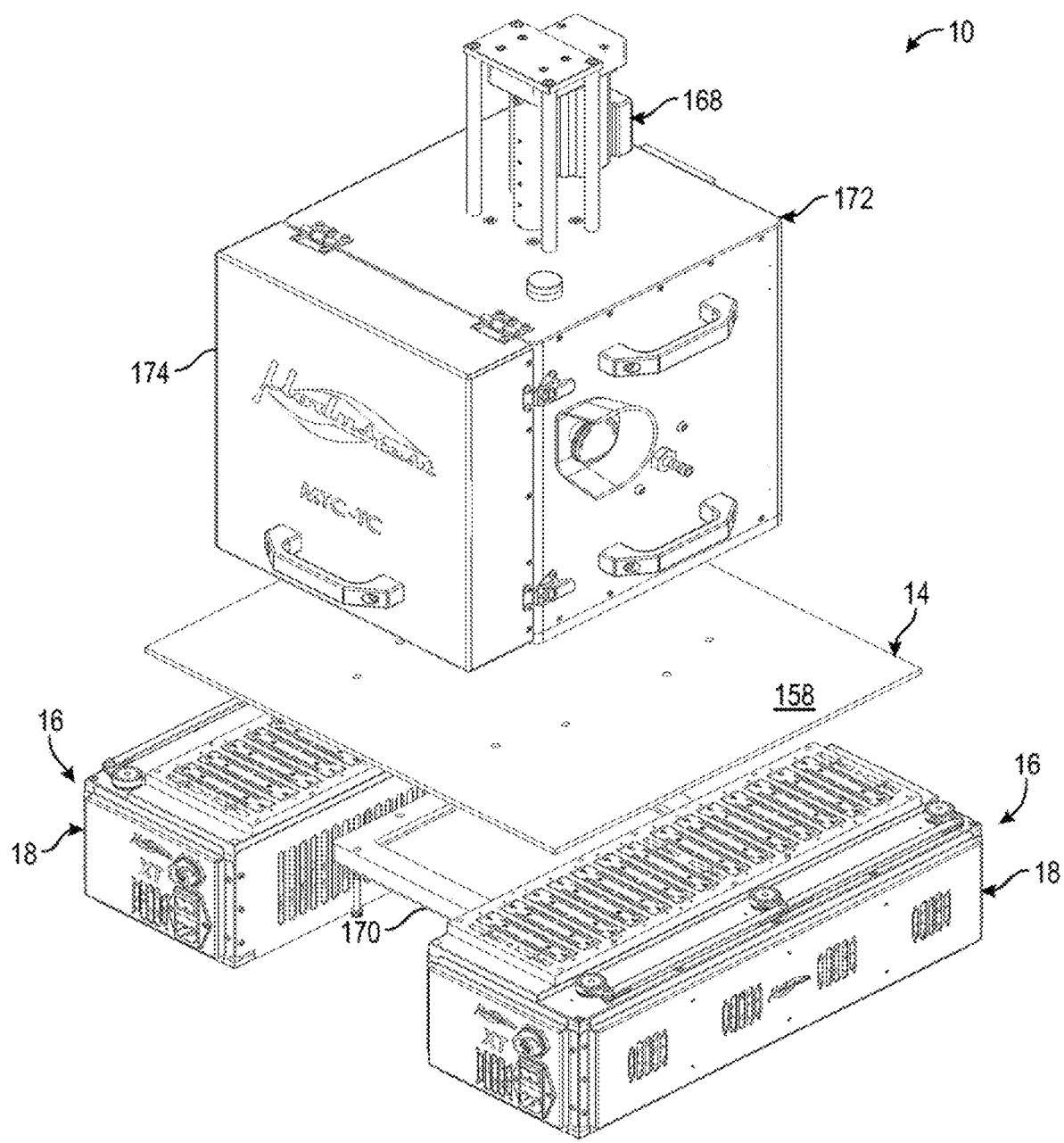
FIG. 26 is a perspective view of a test system, the view showing two modules each connected to one side of a pedestal, the view also shows a DUT PCB disconnected from the modules, the view also showing an environmental chamber disconnected from the DUT PCB with a stepper connected to the environmental chamber.
Figure 27:
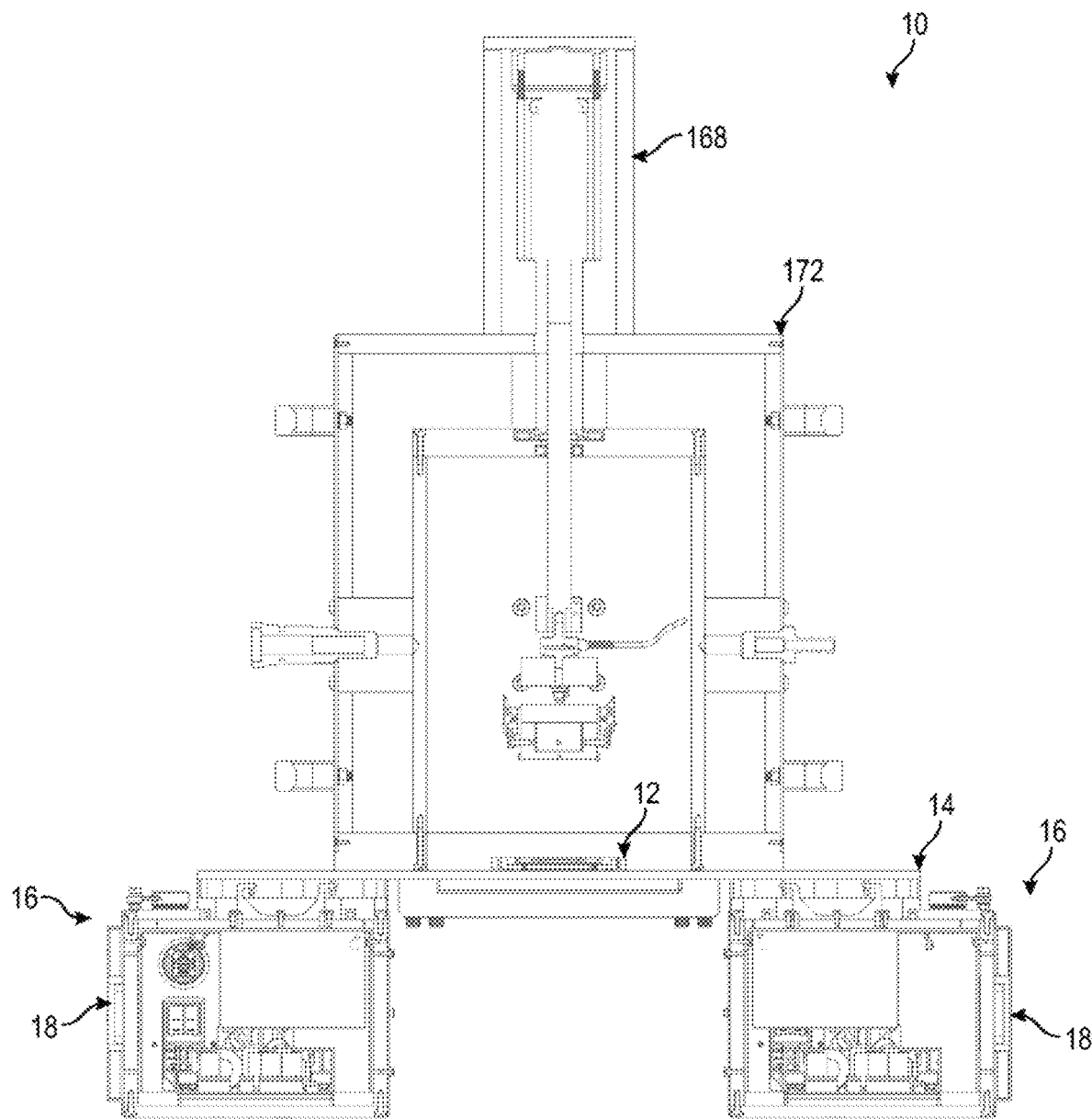
FIG. 27 is a cut-away end elevation view of the testing system, the view showing two modules each connected to a side of a DUT PCB with a test socket and an environmental chamber connected to the DUT PCB, the view also showing the interior of the environmental chamber with the stepper shown protruding through the top of the environmental chamber and down towards the test socket on the DUT PCB, the view also showing electrical testing boards within each module.
Figure 28:
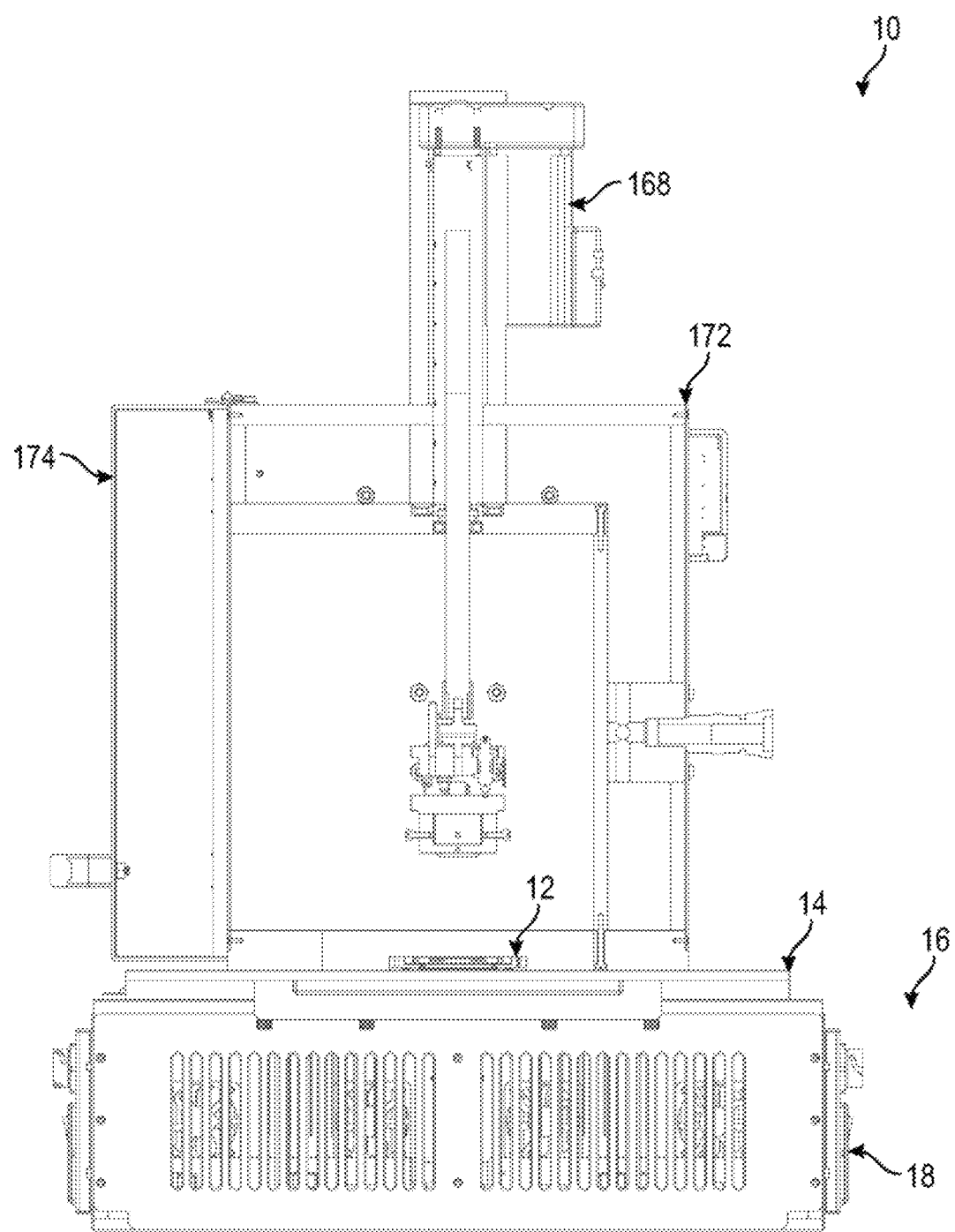
FIG. 28 is a partial cut-away side elevation view of the testing system, the view showing a module, the view also showing a DUT PCB connected to the module and a test socket and an environmental chamber connected to the DUT PCB, the view showing the environmental chamber cut-away at the side making the interior viewable, the view also showing a stepper protruding through the top of the environmental chamber and down towards the test socket on the DUT PCB.
Figure 29:
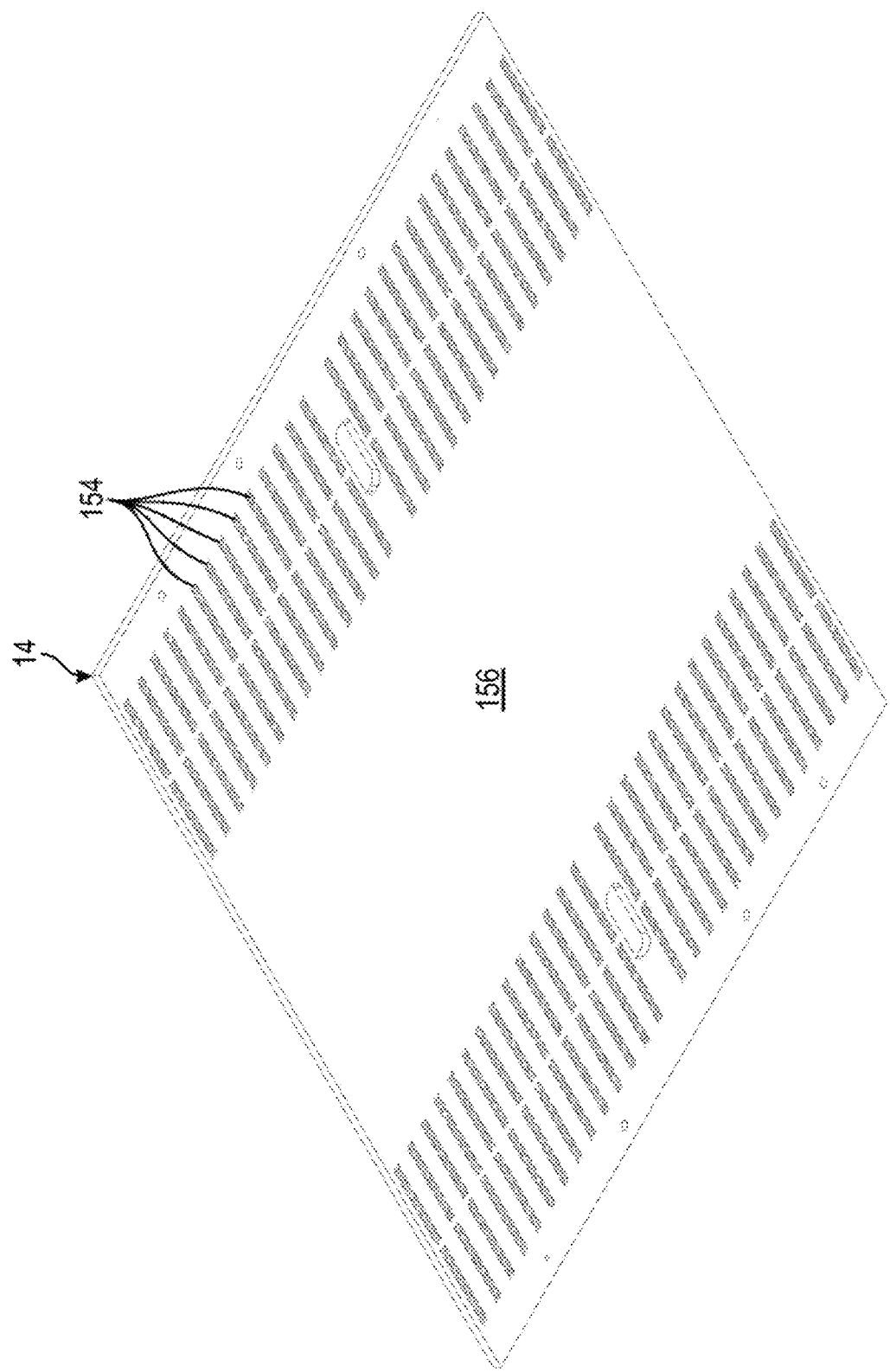
FIG. 29 is a perspective view of a DUT PCB, the view showing the lower surface of the DUT PCB with electrical contacts on the lower surface.
Figure 30:
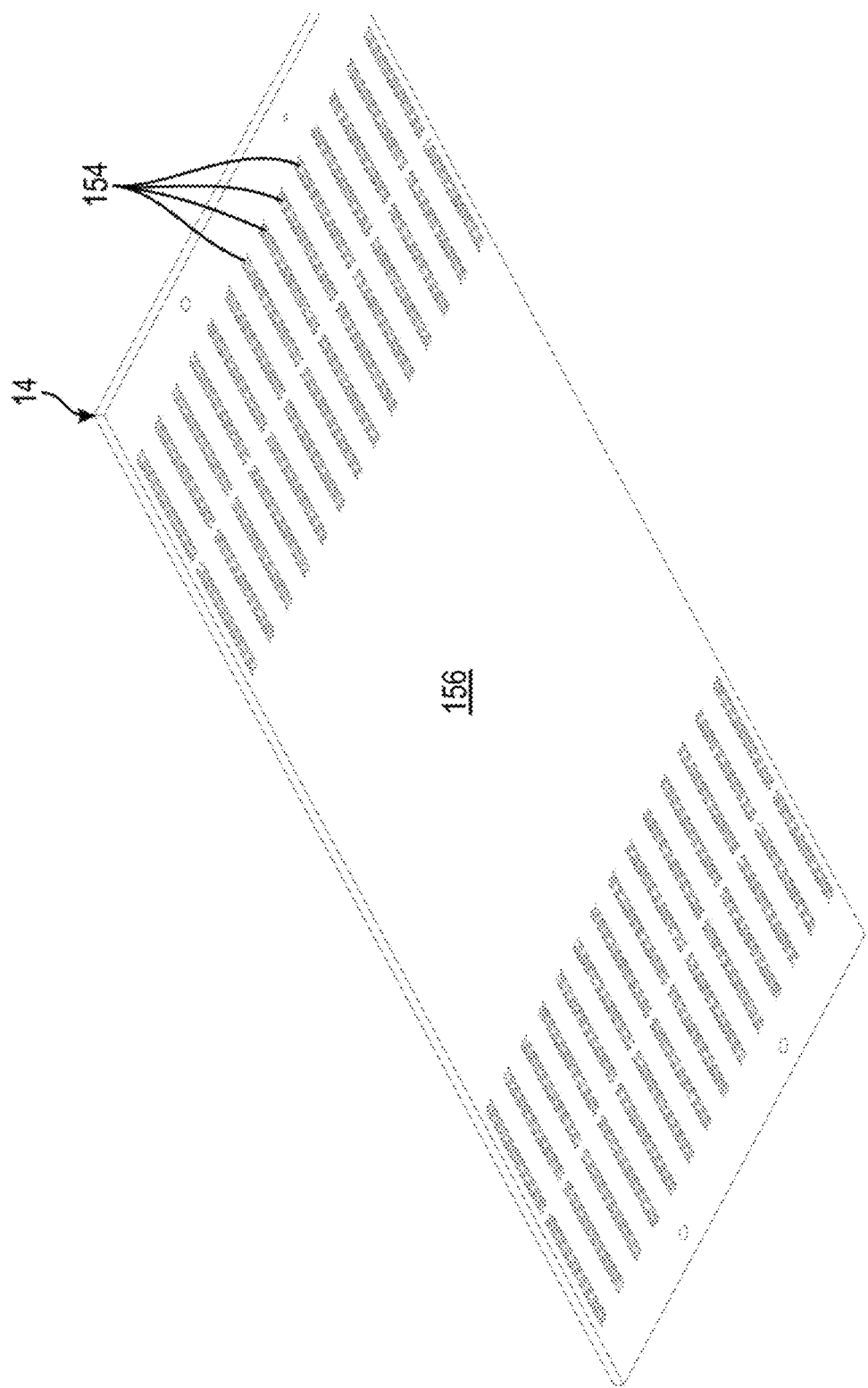
FIG. 30 is another perspective view of FIG. 29.
Figure 31:
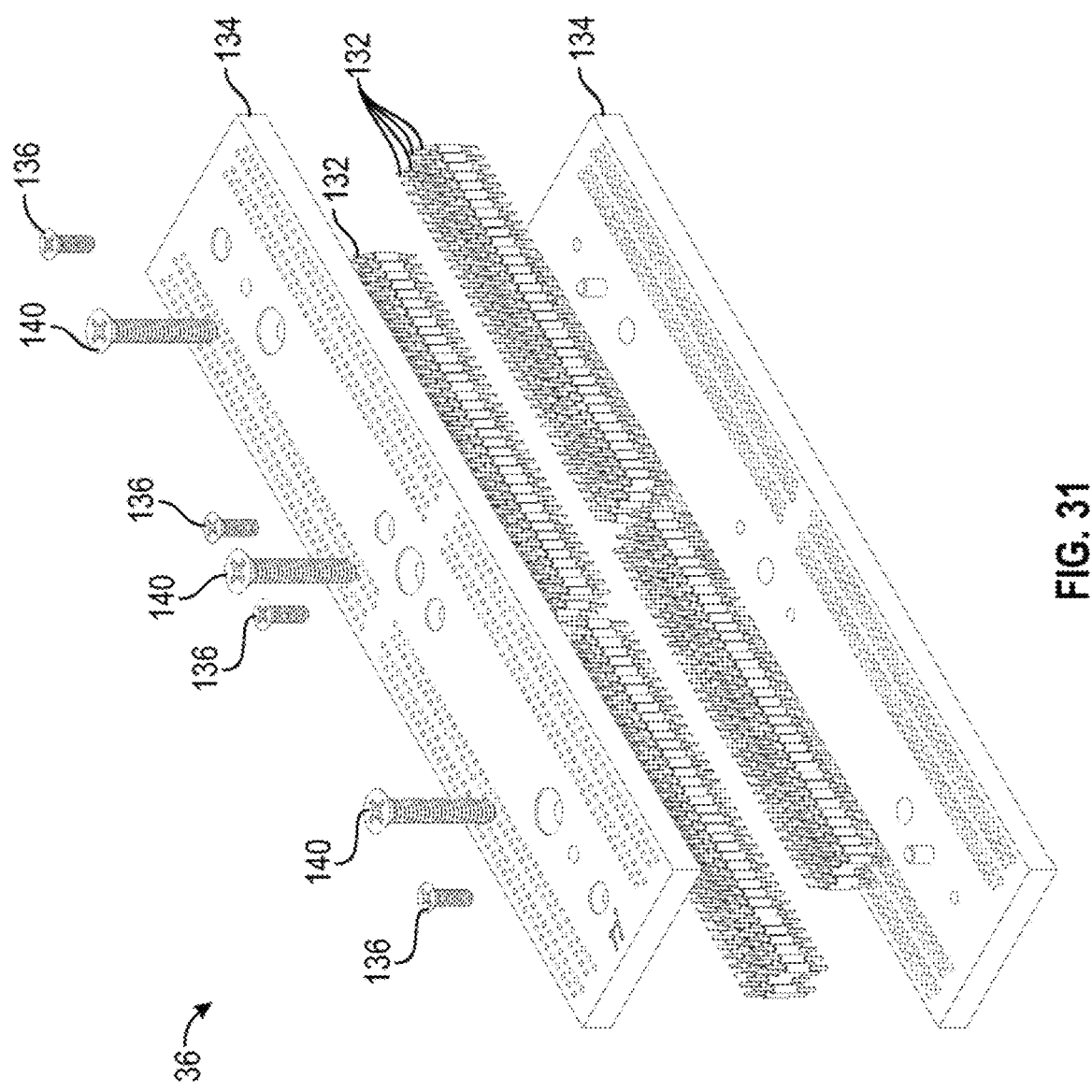
FIG. 31 is an exploded perspective view of a capsule, the view showing two halves of the capsule separated from each other, the view also showing the compressible electrical contacts, fasteners which secure the two halves of the capsule together, and fasteners which secure the capsule to the motherboard in a fully assembled module.
Figure 32:
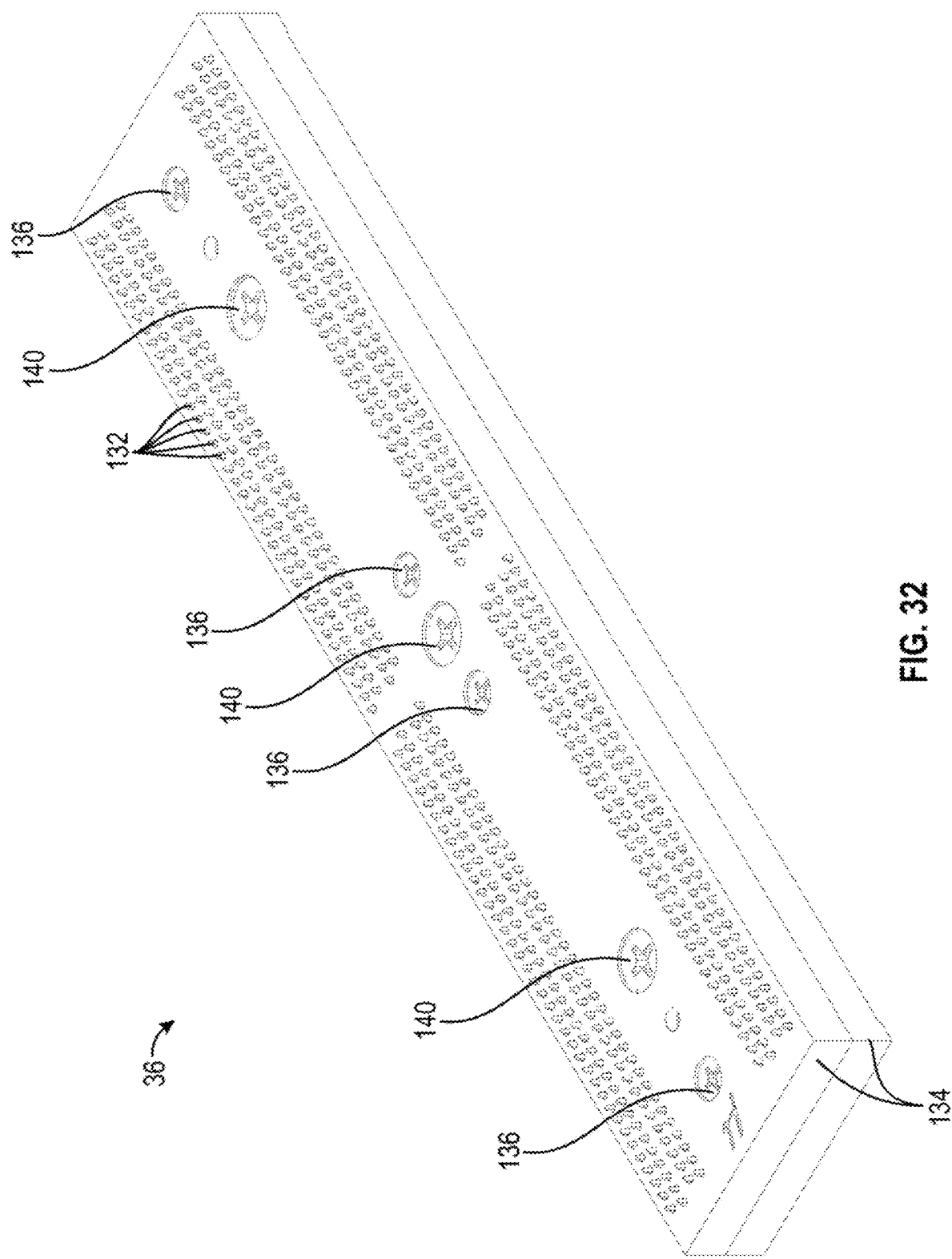
FIG. 32 is a perspective view of a capsule, the view showing the two halves connected together by use of fasteners, the view also showing the compressible electrical contacts, the view also showing the fasteners which secure the capsule to the motherboard fastened within the capsule.
Figure 33:
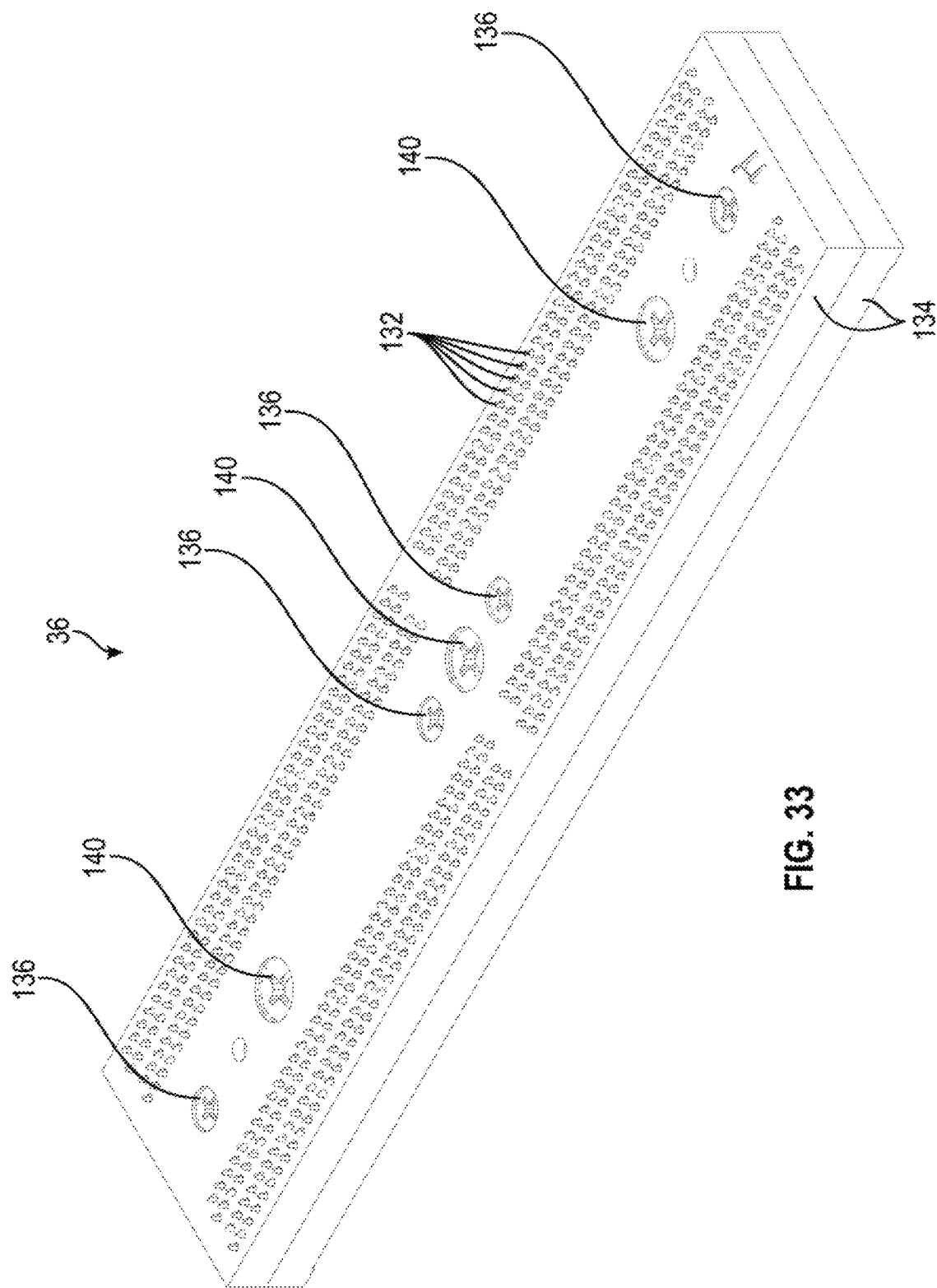
FIG. 33 is another perspective view of the capsule of FIG. 32.
Figure 34:
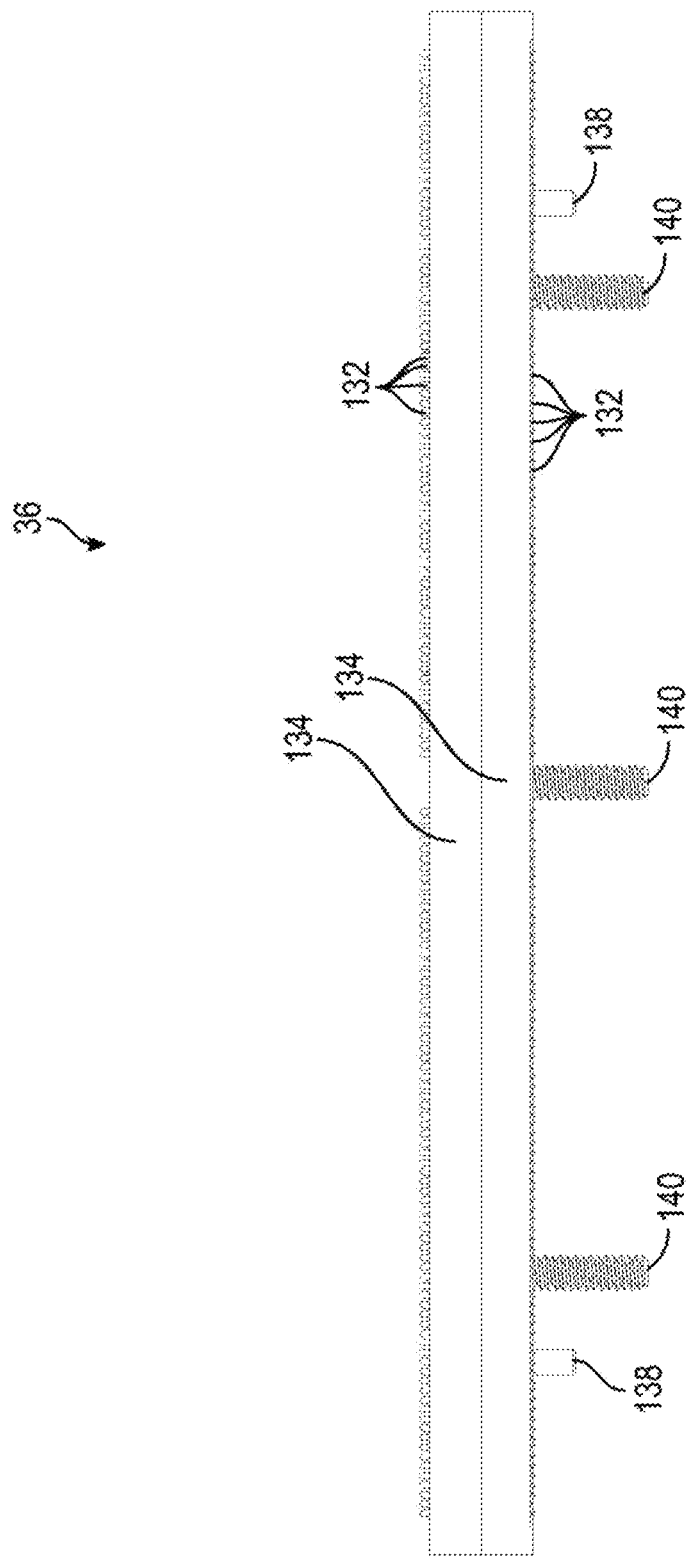
FIG. 34 is a side elevation view of the capsule of FIG. 32.
Figure 35:
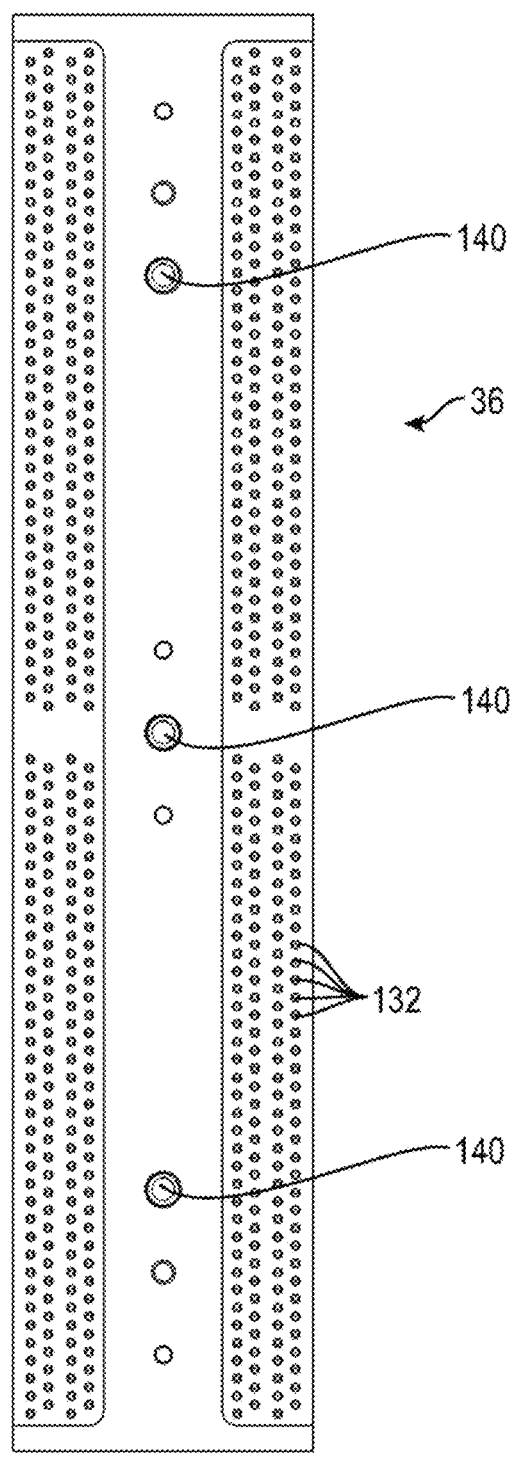
FIG. 35 is a top elevation view of the bottom half of a capsule, the view showing the bottom half with holes for the compressible electrical contacts and for the fasteners which secure the top half to the bottom half, as well as holes which secure the capsule to the motherboard.
Figure 36:
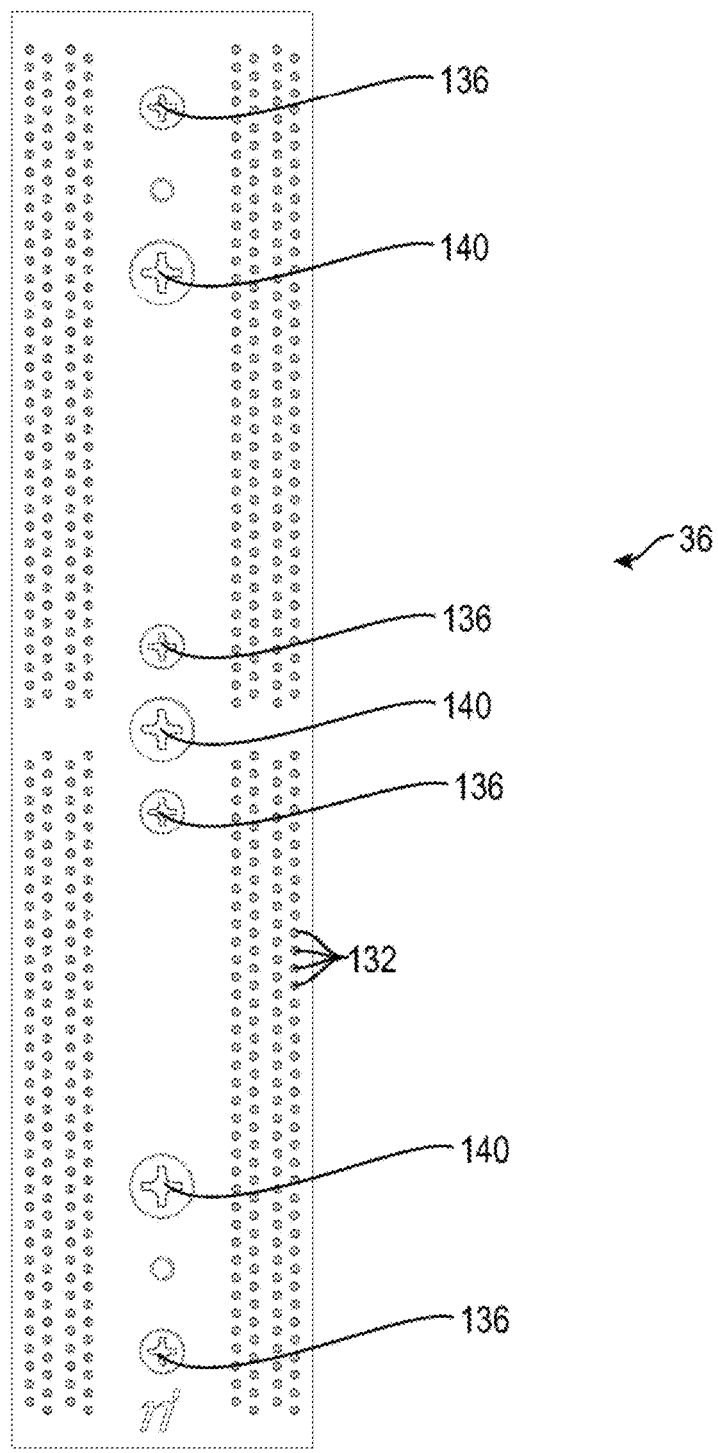
FIG. 36 is a top elevation view of the capsule of FIG. 32.

Environmental Chamber and Stepper:

As one example of the many configurations that system 10 may take, with reference to FIGS. 26, 27 and 28, an environmental chamber 172 is attached to the upper surface 158 of DUT PCB 14. In many applications, such as defense, aerospace, space, automotive, marine, and others, DUTs 162 must be tested at extreme high and/or low temperatures. To facilitate this testing, in the arrangement shown in FIGS. 26, 27 and 28, an environmental chamber 172 is attached to the upper surface 158 of DUT PCB 14. Environmental chamber 172 may be formed of any suitable size, shape and design and is configured to test the test socket 12 as well as DUT 162 under extreme conditions, such as high and/or low temperatures. In the arrangement shown, as one example, environmental chamber 172 is a generally box shaped member having a door 174 and stepper 168 attached to the upper surface 158 of DUT PCB 14. Due to the infinite top plane of DUT PCB 14, environmental chamber 172 is easily attached and used in association with system 10.

Figure 23:
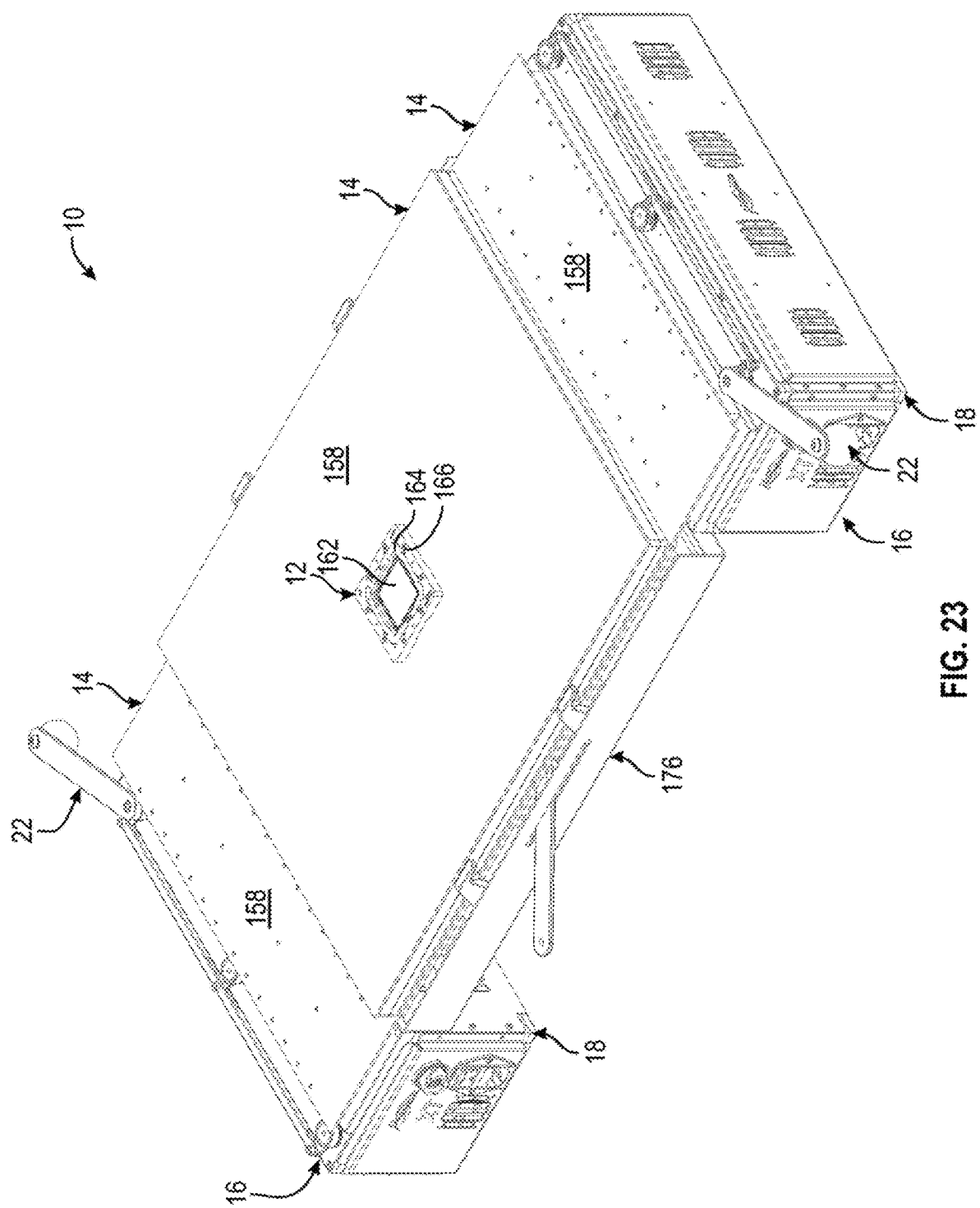
FIG. 23 is a perspective view of a test system, the view showing two modules each connected to one side of the DUT PCB, the view also showing one test socket connected to the DUT PCB and a DUT connected to the test socket, the view also showing a docking station.
Figure 24:
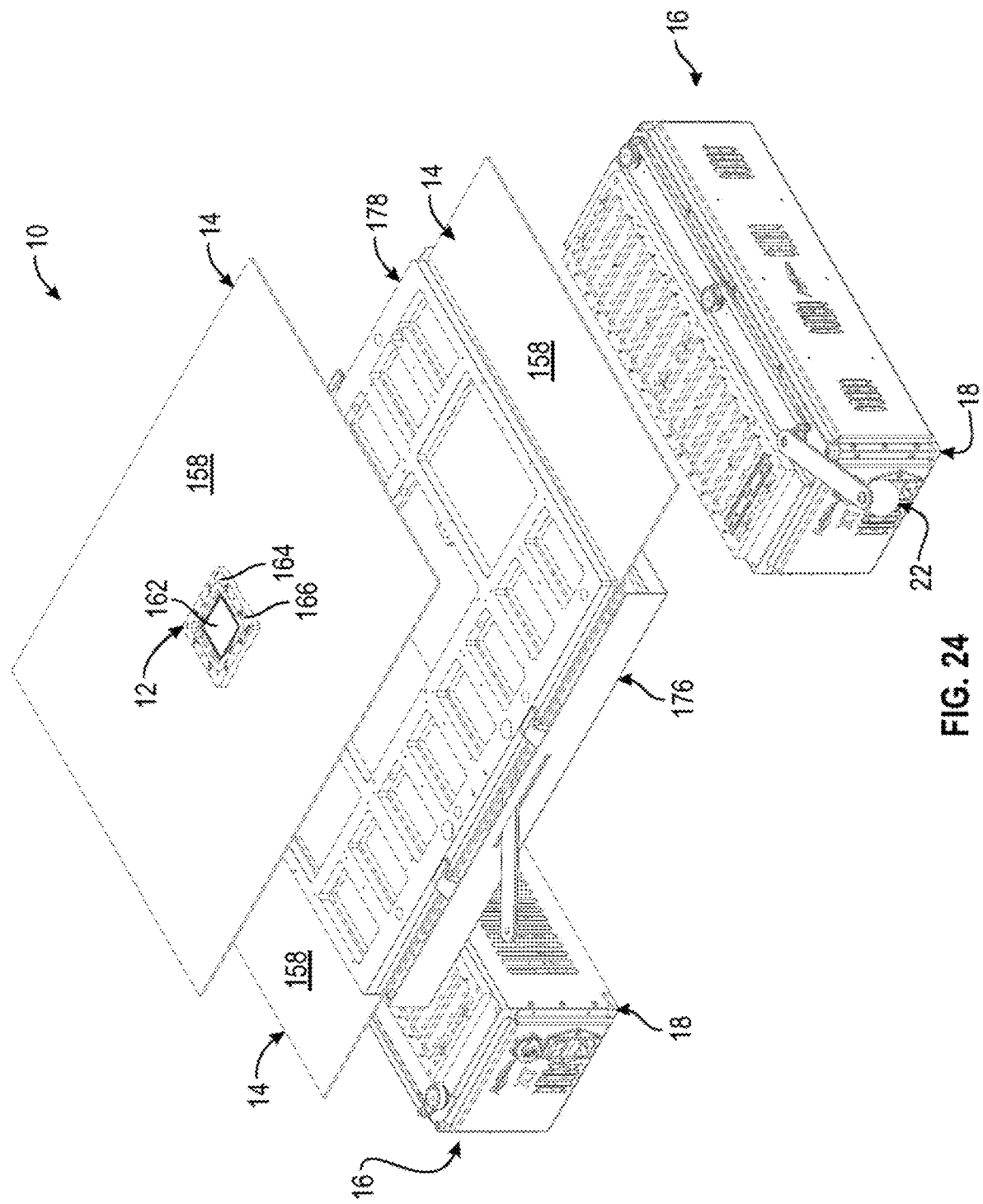
FIG. 24 is an exploded view of the test system of FIG. 23.
Figure 25:
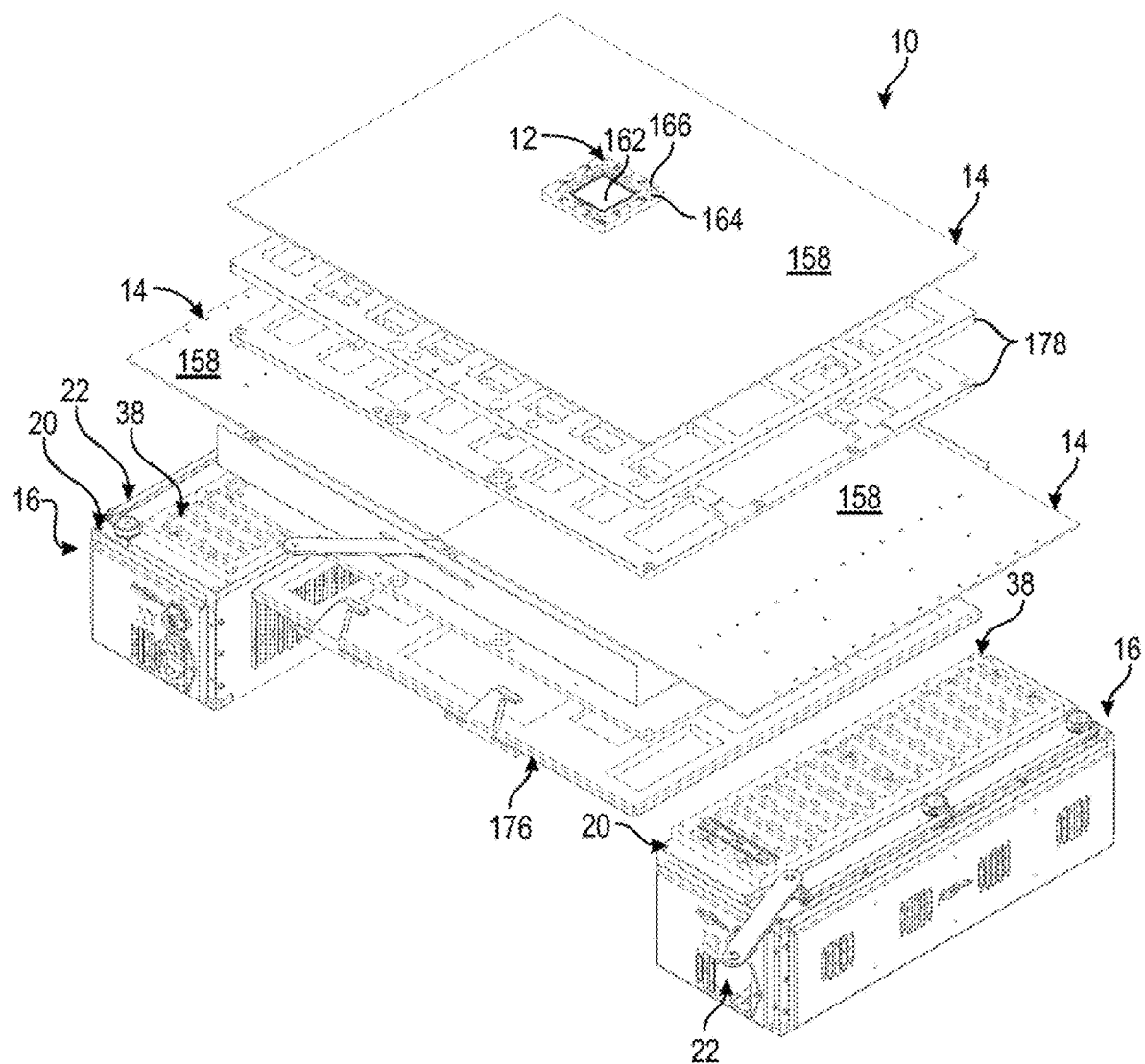
FIG. 25 is another exploded view of the test system of FIG. 23.

Docking Station:

As one example of the many configurations that system 10 may take, with reference to FIGS. 23, 24, 25, a docking station 176 is attached to a pair of modules 16. Docking station 176 may be formed of any suitable size, shape and design and is configured to attach a wider variety of DUT PCBs 14 to modules 16 so as to facilitate testing a wider variety of DUT PCBs 14 and test sockets 12 as well as to make system 10 compatible with a wider variety of installed systems. Due to the infinite top plane of DUT PCB 14, and the modularity of the system 10, the docking station 176 is easily attached and used in association with system 10.

In the arrangement shown, as one example, docking station 176 includes a pair of DUT PCBs 14 that connect to docking station 176 in the ways shown and described herein with the use of top stiffeners 38. These DUT PCBs 14 then connect to a secondary DUT PCB 14 by way of connectors 178 that serve to connect the first layer of DUT PCBs 14 to the second layer of DUT PCBs 14, which is often the end user's existing DUT PCB 14. These connectors 178 may take on a similar configuration and serve a similar function as the socket plate 20 and top stiffener 38 described herein. As such, the use of docking station 176 allows system 10 and modules 16 to be used with a wider variety of DUT PCBs 14 and test sockets 12.

From the above discussion, it will be appreciated that an electronic testing system and method of use is presented that improves upon the state of the art.

Specifically, the electronic testing system and method of use as presented: quickly converts between configurations for testing different semiconductor chips; easily converts between configurations for testing different semiconductor chips; is easy to use; provides accurate testing for semiconductor chips; can be used with a wide variety of semiconductor chips; is inexpensive; has a long useful life; has a small footprint; minimizes the amount of space required to test a variety of semiconductor chips; minimizes the capital cost for testing equipment for testing a variety of semiconductor chips; provides for quick removal of and replacement of DUT PCBs having electrical interconnects thereon; is high quality; and is durable, among countless other advantages and improvements.

It will be appreciated by those skilled in the art that other various modifications could be made to the device without parting from the spirit and scope of this disclosure. All such modifications and changes fall within the scope of the claims and are intended to be covered thereby.

The invention claimed is:

1. A testing system, comprising:
   a housing;
   the housing having a hollow interior;
   a plurality of electrical testing boards;
   wherein the plurality of electrical testing boards are positioned within at least a portion of the hollow interior of the housing;
   a socket plate;
   the socket plate connected to the housing;
   a locking mechanism;
   the locking mechanism operably connected to the housing;
   an actuating mechanism;
   the actuating mechanism operably connected to the locking mechanism;
   the actuating mechanism configured to move the locking mechanism between a disengaged position and an engaged position;
   a device under test printed circuit board (DUT PCB);
   the DUT PCB having an upper side and a lower side;
   a top stiffener;
   the top stiffener attached to the lower side of the DUT PCB;
   wherein when the DUT PCB with attached top stiffener is placed on the socket plate, and the actuating mechanism actuates the locking mechanism to move from the disengaged position to the engaged position, the DUT PCB with attached top stiffener is locked to the housing and an electrical connection is formed between the plurality of electrical testing boards and the DUT PCB;
   wherein the locking mechanism directly engages the top stiffener below the DUT PCB.

2. The system of claim 1, further comprising a test socket connected to the upper side of the DUT PCB.

3. The system of claim 1, wherein only one or more test sockets are connected to the upper side of the DUT PCB.

4. The system of claim 1, wherein the upper side of the DUT PCB is flat and primarily defines the upper surface of the testing system.

5. The system of claim 1, wherein the upper side of the DUT PCB is flat and uninterrupted other than the attachment of one or more testing sockets.

6. The system of claim 1, wherein the DUT PCB is attached to the housing by connecting to the lower side of the DUT PCB leaving the upper side of the DUT PCB unencumbered by the locking mechanism.

7. The system of claim 1, wherein the locking mechanism is positioned below the lower side of the DUT PCB.

8. The system of claim 1, a motherboard electrically connected to the plurality of electrical testing boards.

9. The system of claim 1, a plurality of capsules positioned between the plurality of electrical testing boards and the DUT PCB, wherein the plurality of capsules facilitate electrical connection between the plurality of electrical testing boards and the DUT PCB.

10. The system of claim 1, a motherboard electrically connected to the plurality of electrical testing boards;
    a plurality of capsules positioned between the motherboard and the DUT PCB;
    wherein the plurality of capsules facilitate electrical connection between the motherboard and the DUT PCB.

11. The testing system of claim 1, wherein the top stiffener is locked in place by upper ends of arms of the locking mechanism engaging slots in the top stiffener.

12. The testing system of claim 1, wherein the locking mechanism further comprises a post and an engagement member; wherein rotation of the post initiates engagement of the engagement member with the top stiffener.

13. The testing system of claim 1, wherein the top stiffener is locked in place by an engagement member of the locking mechanism; wherein the engagement member engages a bearing in the top stiffener.

14. A testing system, comprising:
    a housing;
    the housing having a hollow interior;
    a plurality of electrical testing boards;
    wherein the plurality of electrical testing boards are positioned within at least a portion of the hollow interior of the housing;
    a socket plate;
    the socket plate connected to the housing;
    a locking mechanism;
    the locking mechanism operably connected to the housing;
    an actuating mechanism;
    the actuating mechanism operably connected to the locking mechanism;
    the actuating mechanism configured to move the locking mechanism between a disengaged position and an engaged position;
    a device under test printed circuit board (DUT PCB);
    the DUT PCB having an upper side and a lower side;
    a top stiffener;
    the top stiffener attached to the lower side of the DUT PCB;

wherein the locking mechanism directly engages the top stiffener below the DUT PCB;

wherein when the DUT PCB with attached top stiffener is placed on the socket plate, the upper side of the DUT PCB forms a generally flat upper surface of the testing system.

15. The system of claim 14, wherein when the DUT PCB with attached top stiffener is placed on the socket plate, and the actuating mechanism actuates the locking mechanism to move from the disengaged position to the engaged position, the DUT PCB with attached top stiffener is locked to the housing and an electrical connection is formed between the plurality of electrical testing boards and the DUT PCB.

16. The system of claim 14, further comprising a test socket connected to the upper side of the DUT PCB.

17. The system of claim 14, wherein only one or more test sockets are connected to the upper side of the DUT PCB.

18. The system of claim 14, wherein the upper side of the DUT PCB is flat and primarily defines the upper surface of the testing system.

19. The system of claim 14, wherein the upper side of the DUT PCB is flat and uninterrupted other than the attachment of one or more testing sockets.

20. The system of claim 14, wherein the DUT PCB is attached to the housing by connecting to the lower side of the DUT PCB leaving the upper side of the DUT PCB unencumbered by the locking mechanism.

21. The system of claim 14, wherein the locking mechanism is positioned below the lower side of the DUT PCB.

22. The system of claim 14, a motherboard electrically connected to the plurality of electrical testing boards.

23. The system of claim 14, a plurality of capsules positioned between the plurality of electrical testing boards and the DUT PCB, wherein the plurality of capsules facilitate electrical connection between the plurality of electrical testing boards and the DUT PCB.

24. The system of claim 14, a motherboard electrically connected to the plurality of electrical testing boards;
a plurality of capsules positioned between the motherboard and the DUT PCB;
wherein the plurality of capsules facilitate electrical connection between the motherboard and the DUT PCB.

25. A testing system, comprising:
a housing;
the housing having a hollow interior;
a plurality of electrical testing boards;
wherein the plurality of electrical testing boards are positioned within at least a portion of the hollow interior of the housing;
a socket plate;
the socket plate connected to the housing;
a locking mechanism;
the locking mechanism operably connected to the housing;
an actuating mechanism;
the actuating mechanism operably connected to the locking mechanism;
the actuating mechanism configured to move the locking mechanism between a disengaged position and an engaged position;
a device under test printed circuit board (DUT PCB);
the DUT PCB having an upper side and a lower side;
a top stiffener;
the top stiffener attached to the lower side of the DUT PCB;
wherein the locking mechanism directly engages the top stiffener below the DUT PCB;
wherein the upper side of the DUT PCB is arranged and configured to receive at least one test socket;
wherein when the DUT PCB with attached top stiffener is placed on the socket plate, the upper side of the DUT PCB defines the upper surface of the testing system.

26. The system of claim 25, wherein when the DUT PCB with attached top stiffener is placed on the socket plate, and the actuating mechanism actuates the locking mechanism to move from the disengaged position to the engaged position, the DUT PCB with attached top stiffener is locked to the housing and an electrical connection is formed between the plurality of electrical testing boards and the DUT PCB.

27. The system of claim 25, further comprising a test socket connected to the upper side of the DUT PCB.

28. The system of claim 25, wherein only one or more test sockets are connected to the upper side of the DUT PCB.

29. The system of claim 25, wherein the upper side of the DUT PCB is flat and primarily defines the upper surface of the testing system.

30. The system of claim 25, wherein the upper side of the DUT PCB is flat and uninterrupted other than the attachment of one or more testing sockets.

31. The system of claim 25, wherein the DUT PCB is attached to the housing by connecting to the lower side of the DUT PCB leaving the upper side of the DUT PCB unencumbered by the locking mechanism.

32. The system of claim 25, wherein the locking mechanism is positioned below the lower side of the DUT PCB.

33. The system of claim 25, a motherboard electrically connected to the plurality of electrical testing boards.

34. The system of claim 25, a plurality of capsules positioned between the plurality of electrical testing boards and the DUT PCB, wherein the plurality of capsules facilitate electrical connection between the plurality of electrical testing boards and the DUT PCB.

35. The system of claim 25, a motherboard electrically connected to the plurality of electrical testing boards;
a plurality of capsules positioned between the motherboard and the DUT PCB;
wherein the plurality of capsules facilitate electrical connection between the motherboard and the DUT PCB.

36. A testing system, comprising:
a housing;
the housing having a hollow interior;
a plurality of electrical testing components;
wherein the plurality of electrical testing components are positioned within at least a portion of the hollow interior of the housing;
a socket plate;
the socket plate connected to the housing;
a device under test printed circuit board (DUT PCB);
the DUT PCB having an upper side and a lower side;
at least one test socket connected to the upper side of the DUT PCB;
wherein other than the connection of the at least one test socket to the upper surface of the DUT PCB, the upper surface of the DUT PCB is generally flat and unencumbered;
a top stiffener;
the top stiffener connected to the lower side of the DUT PCB;
wherein the locking mechanism directly engages the top stiffener below the DUT PCB;
wherein when the DUT PCB is connected to the top stiffener, the DUT PCB is locked into place on the housing, thereby operatively connecting the DUT PCB to the housing;

wherein when the DUT PCB is operatively connected to the housing, an electrical connection is formed between the DUT PCB and the electrical testing components.

\* \* \* \* \*